(12) United States Patent
Hasegawa et al.

(10) Patent No.: US 6,958,292 B2
(45) Date of Patent: Oct. 25, 2005

(54) METHOD OF MANUFACTURING INTEGRATED CIRCUIT

(75) Inventors: Norio Hasegawa, Hinode (JP); Joji Okada, Tokorozawa (JP); Toshihiko Tanaka, Tokyo (JP); Kazutaka Mori, Kokubunji (JP); Ko Miyazaki, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 29 days.

(21) Appl. No.: 10/364,707

(22) Filed: Feb. 12, 2003

(65) Prior Publication Data

US 2003/0148635 A1 Aug. 7, 2003

Related U.S. Application Data

(62) Division of application No. 10/311,456, filed as application No. PCT/JP01/05546 on Jun. 28, 2001.

(30) Foreign Application Priority Data

Jul. 7, 2000 (JP) .................................... 2000-206728

(51) Int. Cl.[7] .............................................. H01L 21/44
(52) U.S. Cl. .................. 438/671; 438/669; 438/942; 438/945; 438/948; 438/950
(58) Field of Search ................... 438/669, 670, 438/671, 942, 945, 947, 948, 950; 430/5

(56) References Cited

U.S. PATENT DOCUMENTS

| | | |
|---|---|---|
| 4,684,971 A | 8/1987 | Payne |
| 5,376,483 A | 12/1994 | Rolfson |
| 5,378,585 A | 1/1995 | Watanabe |
| 5,389,474 A | 2/1995 | Iguchi et al. |
| 5,418,092 A | 5/1995 | Okamoto |
| 5,538,816 A * | 7/1996 | Hashimoto et al. ............ 430/5 |
| 5,556,724 A | 9/1996 | Tarumoto et al. |
| 5,738,959 A * | 4/1998 | Miyashita et al. ............ 430/5 |
| 5,741,613 A | 4/1998 | Moon et al. |
| 5,948,572 A | 9/1999 | Liu et al. |
| 5,989,760 A | 11/1999 | Mangat et al. |
| 6,458,496 B2 * | 10/2002 | Motonaga et al. ............ 430/5 |
| 6,511,778 B2 * | 1/2003 | Okazaki et al. ................ 430/5 |
| 6,558,855 B2 * | 5/2003 | Tanaka et al. ................. 430/5 |
| 6,596,656 B2 * | 7/2003 | Tanaka et al. ............. 438/942 |
| 6,645,856 B2 * | 11/2003 | Tanaka et al. ............. 438/671 |
| 6,677,107 B1 * | 1/2004 | Hasegawa et al. .......... 430/311 |
| 2003/0180670 A1 * | 9/2003 | Hasegawa et al. .......... 430/494 |

FOREIGN PATENT DOCUMENTS

| | | |
|---|---|---|
| JP | 54-21272 | 2/1979 |
| JP | 54-83377 | 7/1979 |
| JP | 55-22864 | 2/1980 |
| JP | 56-30129 | 3/1981 |
| JP | 59-22050 | 2/1984 |
| JP | 60-85525 | 5/1985 |
| JP | 63-274156 | 11/1988 |
| JP | 4-97254 | 3/1992 |
| JP | 4-136854 | 5/1992 |
| JP | 5-289307 | 11/1993 |
| JP | 7-325383 | 12/1995 |
| JP | 2000-21754 | 1/2000 |

* cited by examiner

*Primary Examiner*—Maria F. Guerrero
(74) *Attorney, Agent, or Firm*—Antonelli, Terry, Stout & Kraus, LLP

(57) ABSTRACT

In order to shorten the period for the development and manufacture of a semiconductor integrated circuit device, at the time of transferring integrated circuit patterns onto a wafer by an exposure process, a photomask PM1 is used which is provided partially with light shielding patterns 3a formed of a resist film, in addition to light shielding patterns formed of a metal.

8 Claims, 73 Drawing Sheets

FIG. 1
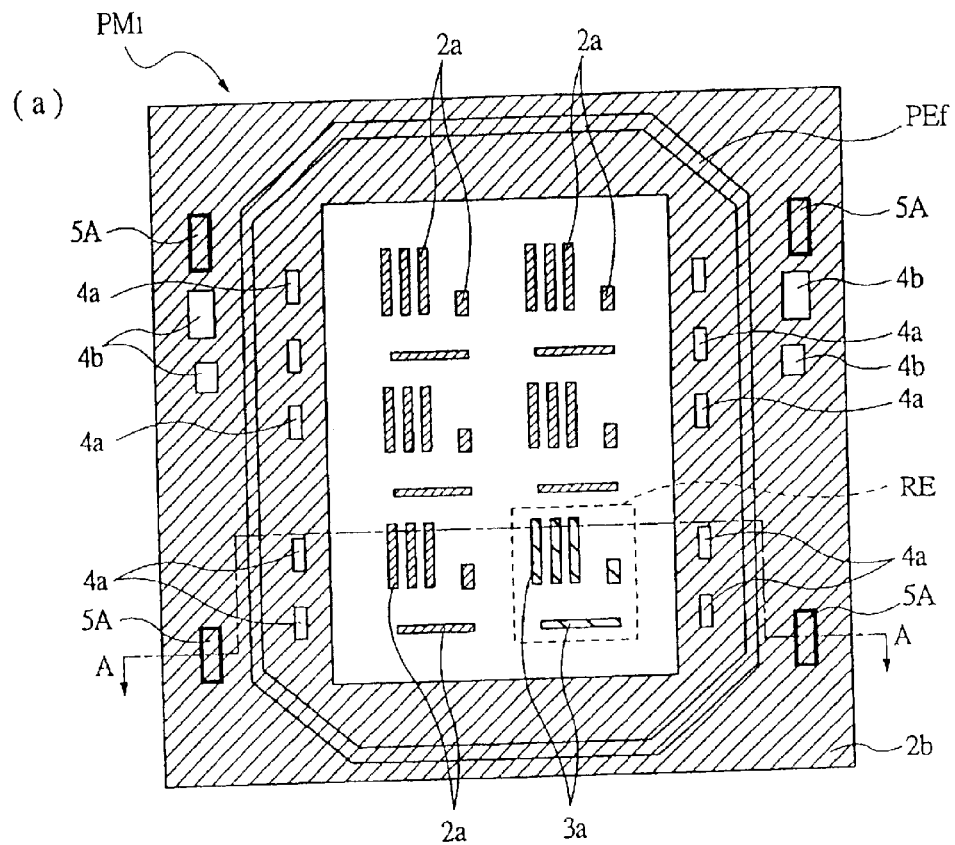
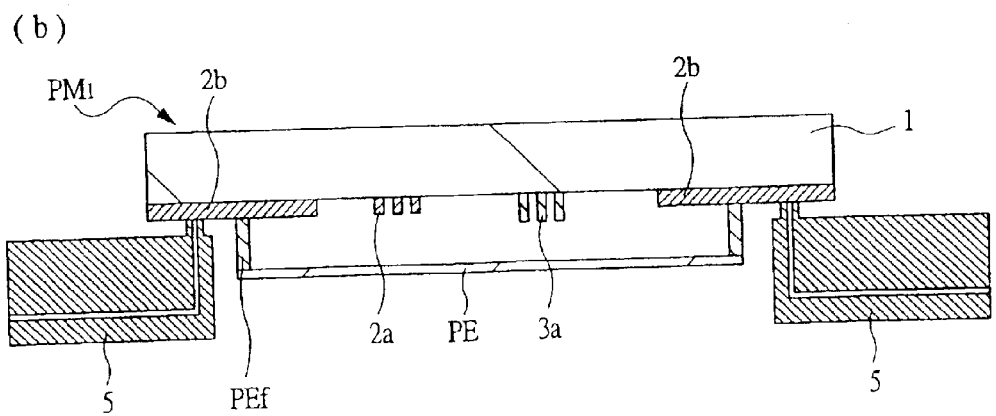

FIG. 5
(a) 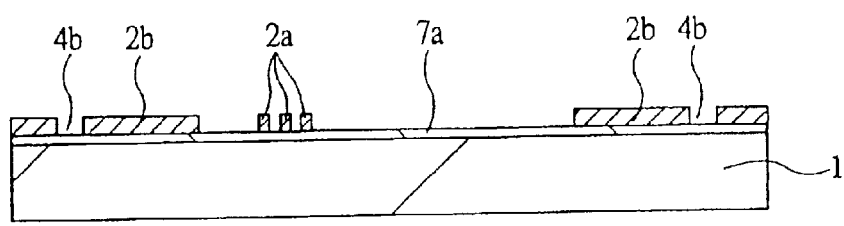
(b) 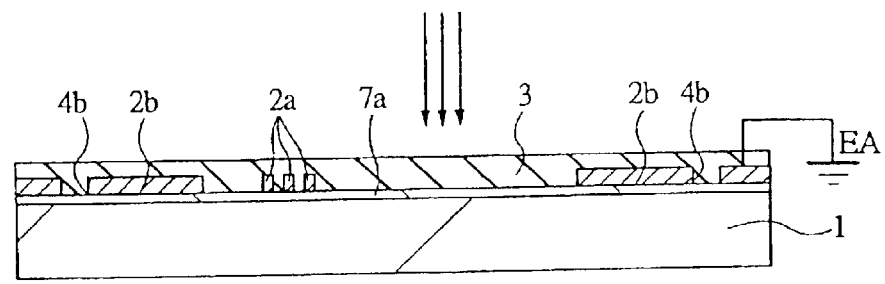
(c) 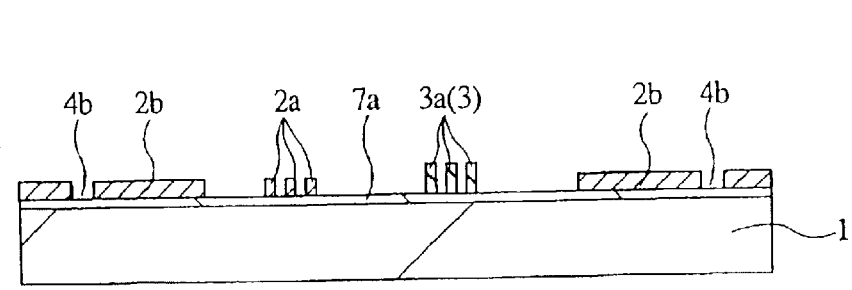

FIG. 7
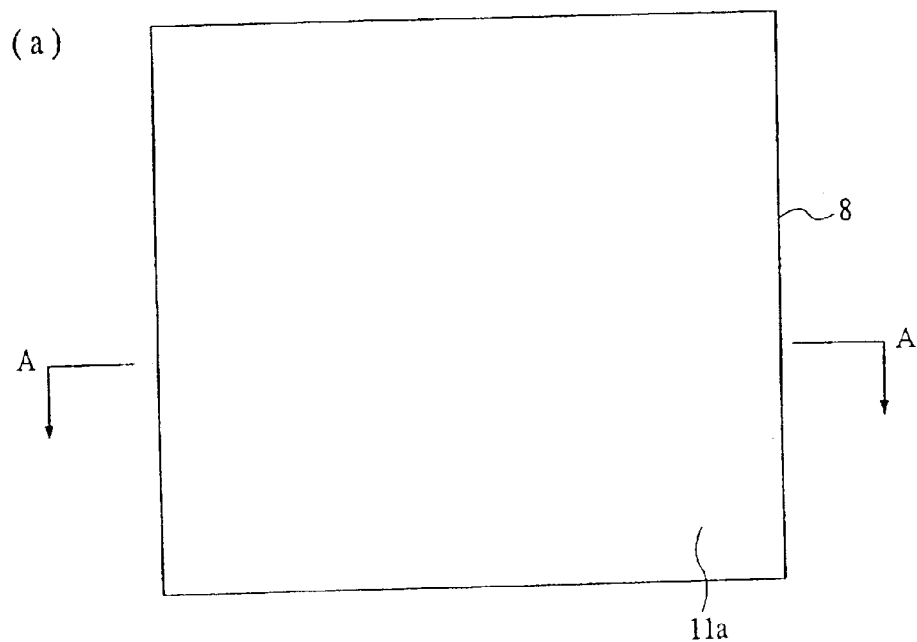
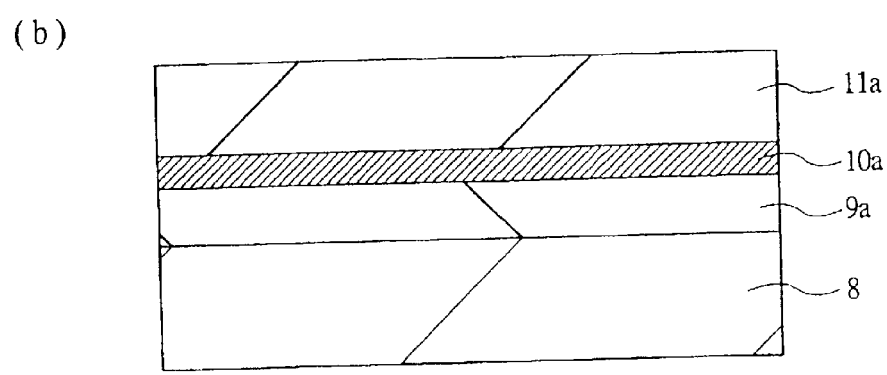

FIG. 8
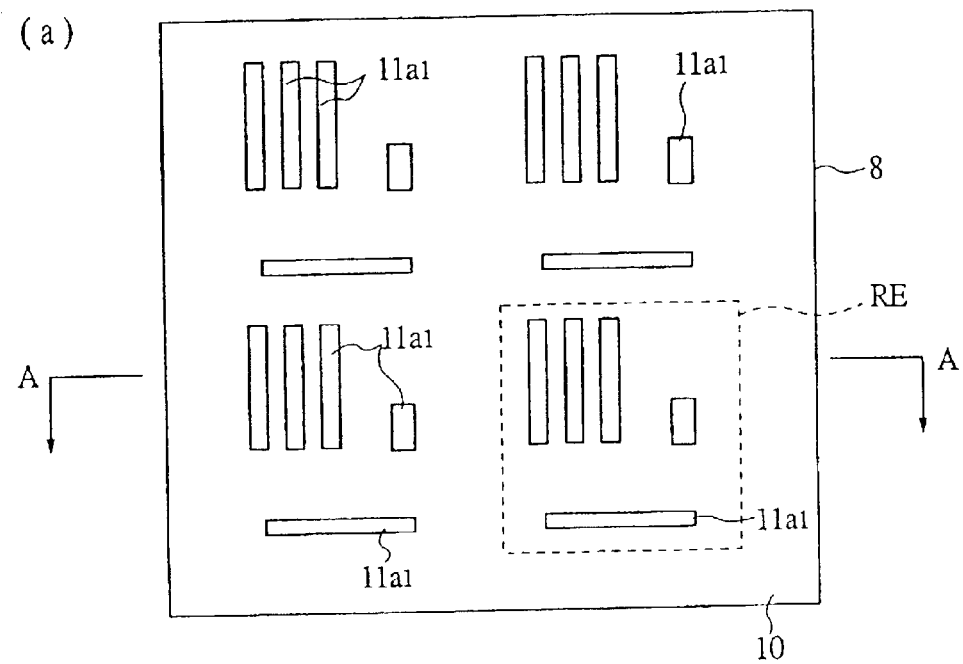
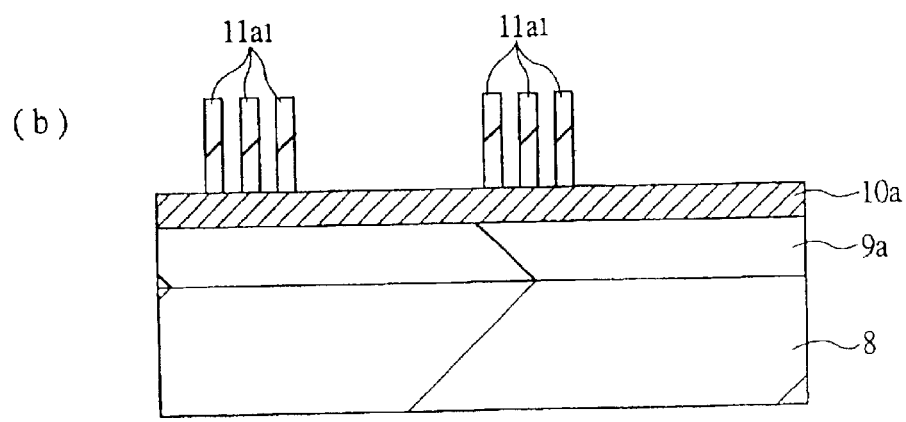

FIG. 9
(a)
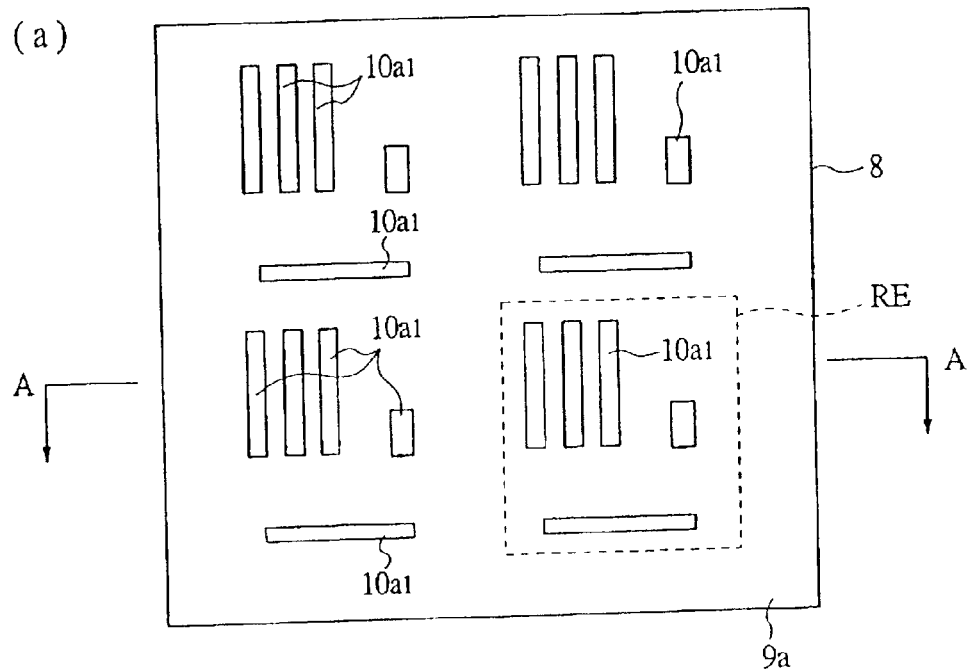
(b)
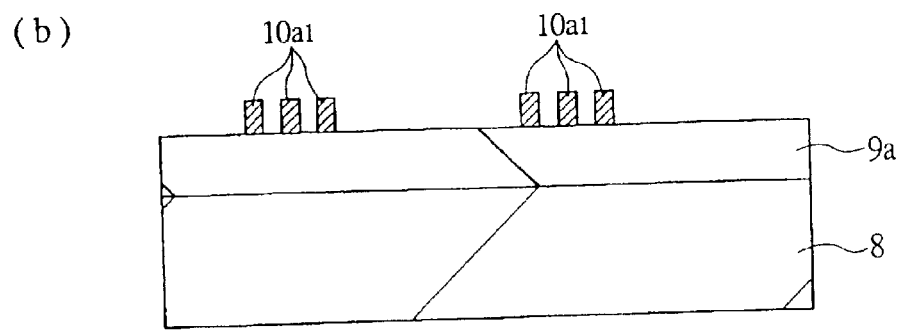

FIG. 15
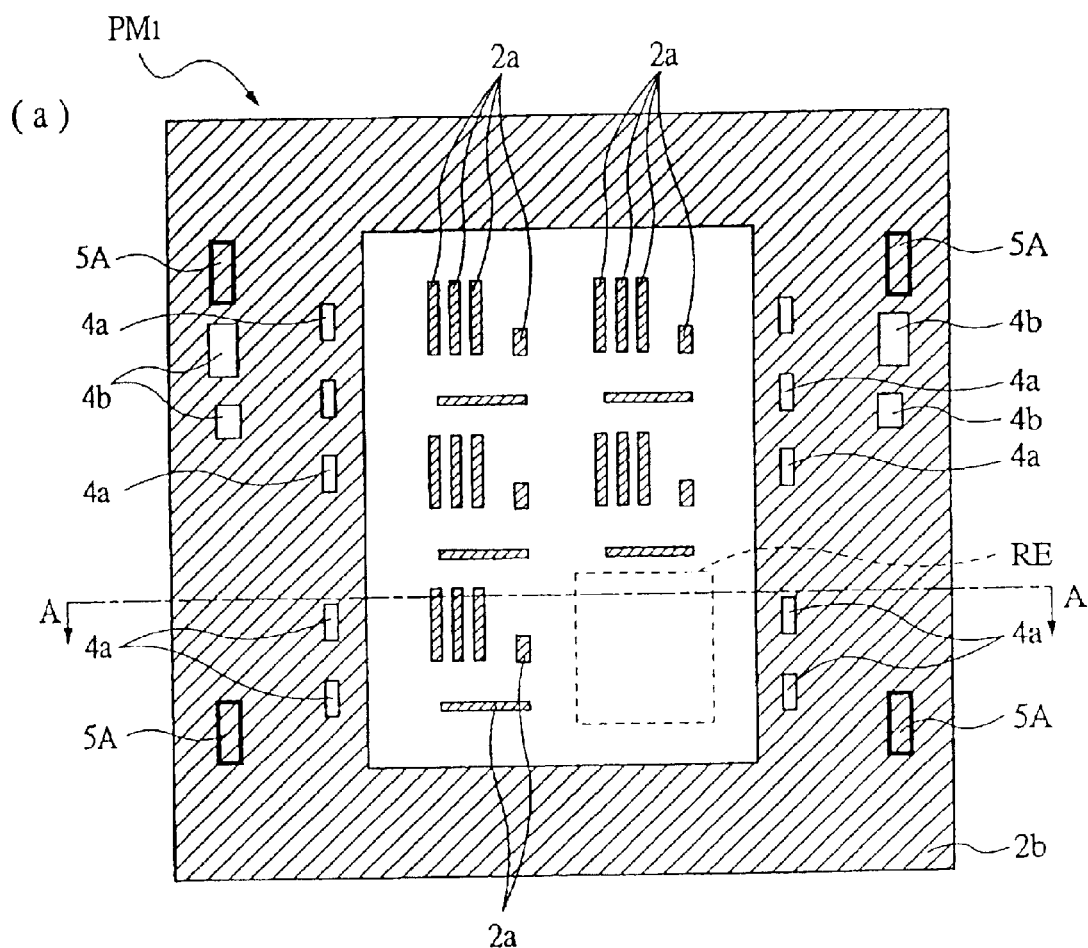
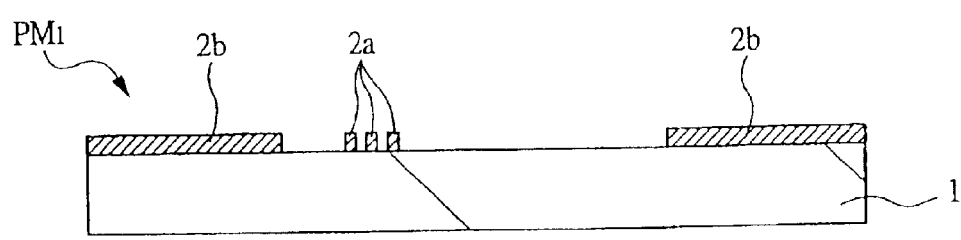

FIG. 17
(a)
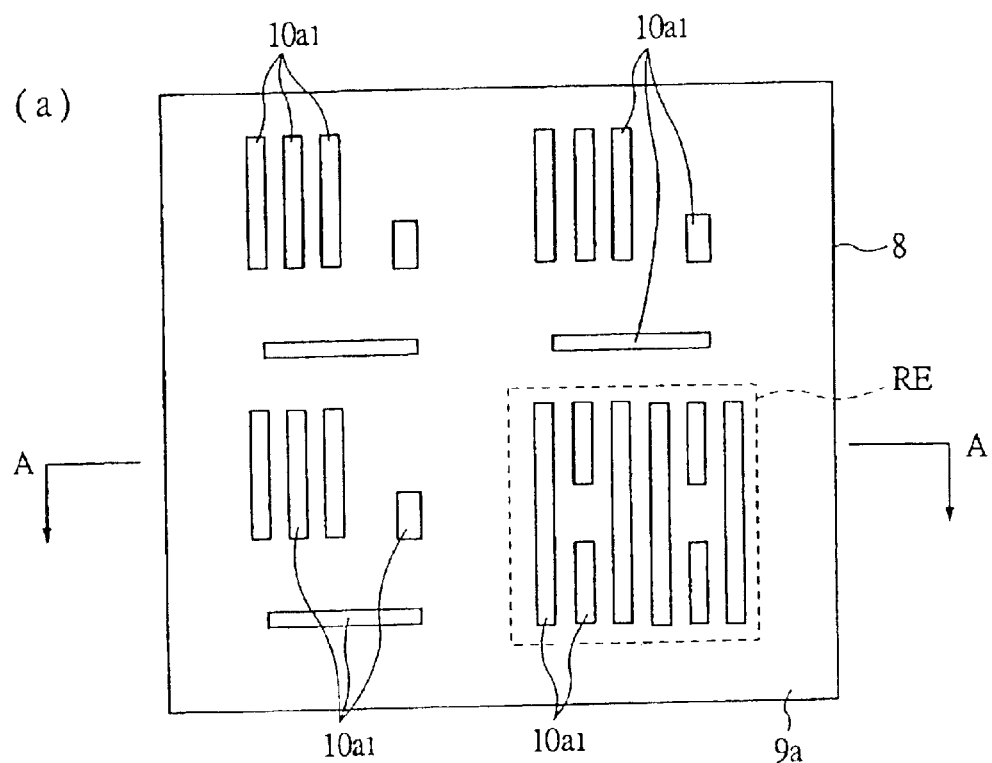
(b)
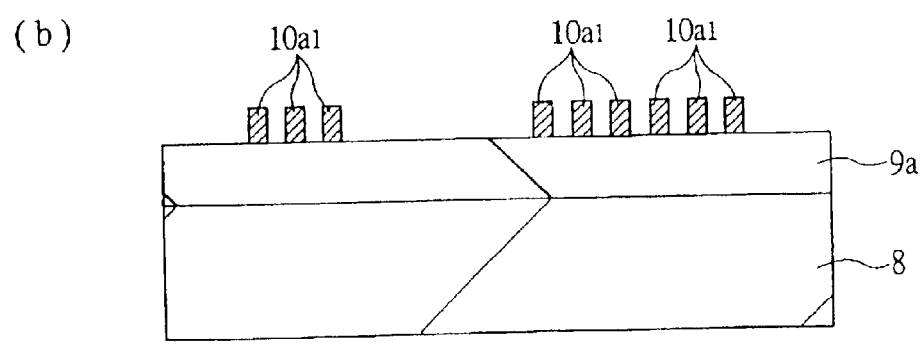

FIG. 22
(a)
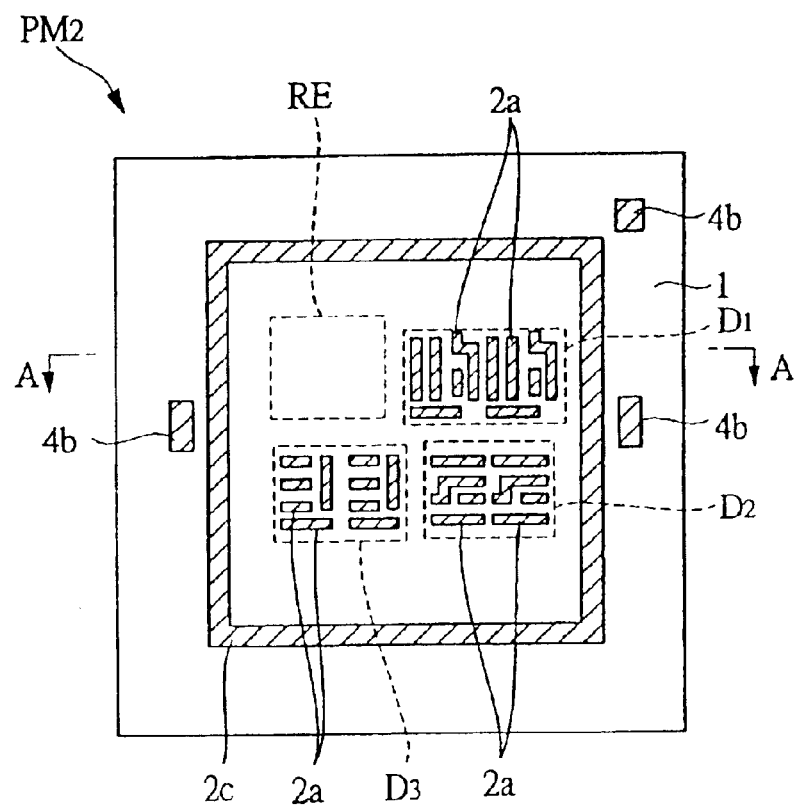
(b)
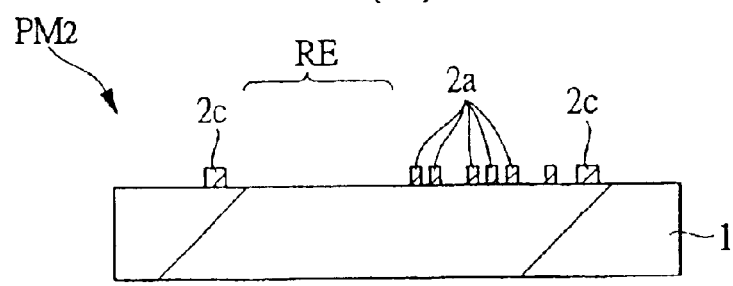

FIG. 23
(a)
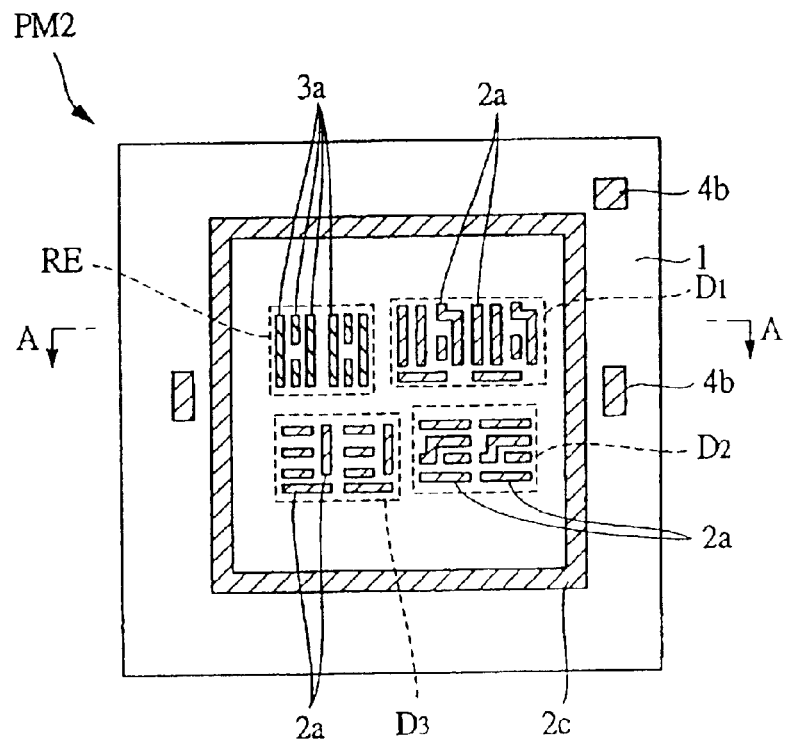
(b)
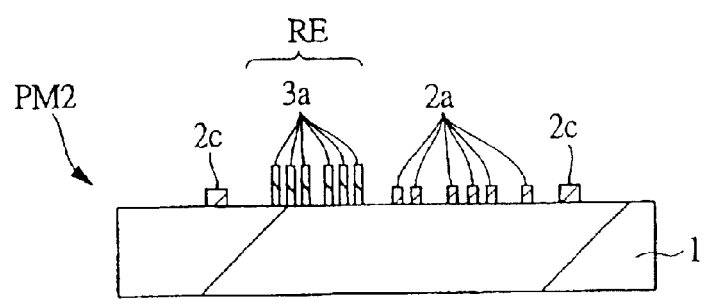

FIG. 25
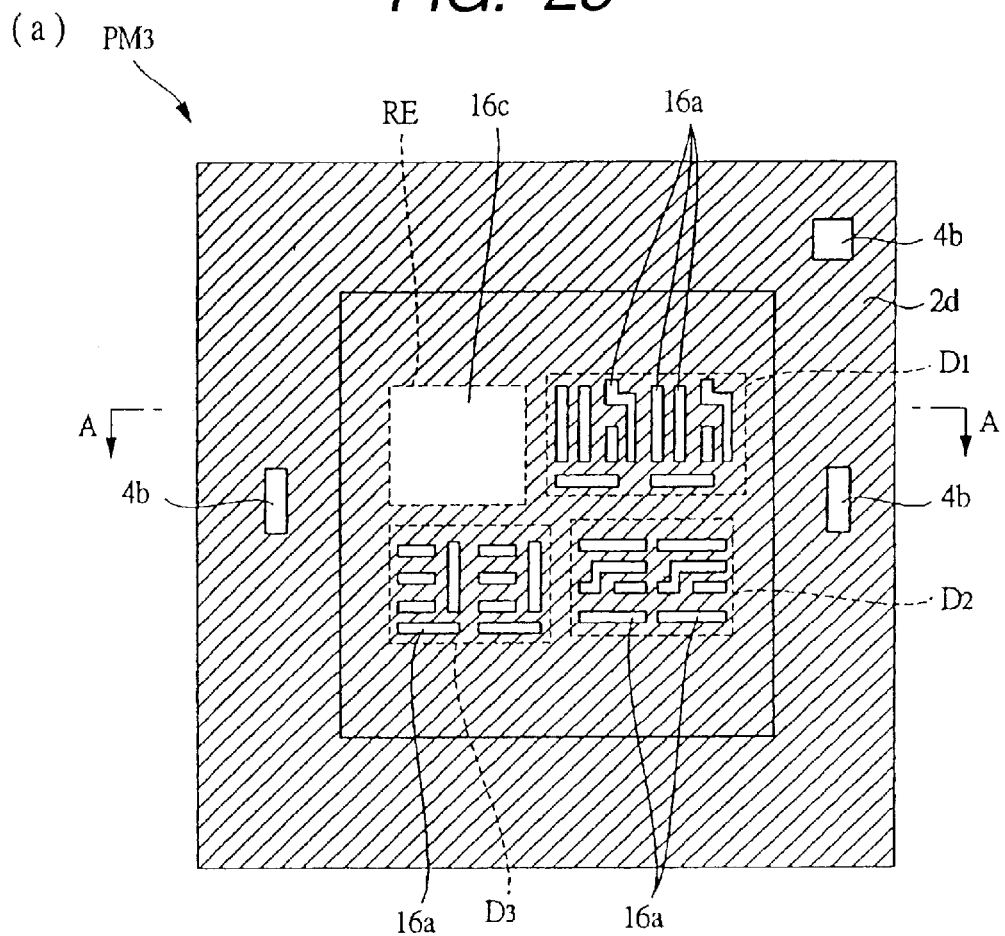
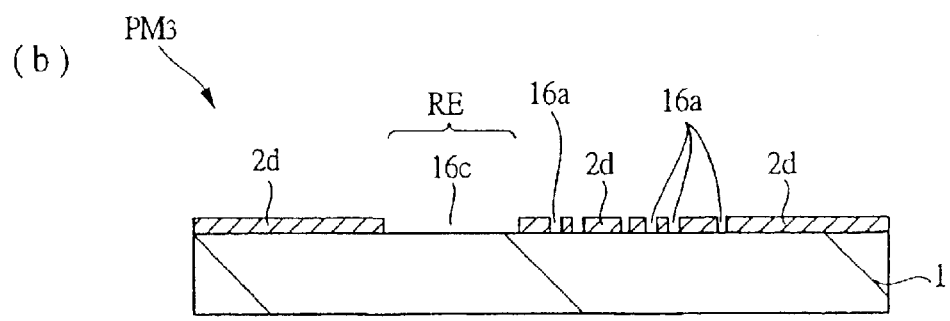

FIG. 26
(a)
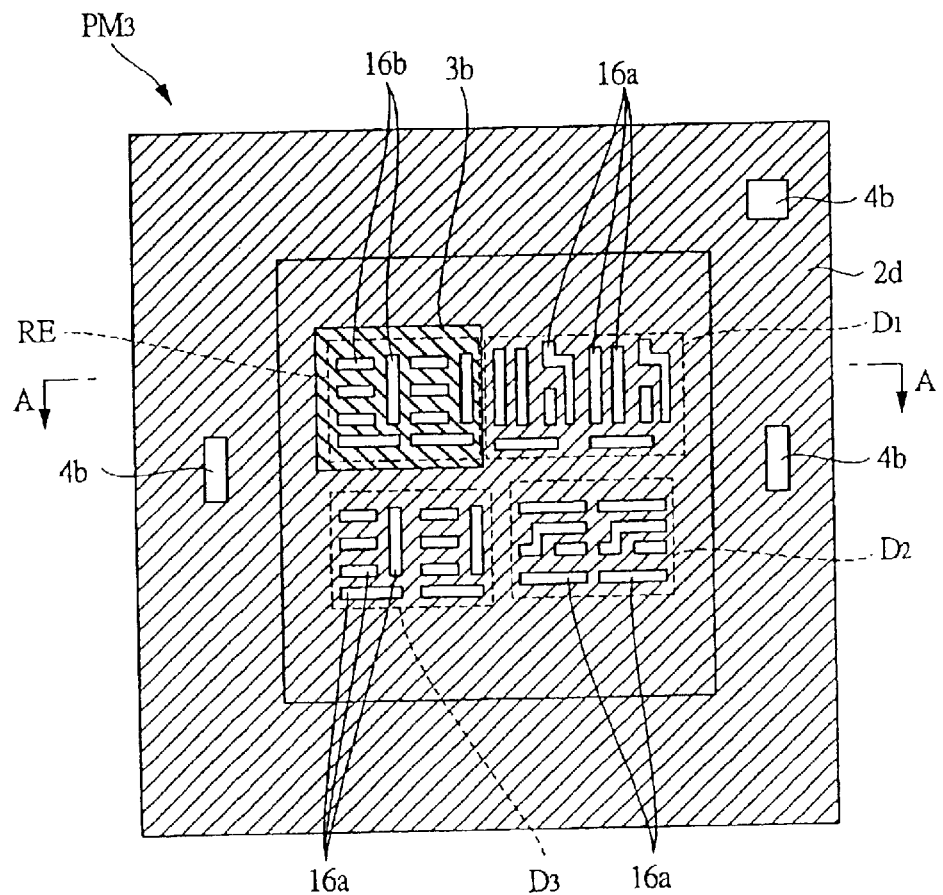
(b)
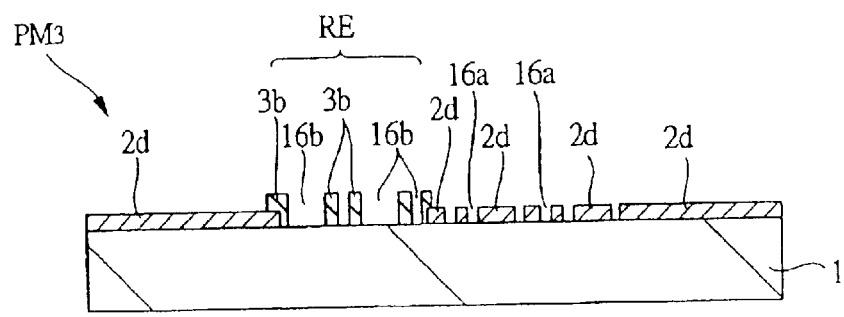

FIG. 27
(a)
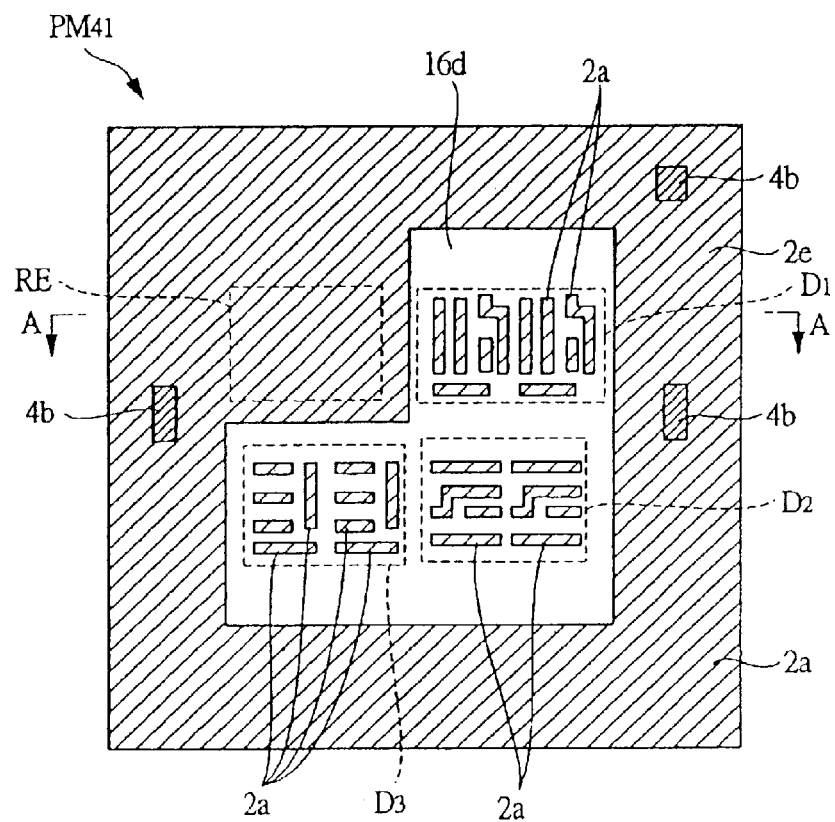
(b)
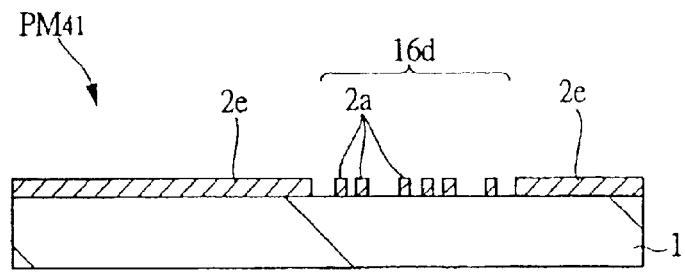

FIG. 28
(a)
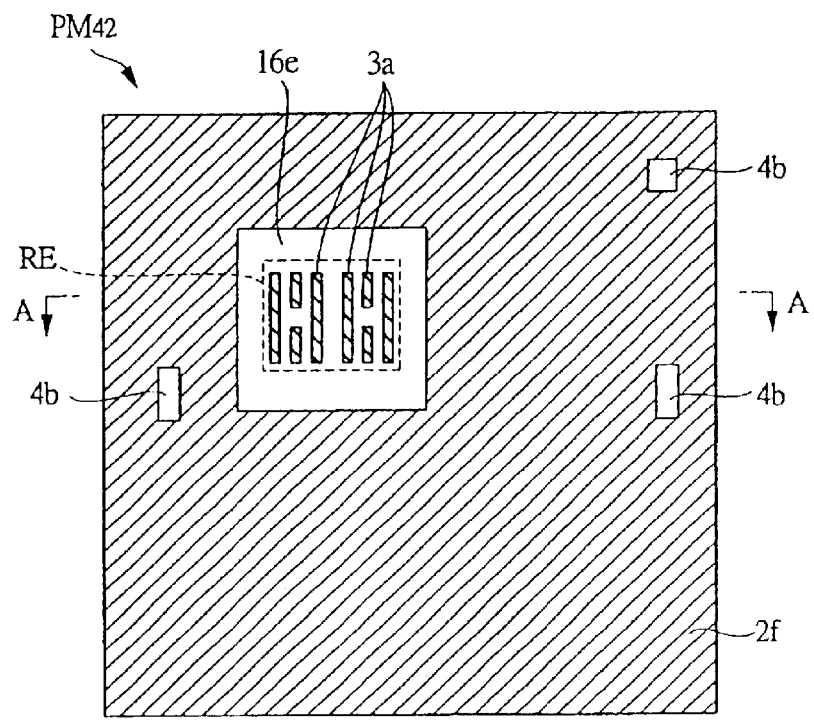
(b)
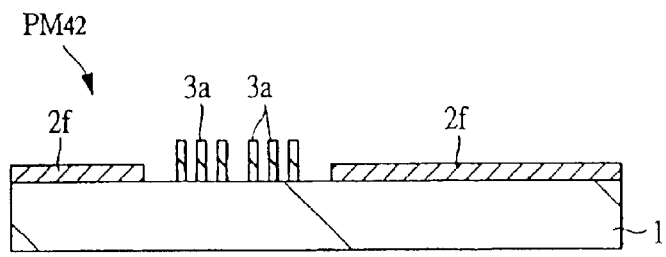

FIG. 29
(a)
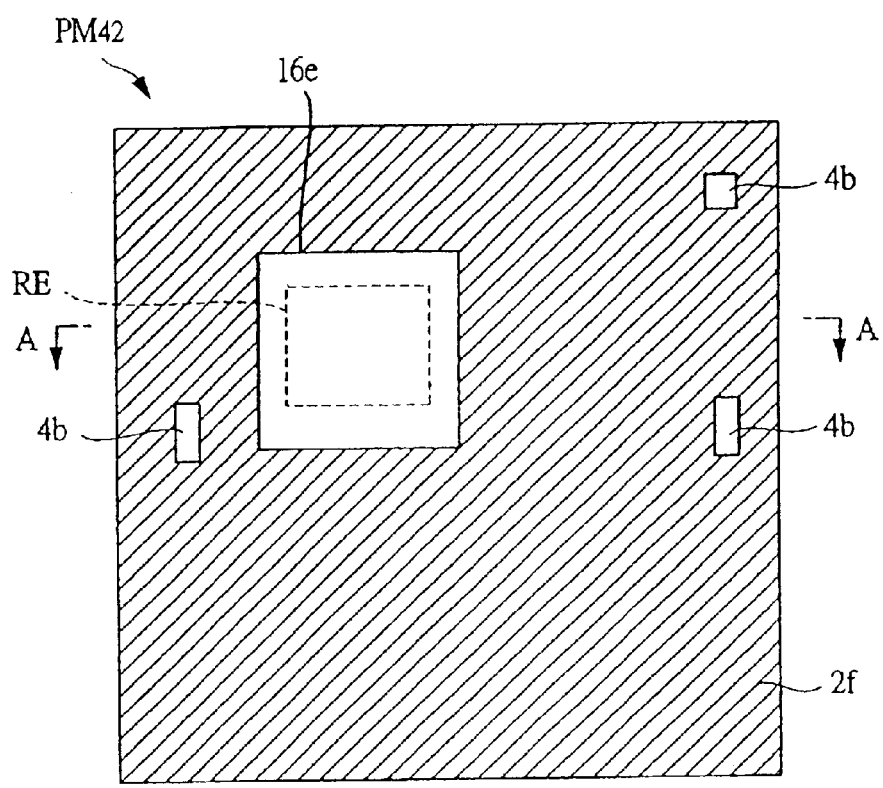
(b)
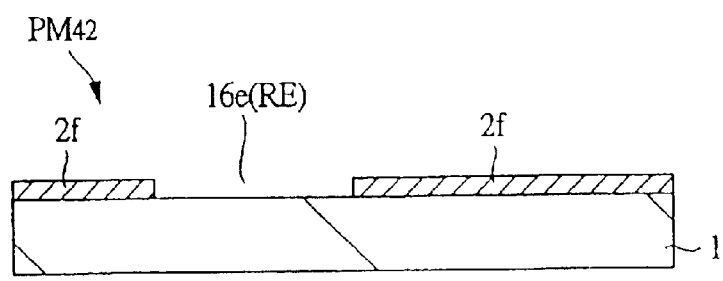

FIG. 30
(a)
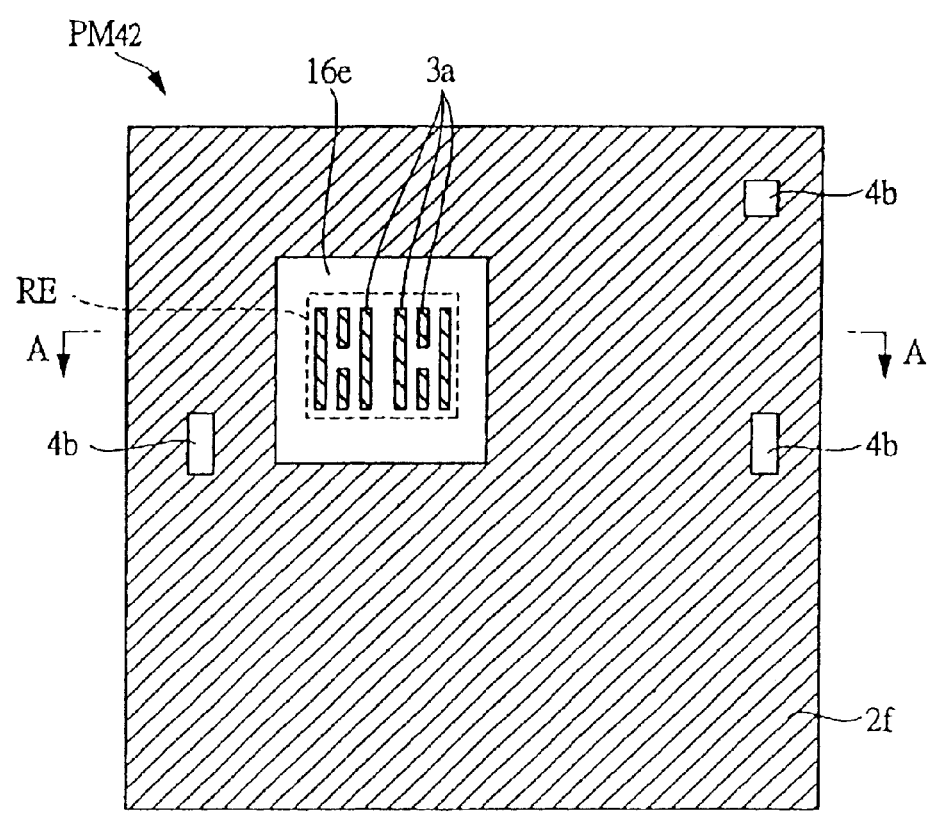
(b)
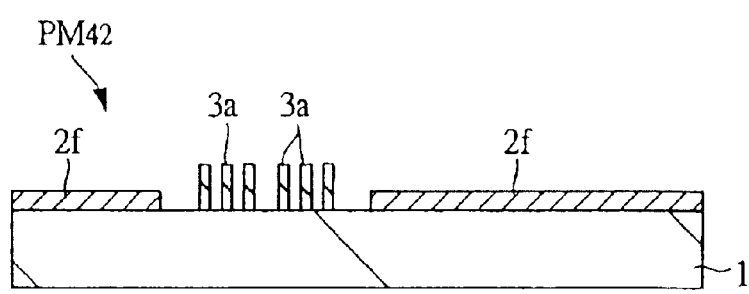

FIG. 31
(a)
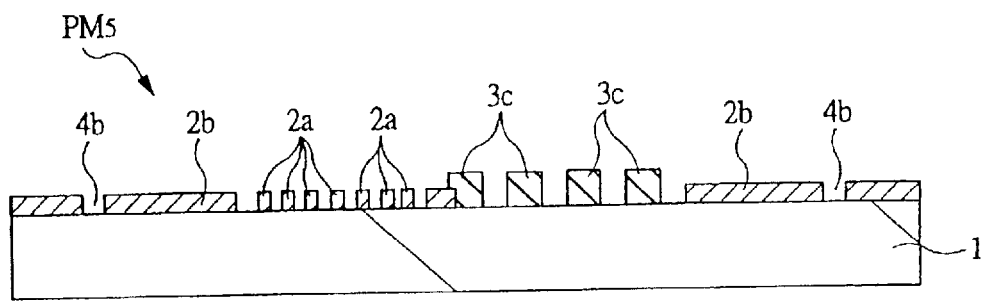
(b)
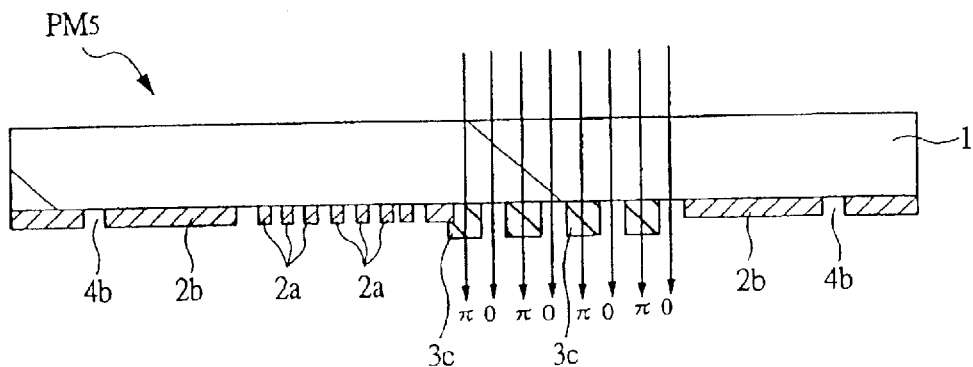

FIG. 32
(a)
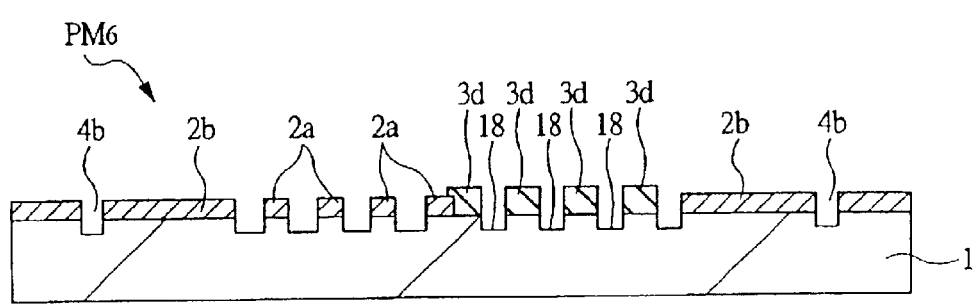
(b)
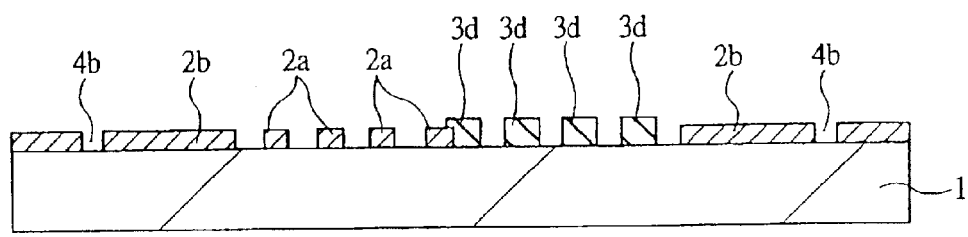

FIG. 33
(a)
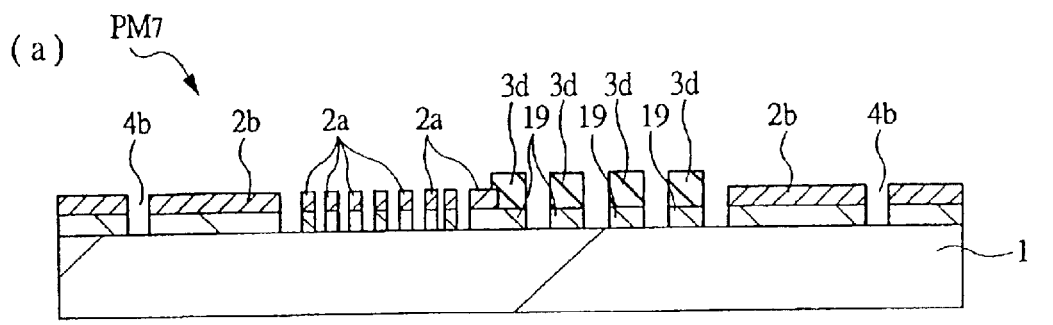
(b)
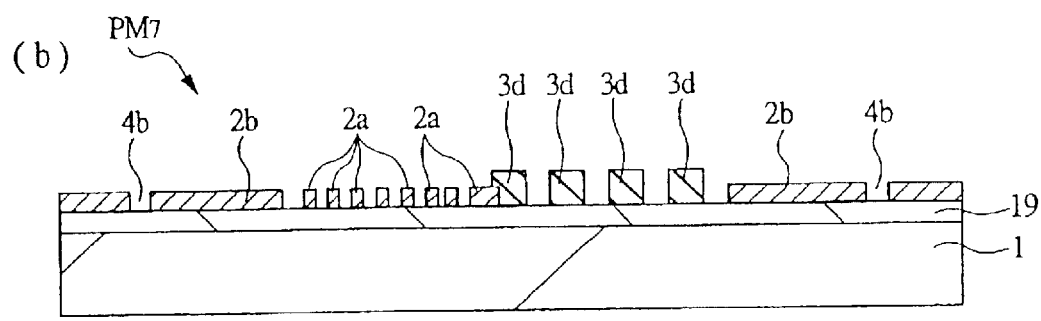

FIG. 34
(a) 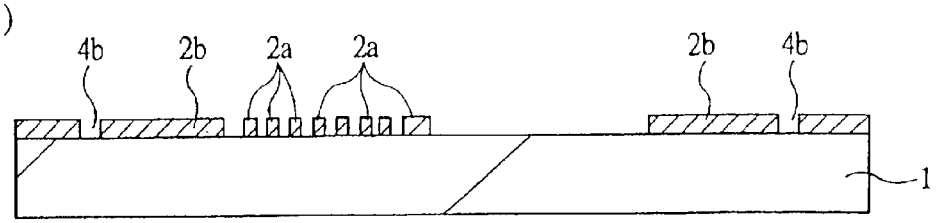
(b) 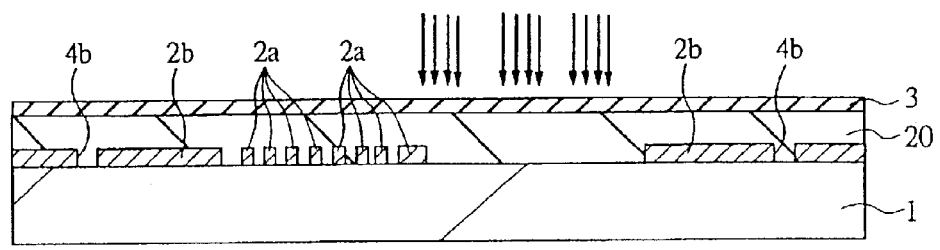
(c) 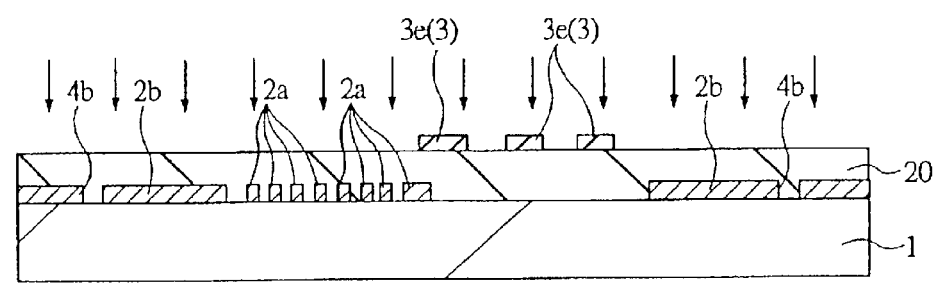
(d) 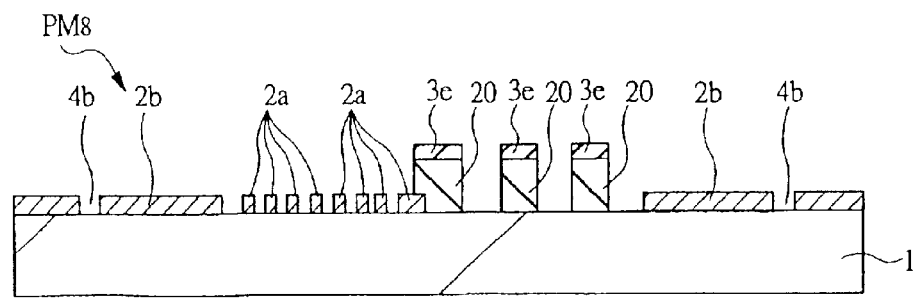

FIG. 35
(a)
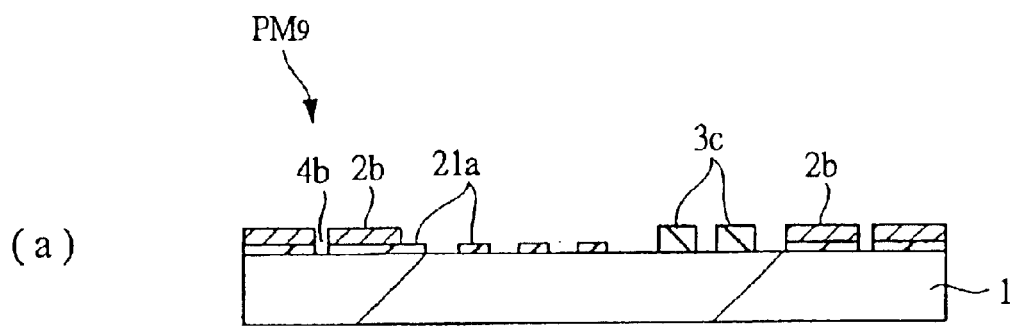
(b)
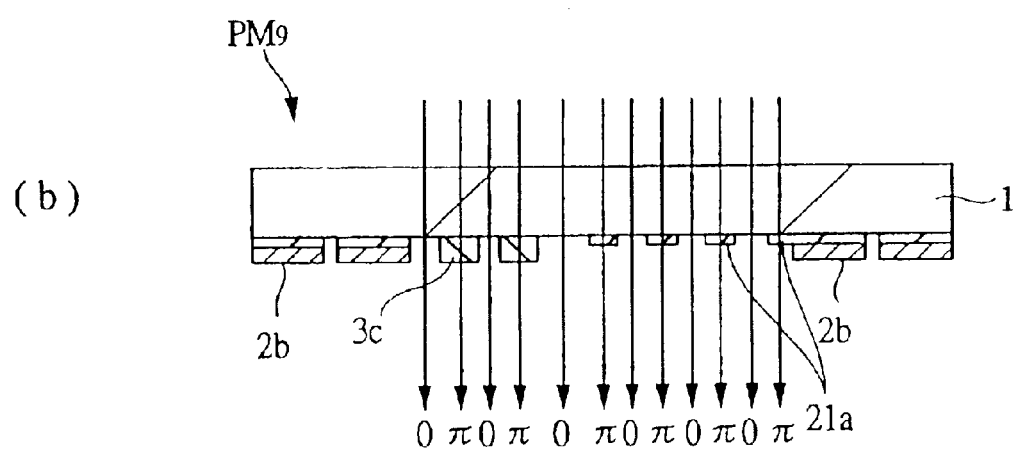

FIG. 37
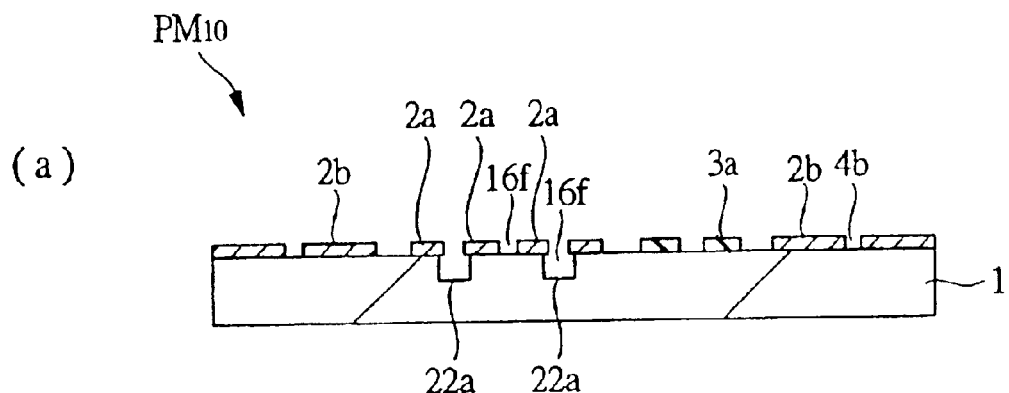
(a)
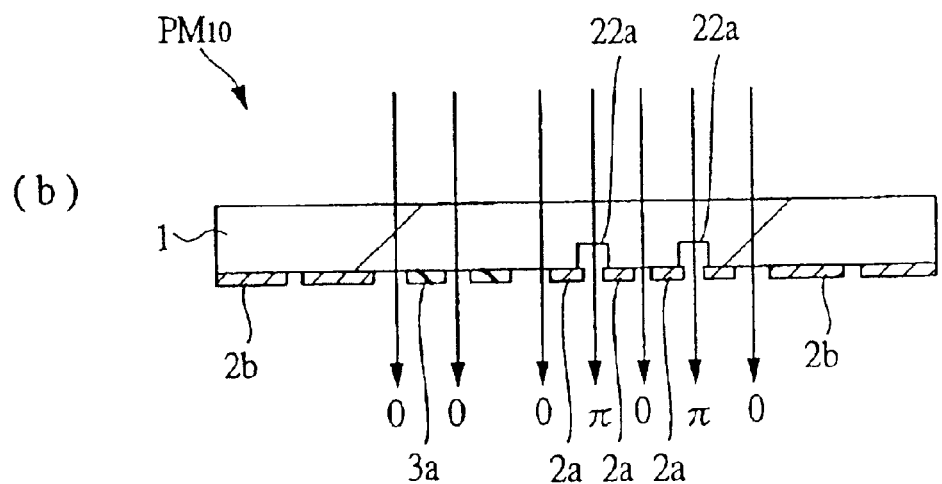
(b)

FIG. 40
(a)
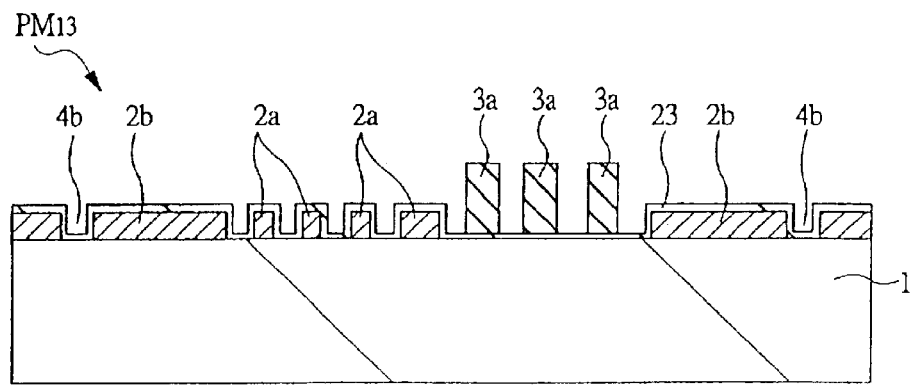
(b)
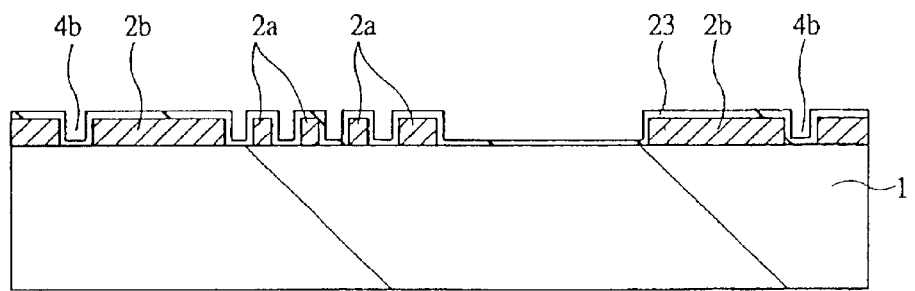

FIG. 41
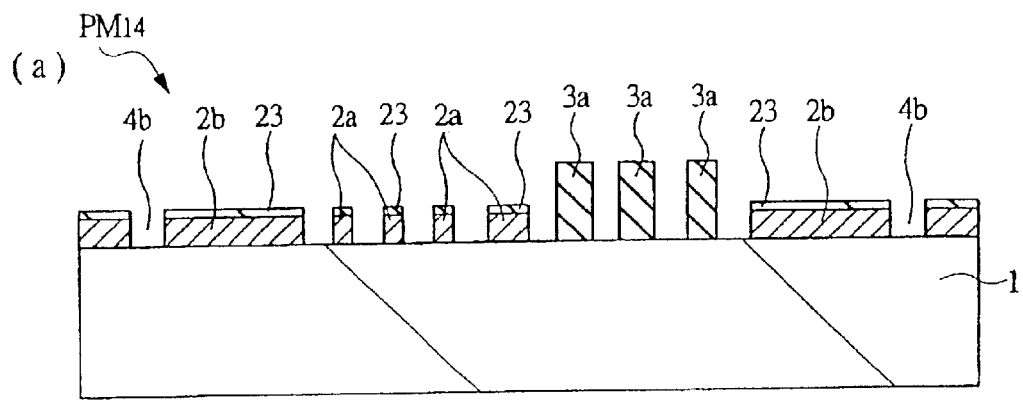
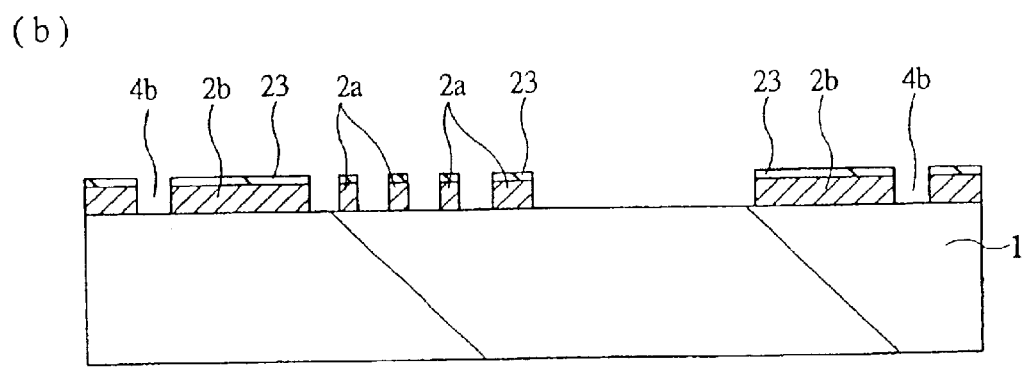

FIG. 42
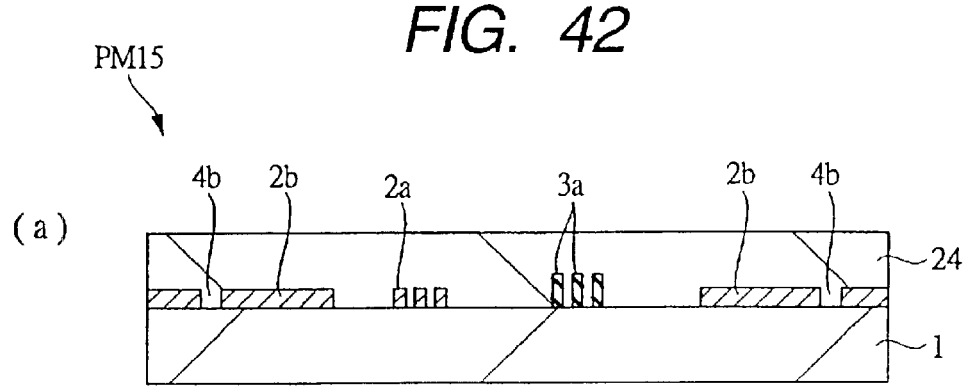
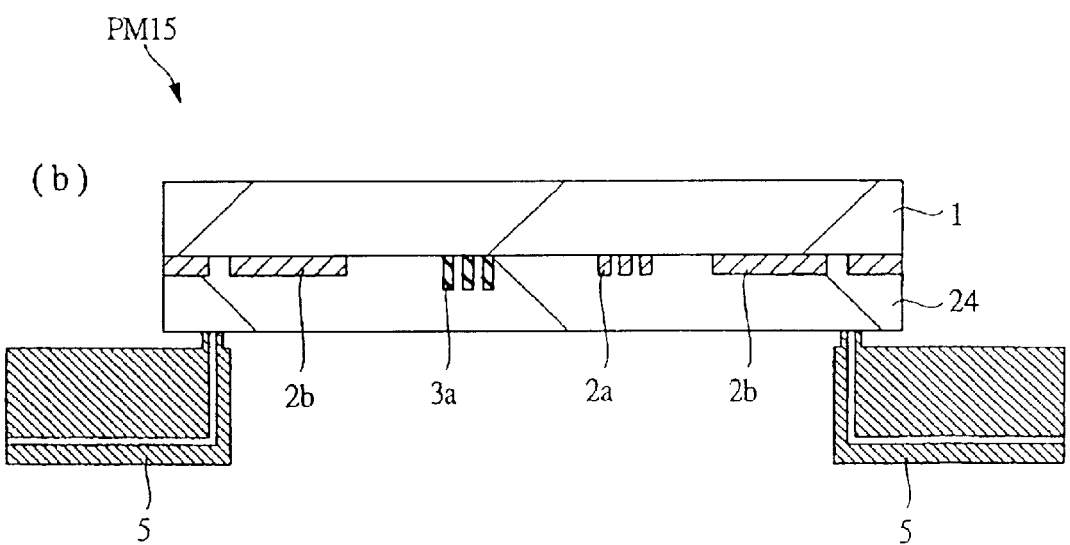

FIG. 43
(a)
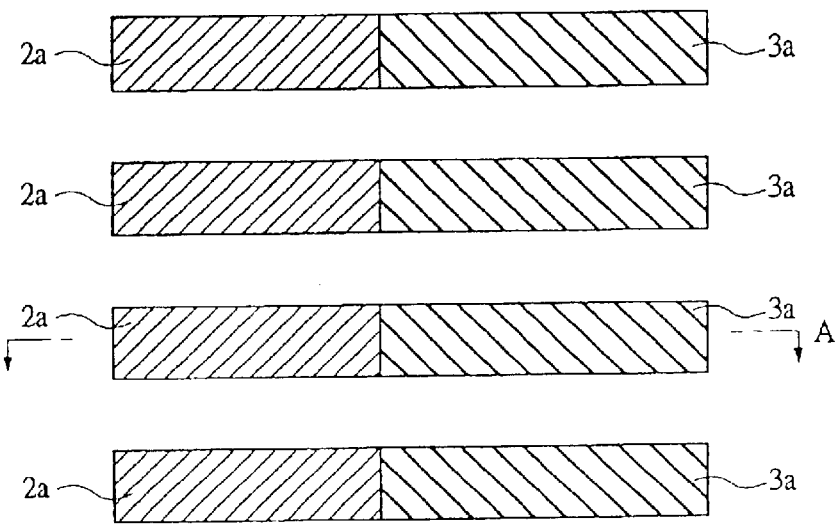
(b)
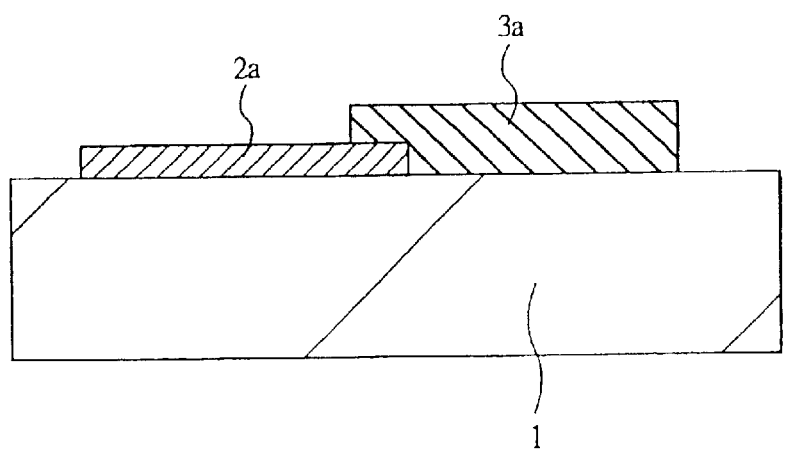

FIG. 44
(a)
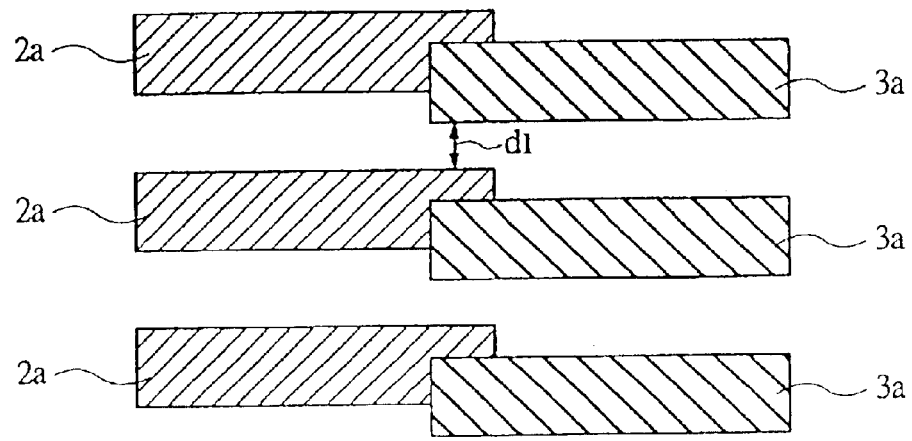
(b)
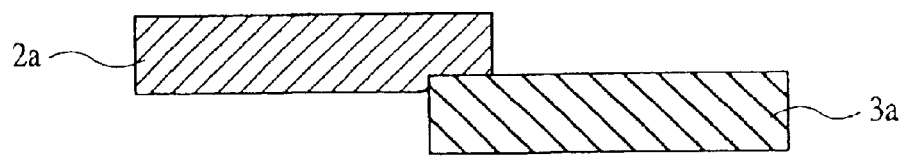

FIG. 45
(a)
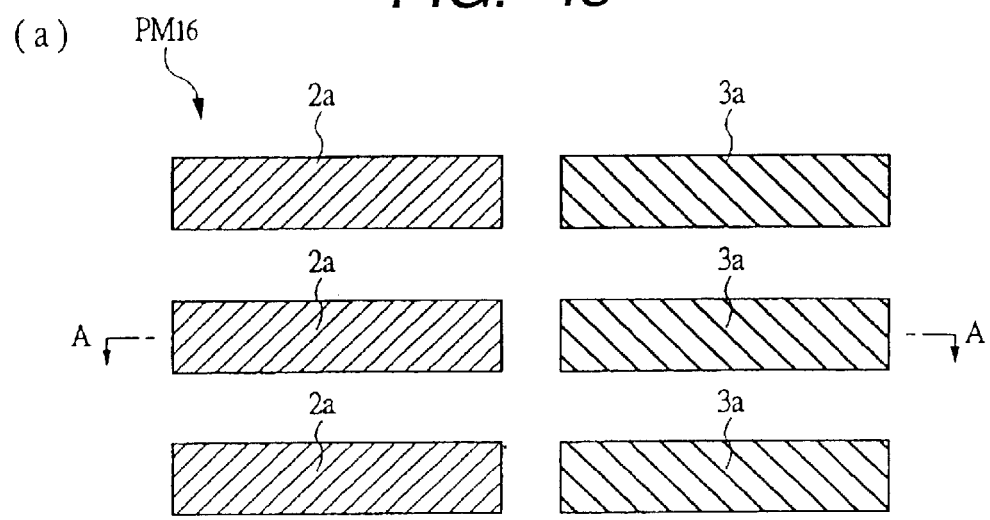
(b)
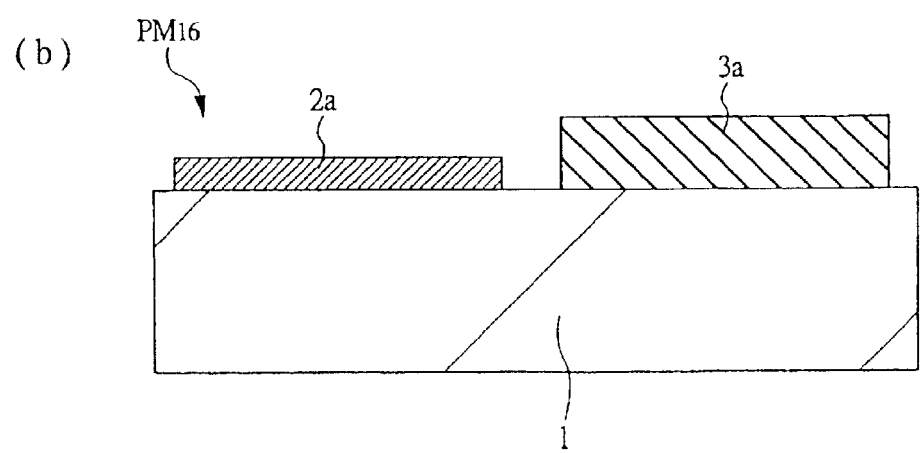

FIG. 46
(a)
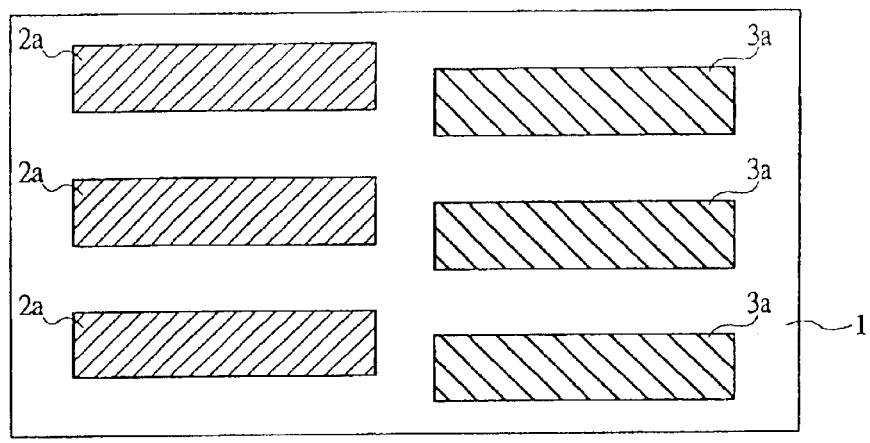
(b)
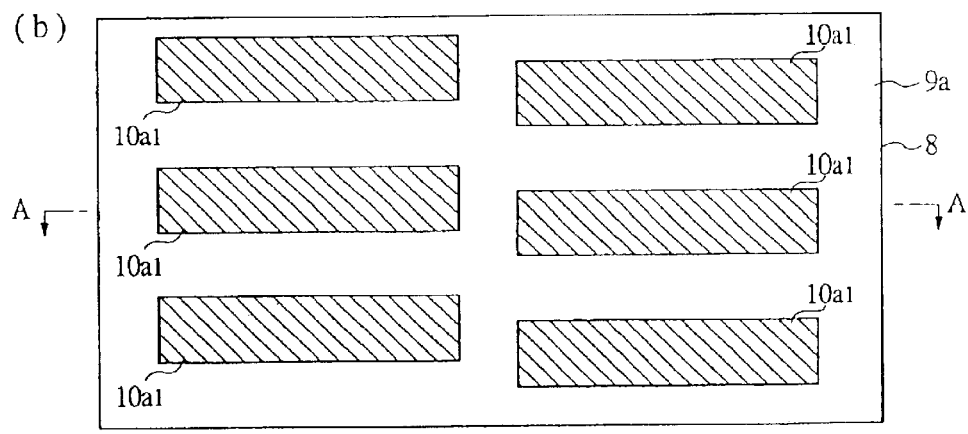
(c)
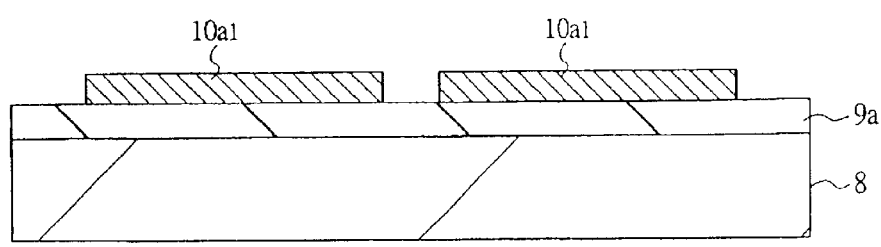

FIG. 48
(a) 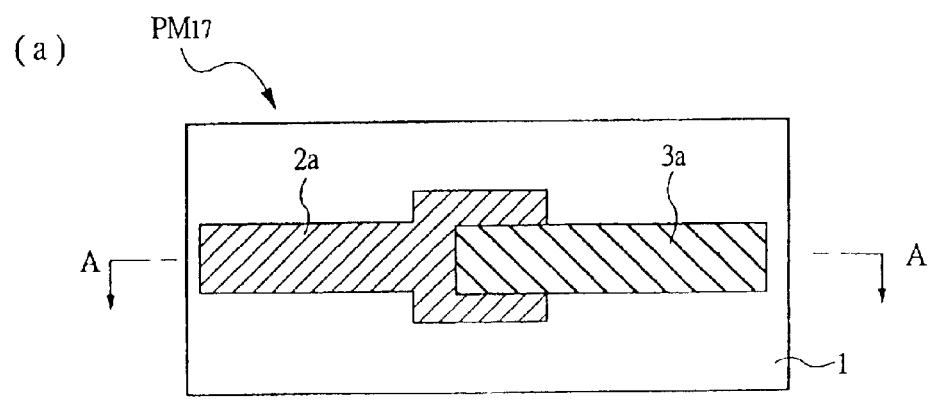
(b) 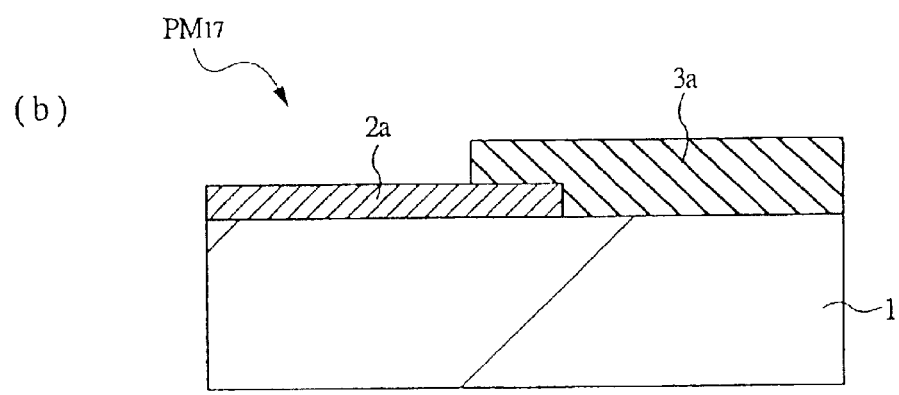

FIG. 49
(a)
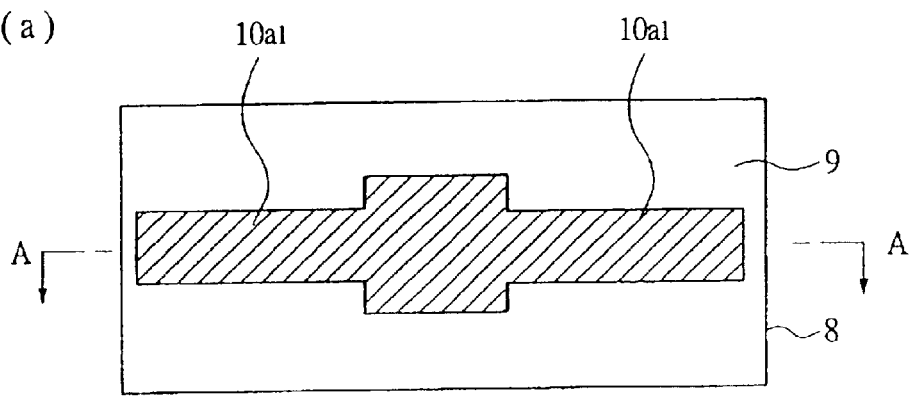
(b)
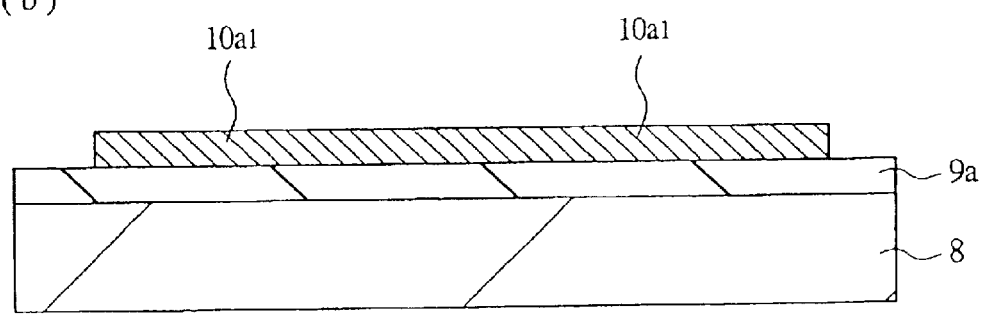

FIG. 50
(a)
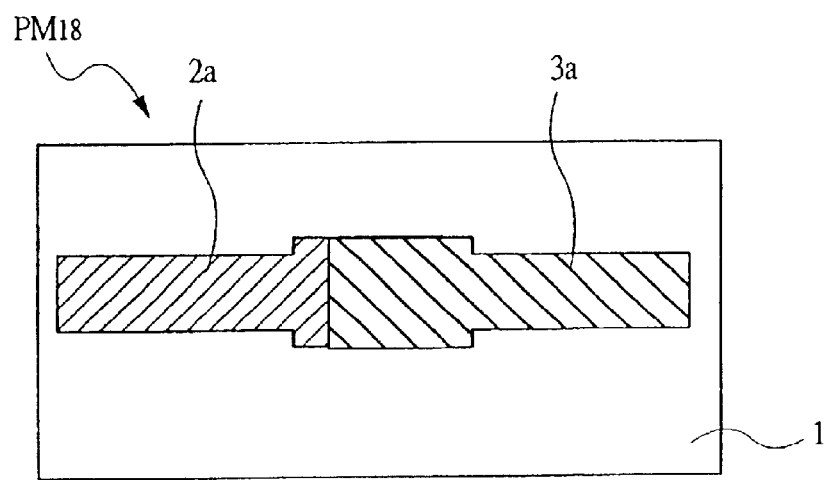
(b)
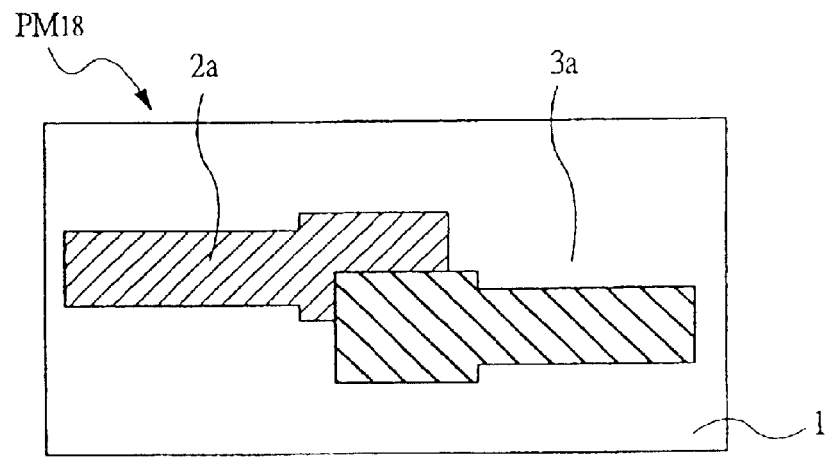

FIG. 54
(a)
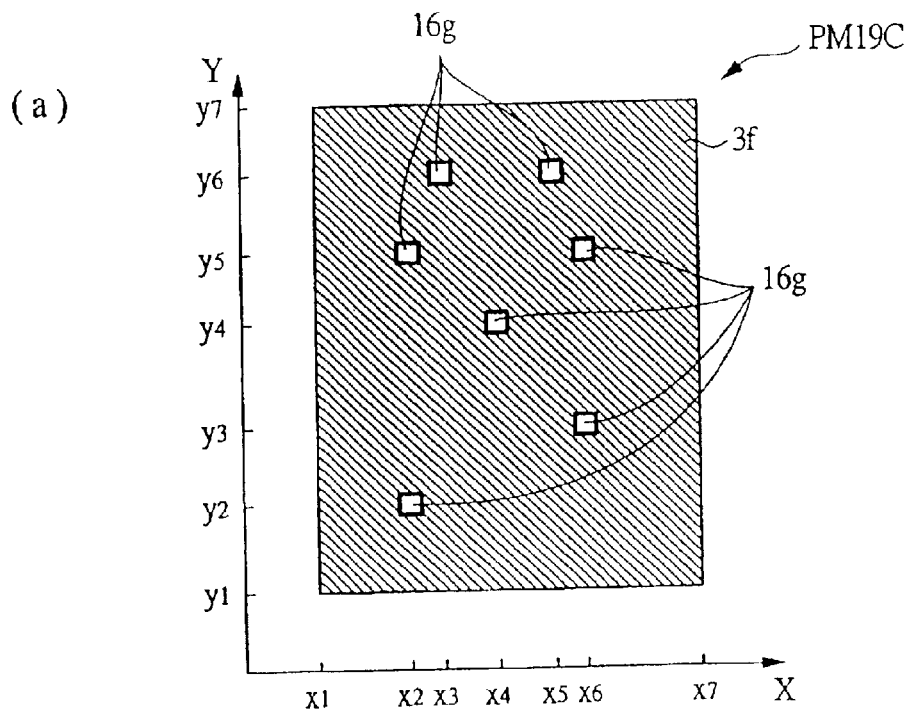
(b)
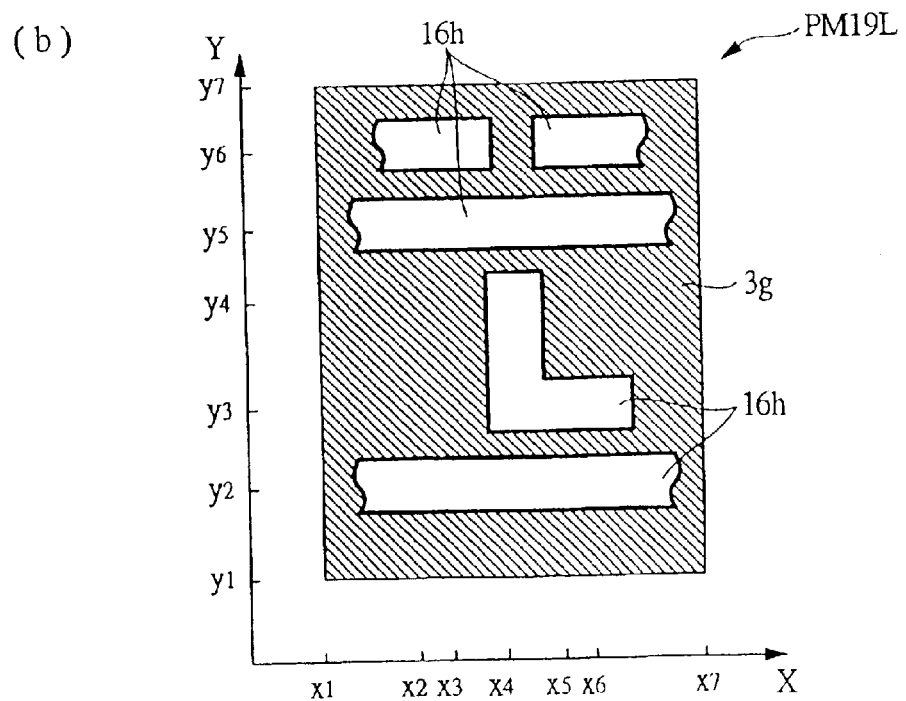

FIG. 56
(a)
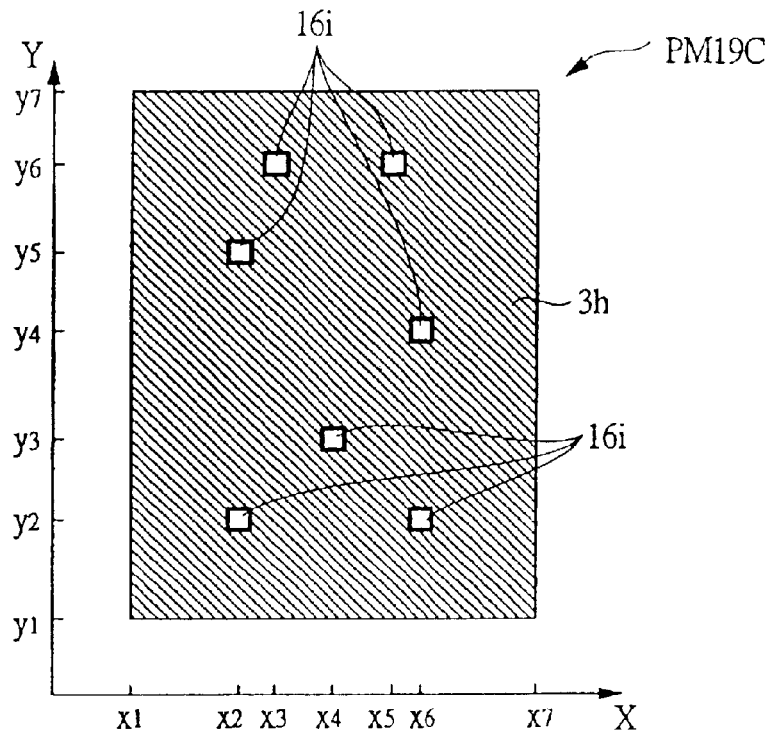
(b)
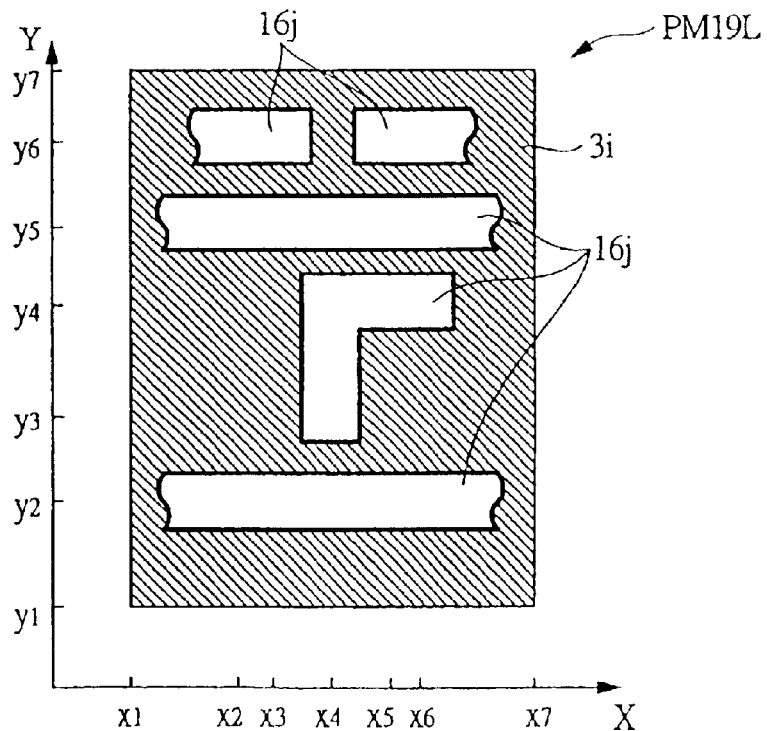

FIG. 58
(a)　(b)
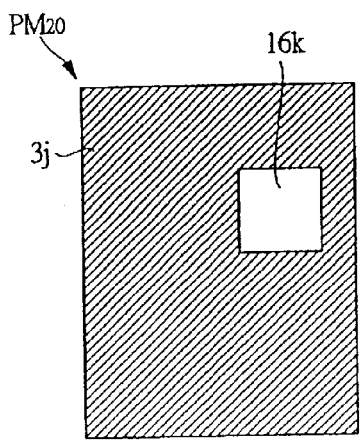
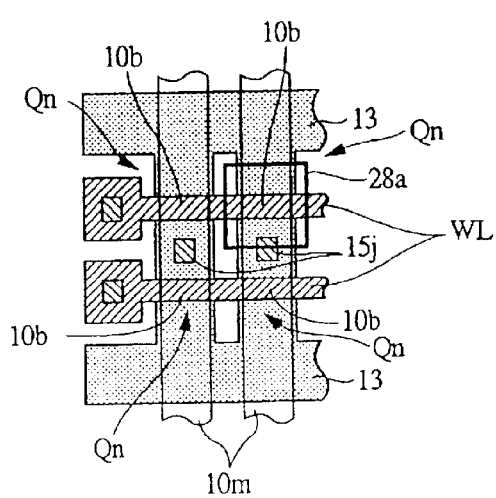
(c)
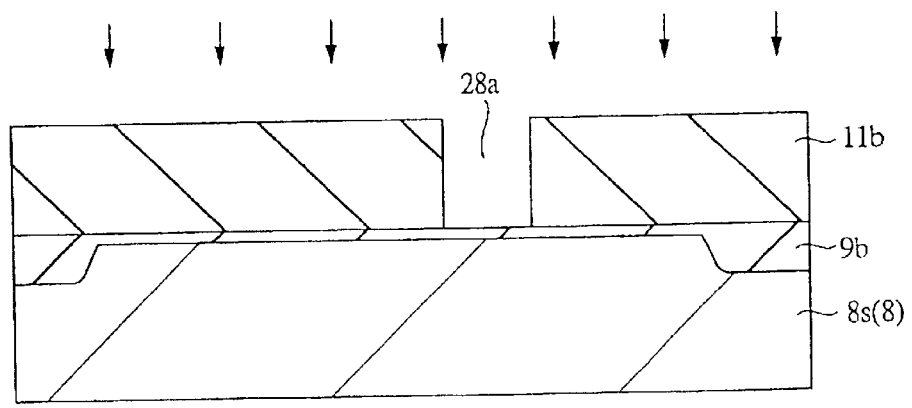

FIG. 60
(a)
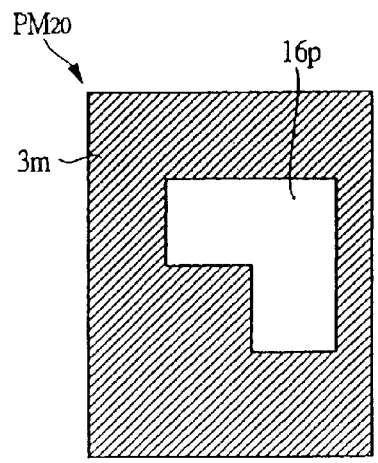
(b)
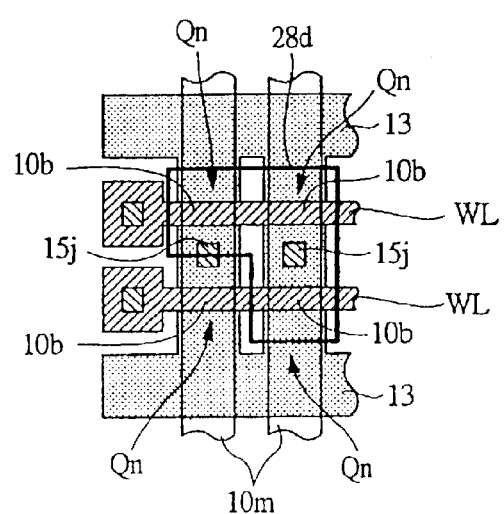
(c)
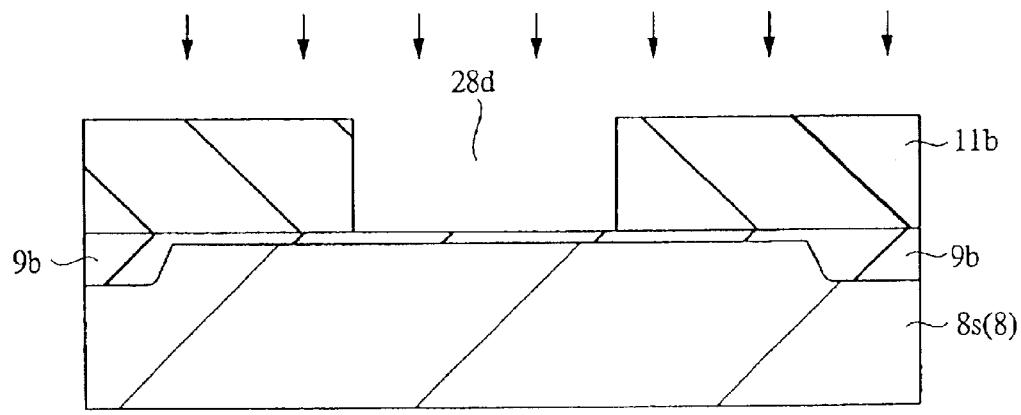

FIG. 61
(a)
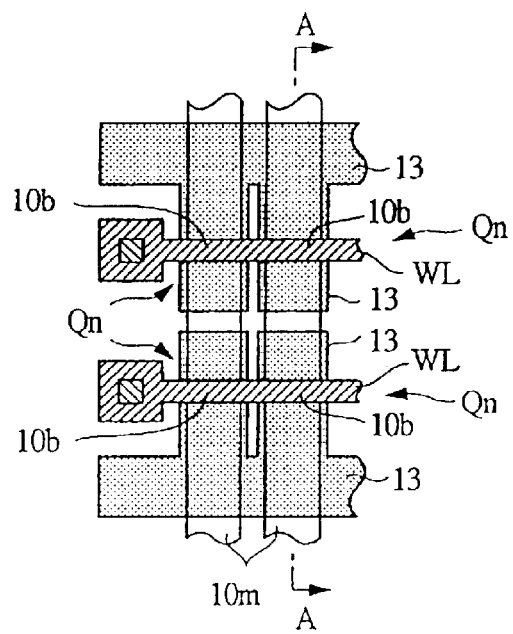
(b)
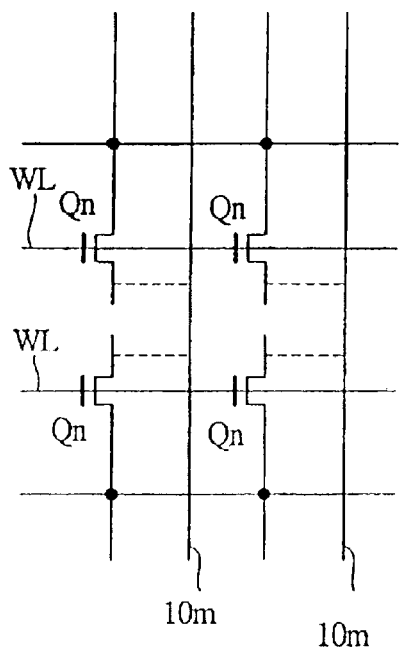
(c)
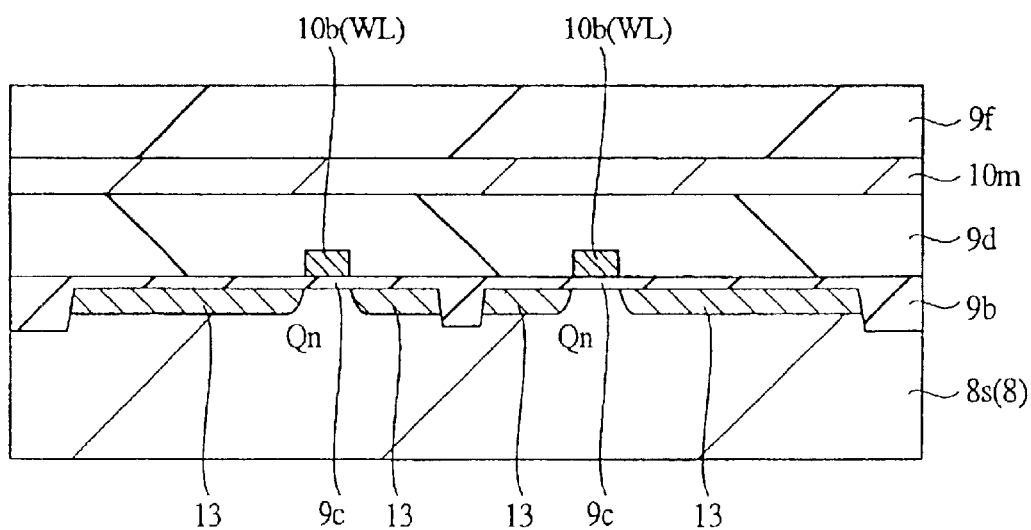

FIG. 63
(a)
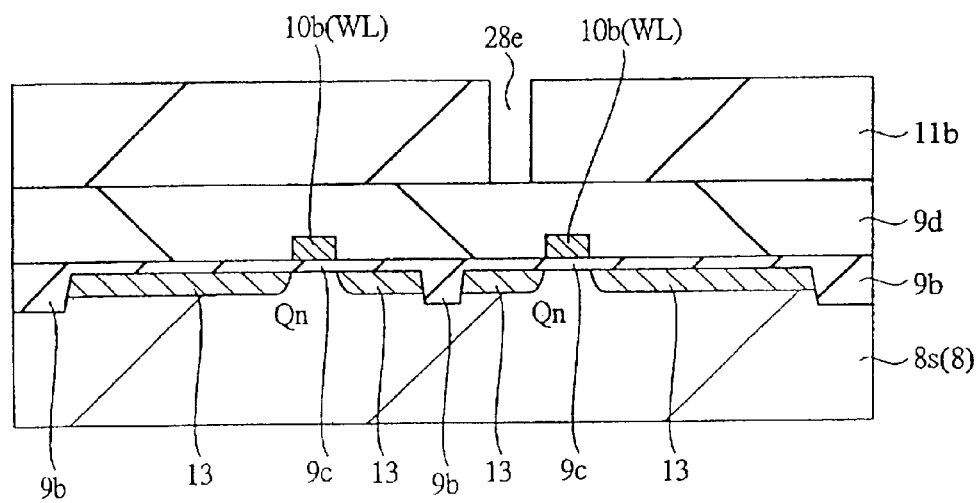
(b)
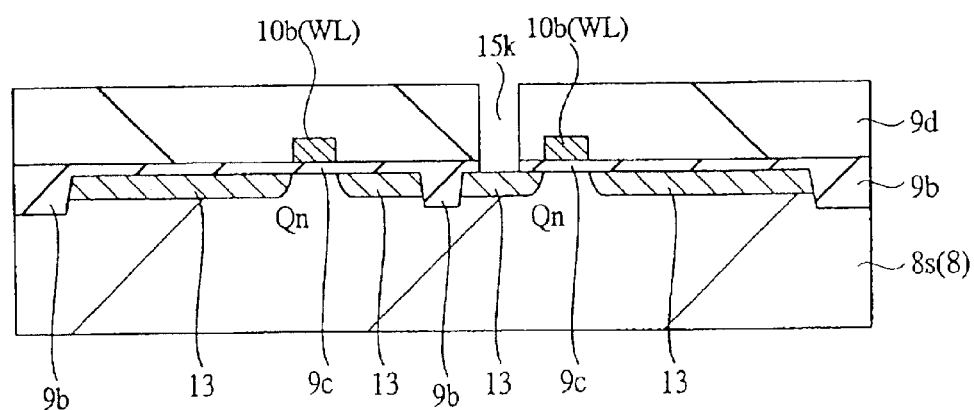

FIG. 64
(a) (b) (c)
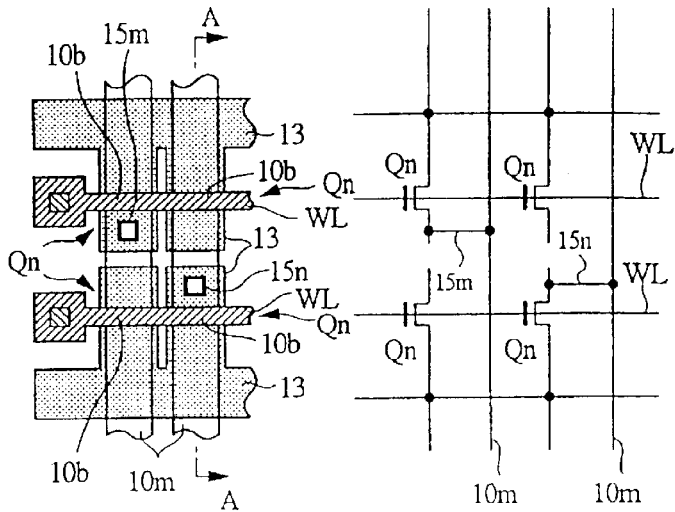
(d)
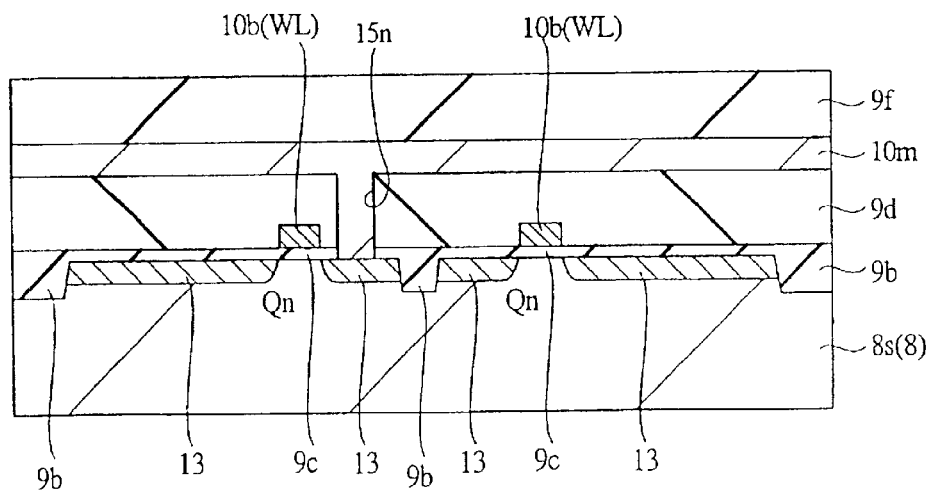

FIG. 66
(a) 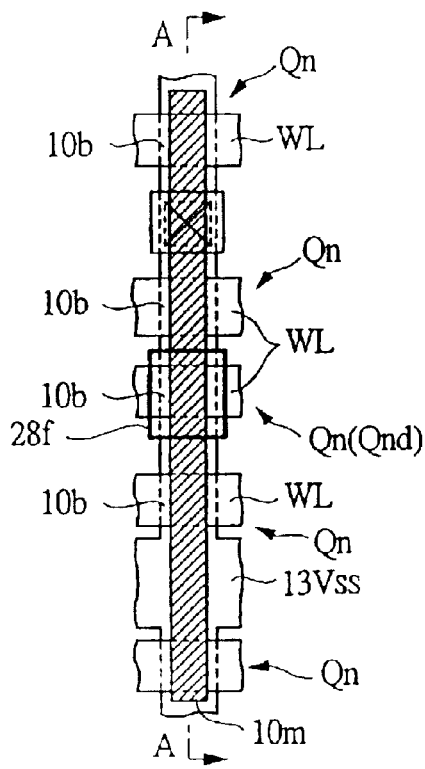
(b) 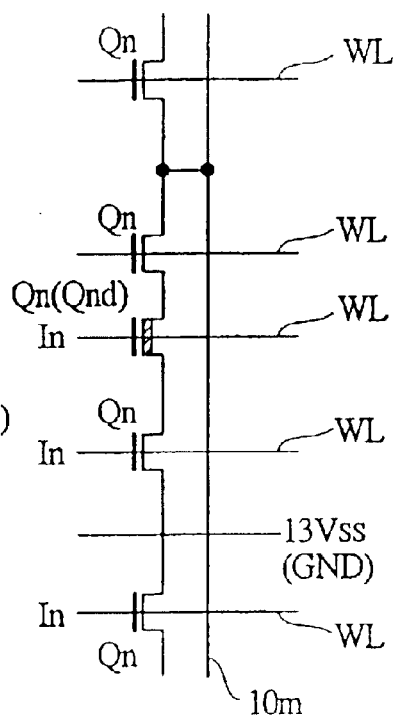
(c) 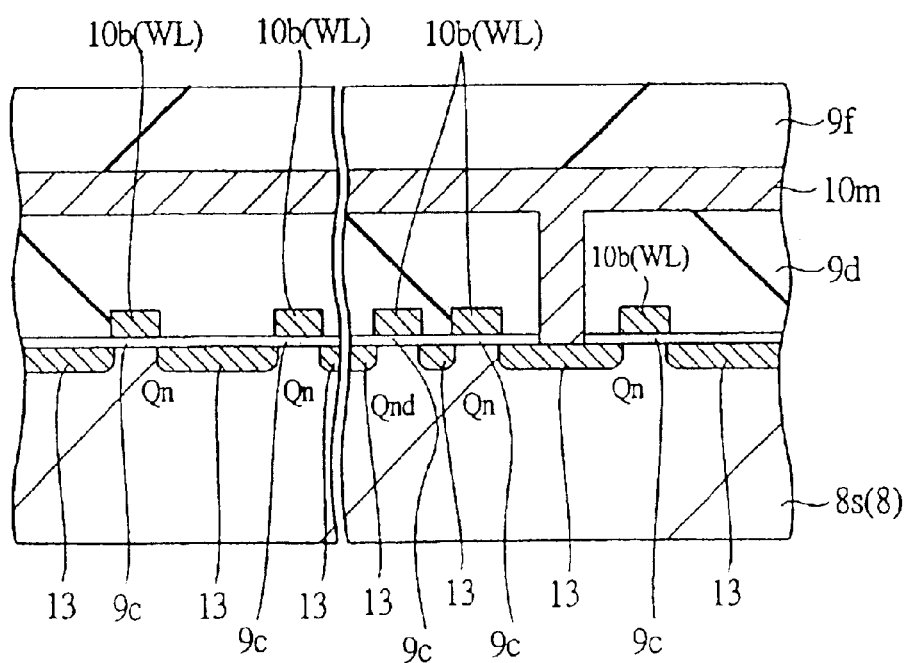

FIG. 69
(a)
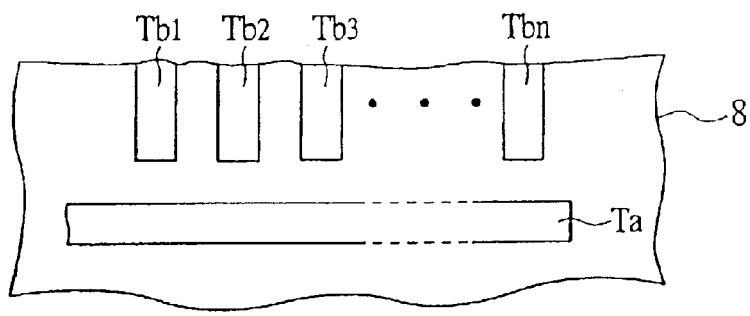
(b)
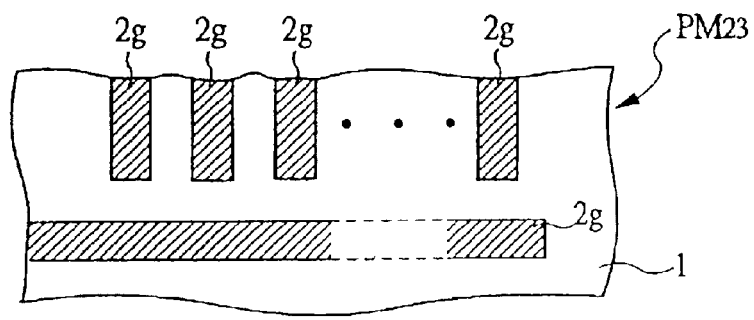
FIG. 70
(a)
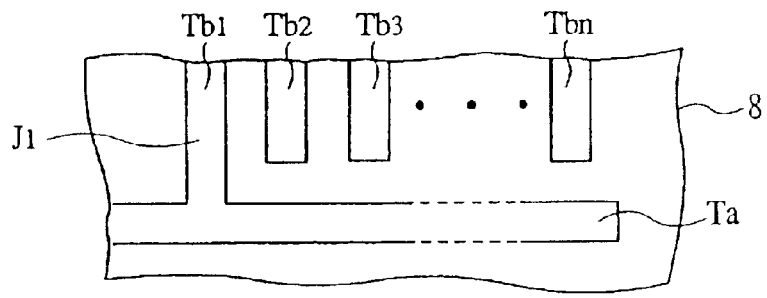
(b)
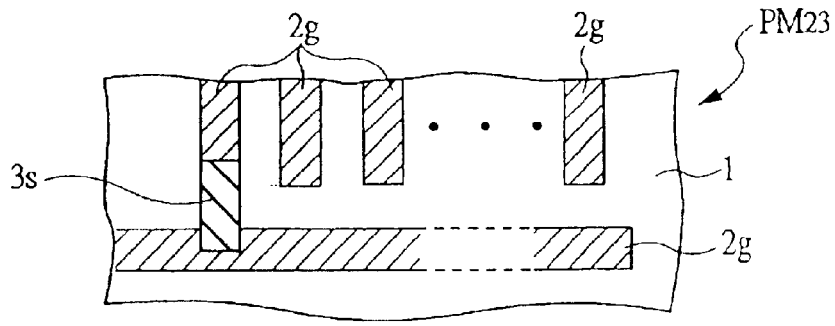

FIG. 74
(a) 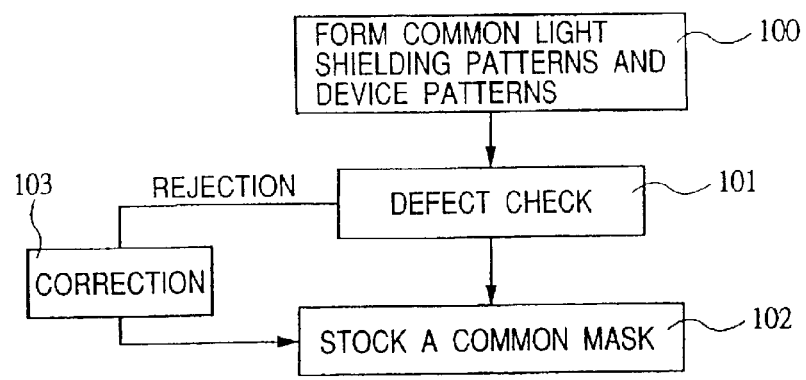
(b) 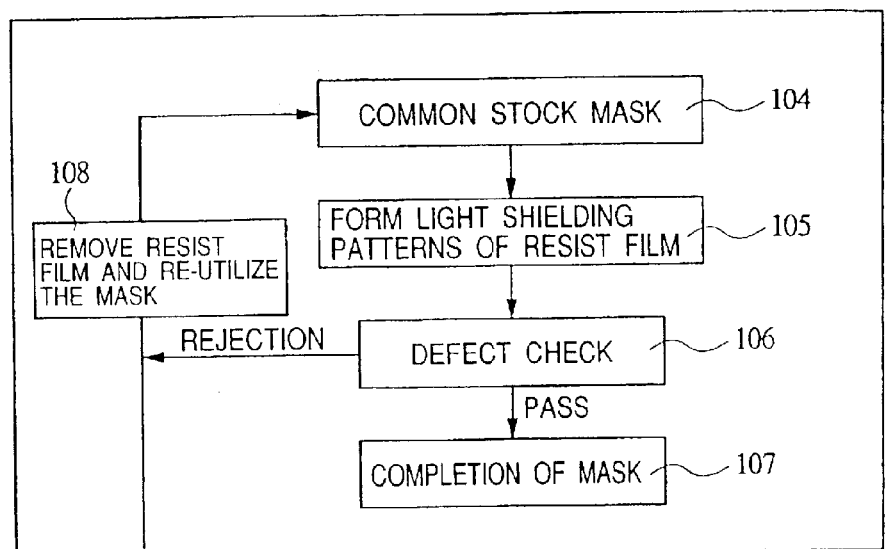
(c) 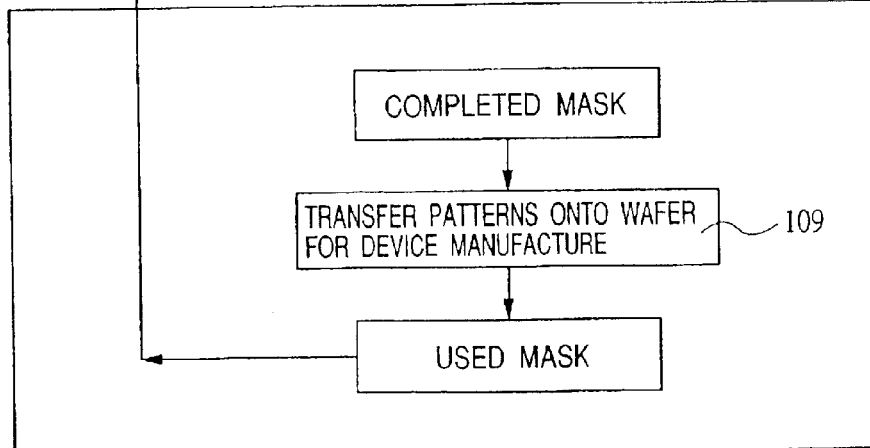

FIG. 79
(a)
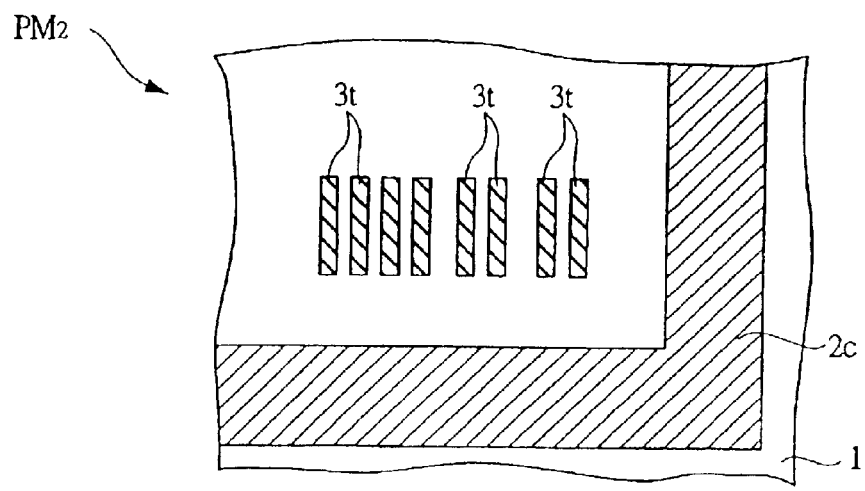
(b)
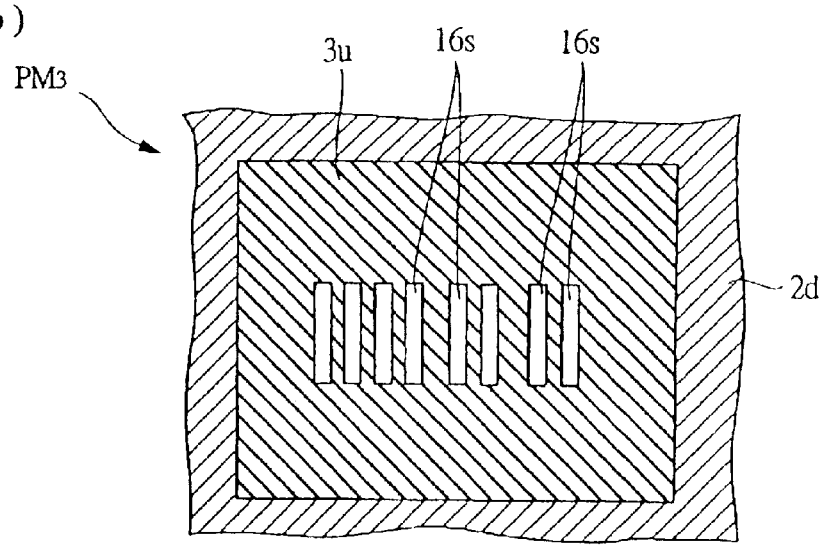

METHOD OF MANUFACTURING INTEGRATED CIRCUIT

This application is a Divisional application of application Ser. No. 10/311,456, filed Dec. 17, 2002, which is a National Stage application filed under 35 USC § 371 of International (PCT) Application No. PCT/JP01/05546 filed Jun. 28, 2001, the contents of which Ser. No. 10/311,456 are incorporated herein by reference in their entirety.

BACKGROUND OF THE INVENTION

The present invention relates to a technique for manufacturing a semiconductor integrated circuit device; and, more particularly, the invention relates to a technique which is effective when applied to the lithography processing used in a semiconductor integrated circuit device manufacturing process.

In the manufacture of a semiconductor integrated circuit device, a lithography technique is used as a method of transferring a fine pattern onto a semiconductor wafer. In such a lithography technique, a projection exposure system is used, and a pattern of a photomask (hereinafter referred to simply as "mask") attached to the projection exposure system is transferred onto a semiconductor wafer (simply "wafer" hereinafter) to form a device pattern.

A mask pattern of an ordinary mask, which the present inventors have studied, is formed by patterning a light shielding film of chromium (Cr), for example, formed on a transparent quartz substrate. For example, this patterning work for the light shielding film is performed in the following manner. First, an electron beam-sensitive resist is applied onto the light shielding film, and then a desired pattern is plotted to the electron beam-sensitive resist by means of an electron beam plotter, followed by development to form a resist pattern of a desired shape. Subsequently, using the resist pattern as an etching mask, the light shielding film is subjected to patterning by dry or wet etching, followed by removal of the resist pattern and subsequent washing, to form a light shielding pattern of a desired shape on the transparent quartz substrate.

Various mask structures have been proposed in line with the recent tendency toward improvement of the resolution attainable in the lithography process. For example, Japanese Published Unexamined Patent Application No. Hei 4(1992)-136854 discloses a technique using a halftone type phase shift mask as a means for improving the resolution of a single transparent pattern. According to the technique disclosed therein, a surrounding portion relative to a single transparent pattern is made translucent, that is, a light shielding portion of the mask is made translucent, and then, in this state, the phase of a very small amount of light passing through the translucent portion and having a sensitivity not higher than that of a photoresist and the phase of light passing through the transparent pattern are inverted. Since the light which has passed through the translucent film is inverted in phase with respect to the light which has passed through the transparent pattern serving as a main pattern, there occurs a phase inversion at the boundary portion, and the light intensity at the pattern boundary approaches zero. As a result, the ratio between the intensity of the light which has passed through the transparent pattern and that at the pattern boundary becomes relatively large, and so a light intensity distribution is obtained which is higher in contrast in comparison with a technique not using the translucent film. This halftone type phase shift mask corresponds to a mask in which the light shielding mask of the foregoing ordinary mask has been replaced with a halftone phase shift film, and it is fabricated by almost the same process as the ordinary mask manufacturing process referred to above.

Japanese Published Unexamined Patent Application No. Hei 5(1993)-289307 discloses a technique of forming a light shielding film by a resist film with a view toward attaining simplification and high accuracy of the mask manufacturing process. The method disclosed therein utilizes the property that an ordinary electron beam-sensitive resist or a photosensitive resist shields a vacuum ultraviolet light having a wavelength of approximately 200 nm or less. According to this method, it becomes unnecessary to use an etching step for a light shielding film and a resist removing step, thus providing a reduction of the cost, an improvement of the dimensional accuracy, and a decrease in the number of defects.

Japanese Published Unexamined Patent Application No. Sho 55(1980)-22864 discloses a masking technique for lithography using a pattern formed by a laminate of a metallic film and an organic material layer. According to the technique disclosed therein, a photoresist pattern for patterning a chromium layer on a main surface of a glass substrate is irradiated with argon ions and is thereby fixed to the chromium layer pattern, thereby improving the shielding effect against the exposure light.

Japanese Published Unexamined Patent Application No. Sho 60(1985)-85525 discloses a technique in which a photoresist is applied onto a mask having a defect to be remedied, and then a focused, charged particle beam is radiated onto a tiny area of the photoresist, which area is to remedy a defect in the mask, to form an opaque carbon film in that area.

Further, Japanese Published Unexamined Patent Application No. Sho 54(1979)-83377 discloses a technique in which an opaque emulsion is buried into a local defective portion of a photomask to effect the correction of pattern.

SUMMARY OF THE INVENTION

However, the present inventors have found that the foregoing masking techniques have the following inherent problems.

The change or modification of a mask pattern on a mask cannot be done quickly. In the semiconductor integrated circuit device manufacturing process, there sometimes is a case where a circuit pattern is changed or modified for realizing a semiconductor chip construction conforming to a specification requested by a customer, for meeting a customer's request in product development or in manufacture, for rewriting memory information, for the adjustment of characteristics, or for the relief of a defective circuit. For example, Japanese Published Unexamined Patent Application No. Sho 63(1988)-274156 Indicates that wiring should be changed frequently for writing: information to a ROM (Read Only Memory) in the manufacture of a semiconductor integrated circuit device which incorporates the ROM. In an ordinary mask, however, the provision of a mask substrate and the deposition and patterning of a chromium film are required at every change or modification of the design of the mask, with the result in that the fabrication of the mask requires much time. Consequently, much time and labor are required for developing or manufacturing a semiconductor integrated circuit device.

Moreover, in the foregoing publications disclosing the technique of forming the light shielding pattern of mask using a resist film, there is no mention in the disclosure about problems involved in actually using the mask in the semiconductor Integrated circuit device manufacturing process and about problems involved in manufacturing the mask, much less measures to solve such problems. For example, there are the following problems.

Firstly, it is difficult to detect predetermined patterns used in detecting various information, such as a mask alignment mark, a pattern measurement mark, and a product judgment mark. For example, in the mask defect inspecting system and exposure system presently in use, a halogen lamp is typically used for the alignment of the mask. Therefore, in case of attaching a mask to the defect inspecting system or exposure system, if a detection mark on the mask is formed of a resist film pattern, it is difficult to detect the pattern because the resist film is high in light transmittance and a high contrast cannot be obtained. As a result, it becomes difficult to effect alignment between the mask and the defect inspecting system or exposure system, making it impossible to effect the inspection and exposure in a satisfactory manner.

Secondly, dust particles are produced at the time of loading the mask to the defect inspecting system or exposure system. In the foregoing conventional techniques, at the time of loading the mask to the defect inspecting system or exposure system, the resist film of the mask comes into direct contact with a mask fixing member (e.g., vacuum fixing member) in the defect inspecting system or exposure system, with consequent breakage or chipping of the resist film, leading to the generation of dust particles. The dust particles thus generated may adhere to the surface of a lens used in the defect inspecting system or exposure system, or they may contaminate the interior of a chamber or adhere to the surface of a semiconductor wafer, which would cause deterioration of the pattern inspection accuracy or transfer accuracy, or a defect such as a short-circuit or open-circuit defect of a pattern may occur, resulting in the semiconductor integrated circuit being deteriorated in its reliability and yield.

Thirdly, in case of affixing a pellicle onto the mask, if a resist film is present at the portion where the pellicle is to be affixed, it is impossible to affix the pellicle in a satisfactory manner, and the pellicle becomes easy to peel off, and dust particles occur at the time of peeling of the pellicle.

It is an object of the present invention to provide a technique that is capable of shortening the time required for changing or modifying a mask pattern of a mask.

It is another object of the present invention to provide a technique that is capable of shortening the period for the development or the manufacture of a semiconductor integrated circuit device.

It is a further object of the present invention to provide a technique that is capable of improving an information detecting capability in a mask, wherein a resist film is allowed to function as a light shielding film.

It is a still further object of the present invention to provide a technique that is capable of suppressing or preventing the generation of dust particles in an exposure processing using a mask, wherein a resist film is allowed to function as a light shielding film.

The above and other objects and novel features of the present invention will become apparent from the following description and the accompanying drawings.

Typical aspects of the invention disclosed herein will be outlined below.

In one aspect of the present invention, there is a step of transferring a predetermined pattern to a resist film formed on a main surface of a semiconductor wafer by an exposure processing using a photomask formed on a main surface of a mask substrate, the photomask having a light shielding portion formed of a resist film and a light shielding formed of metal.

In another aspect of the present invention, the light shielding portion formed of the resist film is removed, and instead, a new light shielding portion comprised of a resist film is formed to modify or change the light shielding portion, and, thereafter, the aforesaid exposure processing is performed.

In a further aspect of the present invention, a light shielding portion is formed of metal along a peripheral portion of the main surface of the mask substrate and a pellicle is contacted and fixed onto the light shielding portion.

In a still further aspect of the present invention, a light shielding portion is formed of metal along the peripheral portion of the main surface of the mask substrate, and an opening is formed in the light shielding portion, thereby forming an information detecting pattern.

BRIEF DESCRIPTION OF THE DRAWINGS

FIG. 1(a) is a plan view of a photomask according to an embodiment of the present invention, and FIG. 1(b) is a sectional view taken on line A—A in FIG. 1(a);

FIGS. 5(a) to 5(c) are sectional views showing a modified example of a manufacturing process for the photomask of FIG. 1;

FIGS. 7(a) and 7(b) are diagrams which illustrate a semiconductor integrated circuit device manufacturing process using the photomask of FIG. 1, in which FIG. 7(a) is a plan view of a principal portion of a semiconductor wafer, and FIG. 7(b) is a sectional view taken on line A—A in FIG. 7(a);

FIGS. 8(a) and 8(b) are diagrams which illustrate a step following the state shown in FIG. 7, in which FIG. 8(a) is a plan view of the principal portion of the semiconductor wafer, and FIG. 8(b) is a sectional view taken on line A—A in FIG. 8(a);

FIGS. 9(a) and 9(b) are diagrams which illustrate a step following the state shown in FIG. 8, in which FIG. 9(a) is a plan view of the principal portion of the semiconductor wafer, and FIG. 9(b) is a sectional view taken on line A—A in FIG. 9(a);

FIG. 15(a) is a plan view of the photomask of FIG. 1 as used in a modifying/changing step for a light shielding pattern formed of resist film, and FIG. 15(b) is a sectional view taken on line A—A in FIG. 15(a);

FIG. 16(b) is a sectional view taken on line A—A in FIG. 16(a);

FIG. 17(a) is a plan view of a semiconductor wafer, showing patterns transferred through the photomask of FIG. 16(a) and FIG. 17(b) is a sectional view taken on line A—A in FIG. 17(a);

FIG. 22(a) is a plan view of the photomask of FIG. 21 as used in a modifying/changing step for a light shielding pattern formed of resist film, and FIG. 22(b) is a sectional view taken on line A—A in FIG. 22(a);

FIG. 23(a) is a plan view of the photomask of FIG. 21 as used in the modifying/changing step for the light shielding pattern formed of resist film, and FIG. 23(b) is a sectional view taken on line A—A in FIG. 23(a);

FIG. 25(a) is a plan view of the photomask of FIG. 24 as used in a modifying/changing step for a light shielding pattern formed of resist film, and FIG. 25(b) is a sectional view taken on line A—A in FIG. 25(a);

FIG. 26(a) is a plan view of the photomask of FIG. 24 as used in the modifying/changing step for the light shielding pattern formed of resist film, and FIG. 28(b) is a sectional view taken on line A—A in FIG. 26(a);

FIG. 27(a) is a plan view of a first photomask according to a still further embodiment of the present invention, and FIG. 27(b) is a sectional view taken on line A—A in FIG. 27(a);

FIG. 28(a) is a plan view of a second photomask used in the embodiment illustrated in FIG. 27(a), and FIG. 28(b) is a sectional view taken on line A—A in FIG. 28(a);

FIG. 29(a) is a plan view of the photomask of FIG. 28 as used in a modifying/changing step for a light shielding pattern formed of resist film, and FIG. 29(b) is a sectional view taken on line A—A in FIG. 29(a);

FIG. 30(a) is a plan view of the photomask of FIG. 28 as used in the modifying/changing step for the light shielding pattern formed of resist film, and FIG. 30(b) is a sectional view taken on line A—A in FIG. 30(a);

FIG. 31(a) is a sectional view of a photomask according to a still further embodiment of the present invention, and FIG. 31(b) is a sectional view of the photomask of FIG. 31(a), showing a state of phase inversion of exposure light that has passed through various portions of the photomask;

FIG. 32(a) is a sectional view of a photomask according to a still further embodiment of the present Invention, and FIG. 32(b) is a sectional view of the photomask of FIG. 32(a), showing a manufacturing step for the photomask;

FIG. 33(a) is a sectional view of a photomask according to a still further embodiment of the present invention, and FIG. 33(b) is a sectional view of the photomask of FIG. 33(a), showing a manufacturing step for the photomask;

FIGS. 34(a) to 34(d) are sectional views of a photomask according to a still further embodiment of the present invention, showing manufacturing steps for the photomask;

FIG. 35(a) is a sectional view of a photomask according to a still further embodiment of the present Invention, and FIG. 35(b) is a sectional view of the photomask of FIG. 35(a), showing a state of phase inversion of exposure light that has passed through various portions of the photomask;

FIG. 37(a) is a sectional view of a photomask according to a still further embodiment of the present invention, and FIG. 37(b) is a sectional view of the photomask of FIG. 37(a), showing a state of phase inversion of exposure light that has passed through various portions of the photomask;

FIG. 40(a) is a sectional view of a photomask according to a still further embodiment of the present invention, and FIG. 40(b) is a sectional view of the photomask of FIG. 40(a), which is being subjected to pattern modification or change;

FIG. 41(a) is a sectional view of a photomask according to a still further embodiment of the present invention, and FIG. 41(b) is a sectional view of the photomask of FIG. 41(a), which is being subjected to pattern modification or change;

FIG. 42(a) is a sectional view of a photomask according to a still further embodiment of the present invention, and FIG. 42(b) is an explanatory diagram of the photomask of FIG. 42(a) as loaded onto an exposure system;

FIG. 43(a) is a diagrammatic plan view of a connection between a light shielding pattern formed of metal and a light shielding pattern formed of resist film in a photomask according to a still further embodiment of the present invention, and FIG. 43(b) is a sectional view taken on line A—A in FIG. 43(a);

FIGS. 44(a) and 44(b) are diagrams showing the occurrence of a positional deviation between a light shielding pattern formed of metal and a light shielding pattern formed of resist film in a photomask according to a still further embodiment of the present invention;

FIG. 45(a) is a diagrammatic plan view of a connection between a light shielding pattern formed of metal and a light shielding pattern formed of resist film in a photomask according to a still further embodiment of the present invention, and FIG. 45(b) is a sectional view taken on line A—A in FIG. 45(a);

FIG. 46(a) is a diagram showing a positional deviation between the light shielding patterns formed of metal and resist film respectively in the photomask of FIG. 45, FIG. 46(b) is a diagrammatic plan view of patterns which have been transferred onto a semiconductor wafer using the photomask of FIG. 46(a), and FIG. 46(c) is a sectional view taken on line A—A in FIG. 46(b);

FIG. 48(a) is a plan view of a connection between a light shielding pattern formed of metal and a light shielding pattern formed of resist film in a photomask according to a still further embodiment of the present invention, and FIG. 48(b) is a sectional view taken on line A—A in FIG. 48(a);

FIG. 49(a) is a diagrammatic plan view of patterns which have been transferred onto a semiconductor wafer using the photomask of FIG. 48(a), and FIG. 49(b) is a sectional view taken on line A—A in FIG. 49(a);

FIG. 50(a) is a diagrammatic plan view of a connection between a light shielding pattern formed of metal and a light shielding pattern formed of resist film in a photomask according to a still further embodiment of the present invention, and FIG. 50(b) is a sectional view of a principal portion, showing a positional deviation between the light shielding patterns formed of metal and resist film, respectively, in the photomask of FIG. 50(a);

FIGS. 54(a) and 54(b) are plan views of principal portions of photomasks according to still further embodiments of the present invention, which photomasks are used at the time of transfer of circuit patterns shown in FIG. 53(a);

FIGS. 56(a) and 56(b) are diagrammatic plan views of principal portions of photomasks according to still further embodiments of the present invention, which photomasks are used at the time of transfer of circuit patters shown in FIG. 55(a);

FIG. 58(a) is a diagrammatic plan view of a principal portion of a photomask according to a still further embodiment of the present invention, which photomask is used at the time of transferring a pattern onto a semiconductor wafer for the writing of data by ion implantation to the mask ROM of FIG. 57(a), FIG. 58(b) is a plan view of a principal portion of the semiconductor wafer, showing a position of the pattern which is transferred using the photomask of FIG. 58(a), and FIG. 58(c) is a sectional view of the semiconductor wafer, showing in what state data are written in FIG. 58(a);

FIG. 60(a) is a diagrammatic plan view of a principal portion of a photomask according to a still further embodiment of the present invention, which photomask is used at the time of transferring a pattern onto a semiconductor wafer for the writing of data by ion implantation to the mask ROM of FIG. 57, FIG. 60(b) is a plan view of a principal portion of the semiconductor wafer, showing a position of the pattern which is transferred using the photomask, and FIG. 60(c) is a sectional view of the semiconductor wafer, showing in what state data is written in FIG. 60(a);

FIG. 61(a) is a plan view of a principal portion of another ROM, FIG. 61(b) is an equivalent circuit diagram of FIG. 61(a), and FIG. 61(c) is a sectional view taken on line A—A in FIG. 61(a);

FIGS. 63(a) and 63(b) are sectional views of a principal portion of the semiconductor wafer illustrating how to form the contact holes shown in FIG. 62;

FIG. 64(a) is a diagrammatic plan view of a principal portion of a photomask according to a still further embodiment of the present invention, which photomask is used at the time of transferring contact hole patterns onto the semiconductor wafer for the writing of data to the mask ROM of FIG. 61, FIG. 64(b) is a plan view of a principal portion of the semiconductor wafer, showing positions of the patterns which are transferred using the photomask of FIG. 64(a), FIG. 64(c) is an equivalent circuit diagram of FIG. 64(b), and FIG. 64(d) is a sectional view taken on line A—A in FIG. 64(b);

Figure 65:
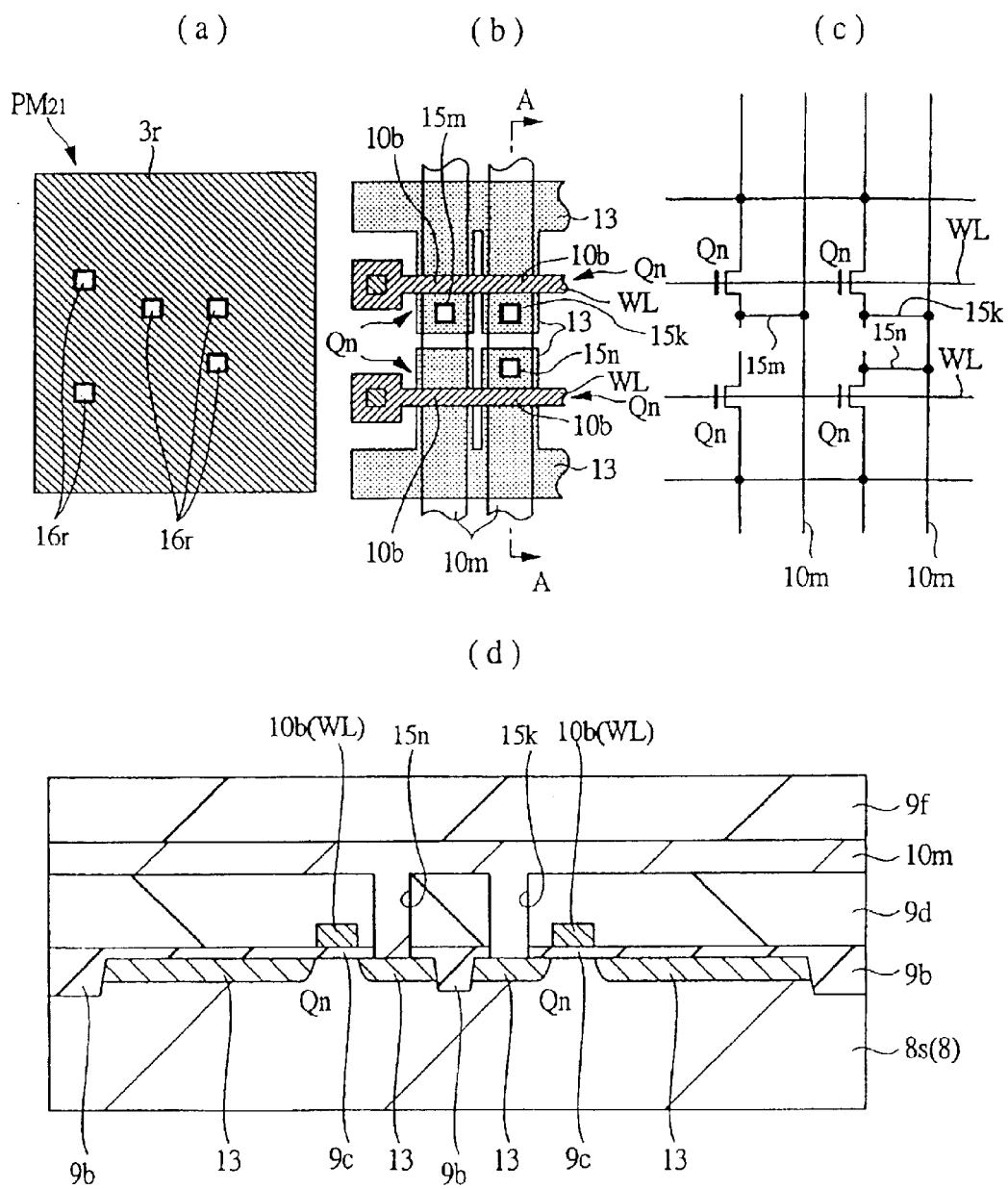
FIG. 65(a) is a diagrammatic plan view of a principal portion of a photomask according to a still further embodiment of the present invention, which photomask is used at the time of transferring contact hole patterns onto a semiconductor wafer for the writing of data to the mask ROM: of FIG. 61.
FIG. 65(b) is a plan view of a principal portion of the semiconductor wafer, showing positions of the patterns which are transferred using the photomask of FIG.
Figure 67:
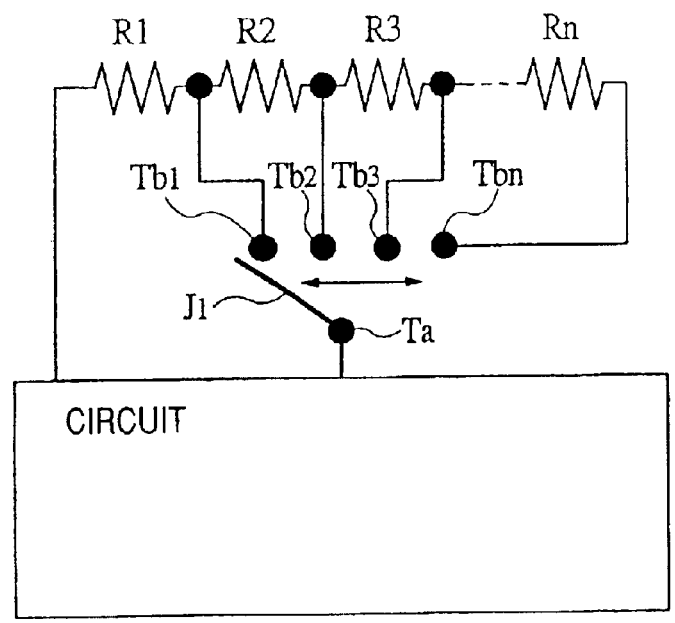
Figure 68:
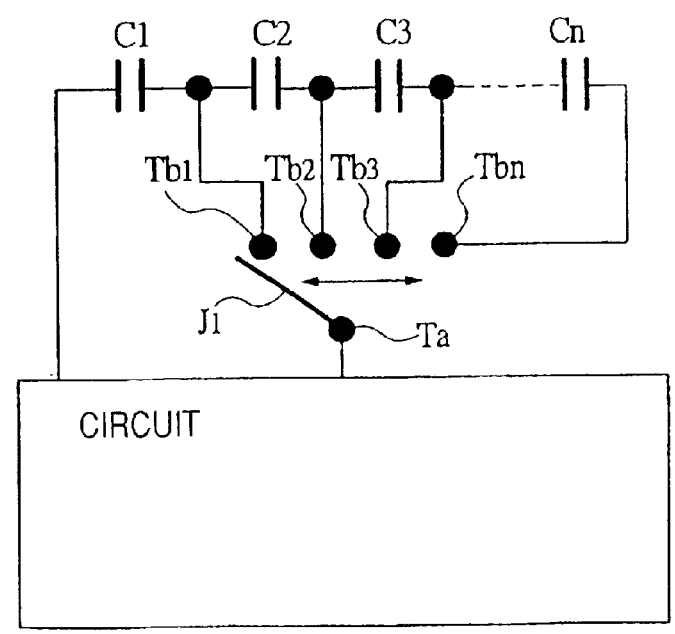
Figure 71:
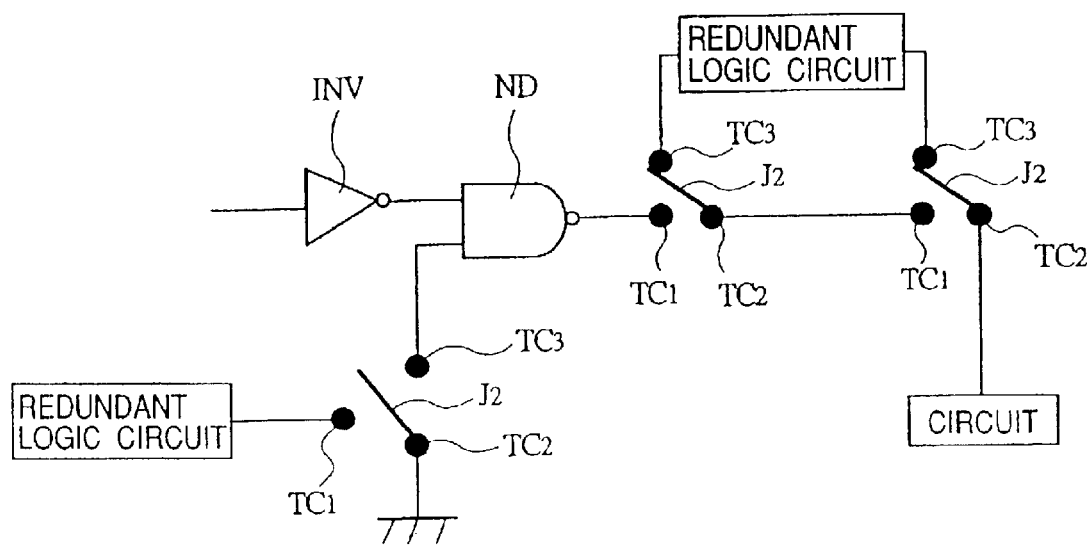
Figure 72:
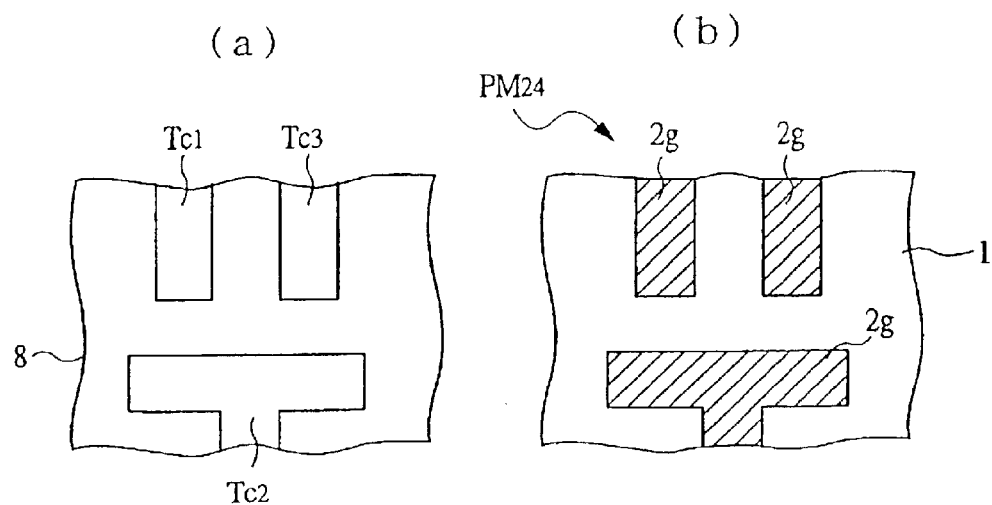
Figure 73:
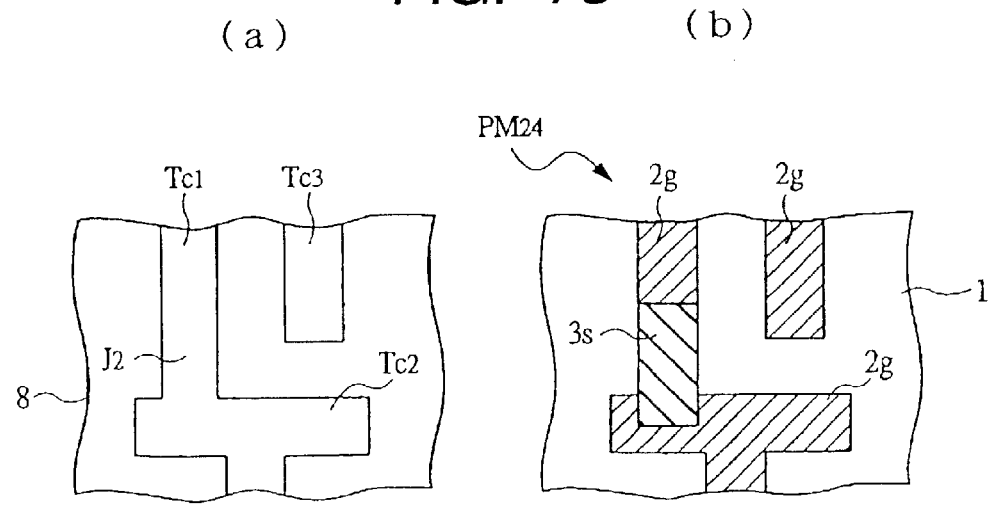
Figure 75:
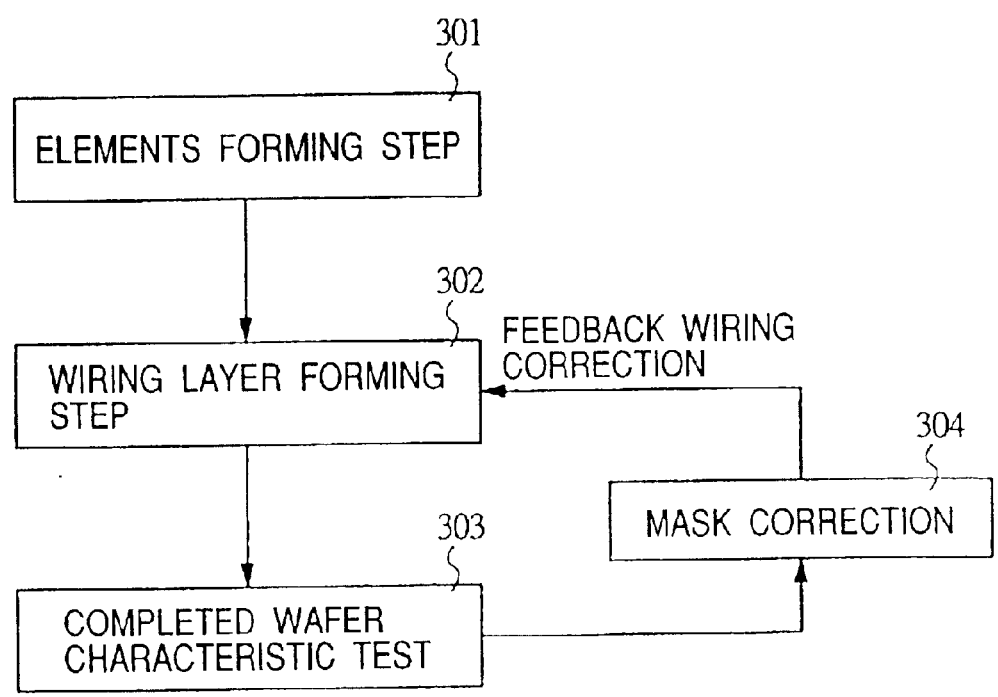
Figure 76:
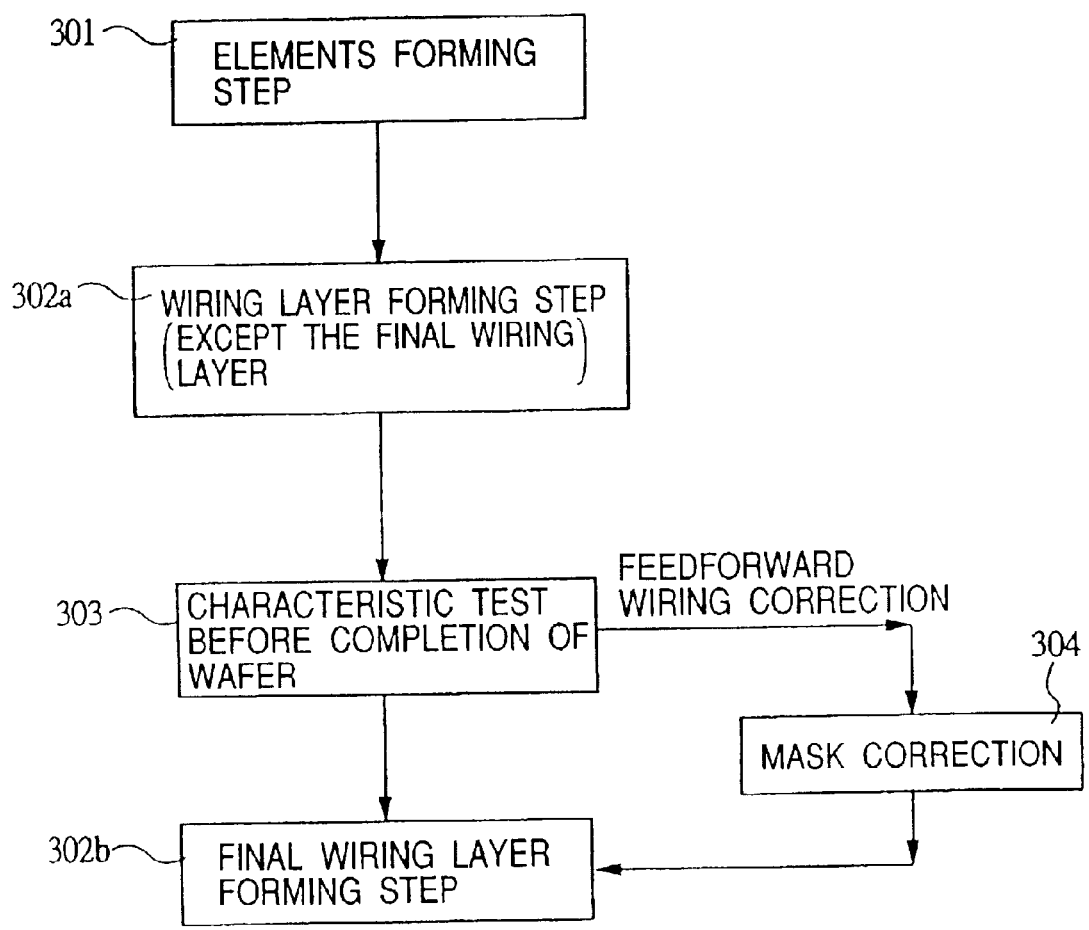
Figure 77:
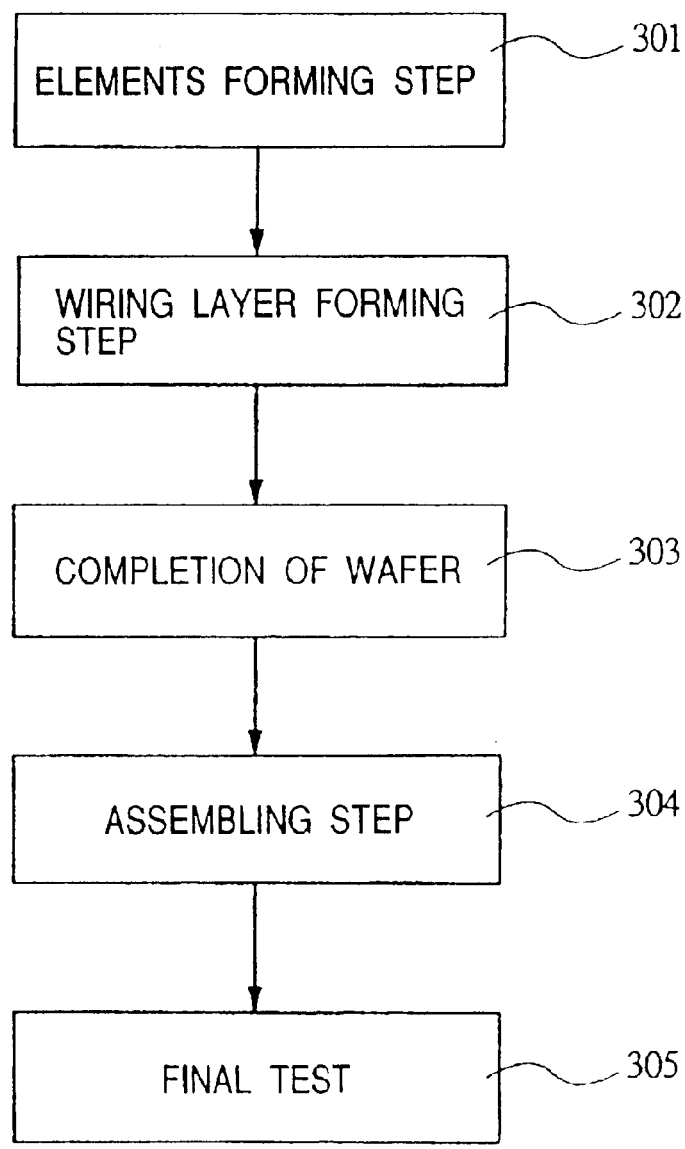
Figure 78:
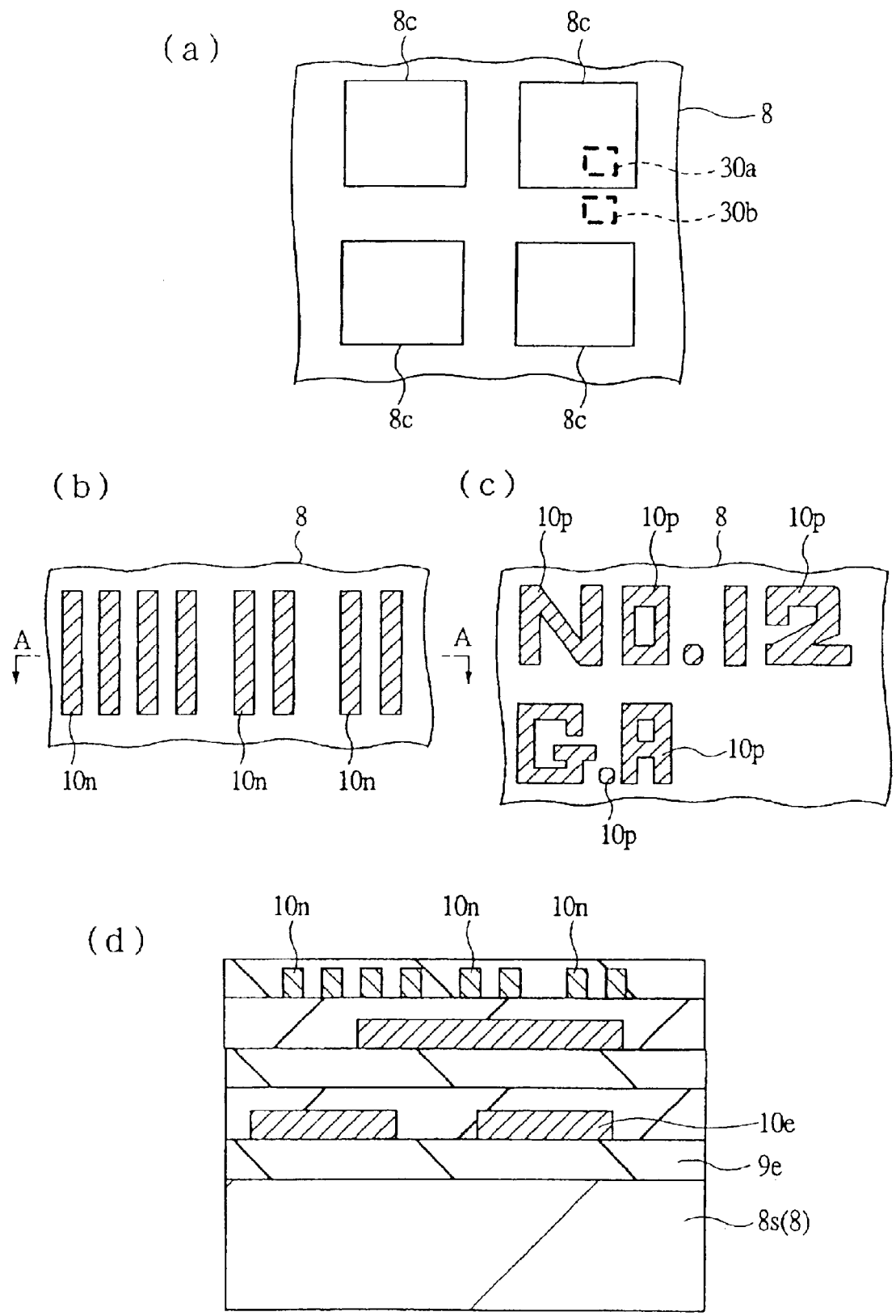

65(*a*), FIG. 65(*c*) is an equivalent circuit diagram of FIG. 65(*b*), and FIG. 65(*d*) is a sectional view taken on line A—A in FIG. 65(*b*);

FIG. 66(*a*) is a diagrammatic plan view of a principal portion of a mask ROM according to a still further embodiment of the present invention, FIG. 66(*b*) is an equivalent circuit diagram of FIG. 66(*a*), and FIG. 66(*c*) is a sectional view taken on line A—A in FIG. 66(*a*);

FIG. 67 is a circuit diagram illustrating how to adjust a characteristic of a semiconductor integrated circuit device according to a still further embodiment of the present invention;

FIG. 68 is a circuit diagram illustrating how to adjust a characteristic of a semiconductor integrated circuit device according to a stilt further embodiment of the present invention;

FIG. 69(*a*) is a schematic diagram showing patterns of terminals on a semiconductor wafer, which terminals are illustrated in FIG. 67 or FIG. 68, and FIG. 69(*b*) is a plan view of a principal portion of a photomask which is used for transfer of the patterns shown in FIG. 69(*a*);

FIG. 70(*a*) is a schematic diagram showing patterns of terminals on a semiconductor wafer, which terminals are illustrated in FIGS. 67 or FIG. 68, and FIG. 70(*b*) is a plan view of a principal portion of a photomask which is used for transfer of the patterns shown in FIG. 70(*a*);

FIG. 71 is a circuit diagram which illustrates a redundant structure of a semiconductor integrated circuit device according to a still further embodiment of the present invention;

FIG. 72(*a*) is a schematic diagram showing patterns of terminals on a semiconductor wafer, which terminals are illustrated in FIG. 71, and FIG. 72(*b*) is a plan view of a principal portion of a photomask used for transfer of the patterns shown in FIG. 72(*a*);

FIG. 73(*a*) is a schematic diagram of patterns of terminals on a semiconductor wafer, which terminals are illustrated in FIG. 71, and FIG. 73(*b*) is a plan view of a principal portion of a photomask used for transfer of the patterns shown in FIG. 73(*a*);

FIGS. 74(*a*) and 74(*c*) are flow diagrams showing an example of a series of process flows in connection with a photomask which is used in a manufacturing process for a semiconductor Integrated circuit device according to a still further embodiment of the present invention;

FIG. 75 is a flow diagram showing a manufacturing process for a semiconductor integrated device circuit according to a still further embodiment of the present invention;

FIG. 76 is a flow diagram showing a manufacturing process for a semiconductor integrated circuit device according to a still further embodiment of the present invention;

FIG. 77 Is a flow diagram showing a manufacturing process for a semiconductor integrated circuit device according to a still further embodiment of the present invention;

FIG. 78(*a*) is a diagrammatic plan view of a principal portion of a semiconductor wafer in a manufacturing process for a semiconductor integrated circuit device according to a still further embodiment of the present invention, FIGS. 78(*b*) and 78(*c*) are plan views of principal portions of the semiconductor wafer, showing description examples of information transferred onto the semiconductor wafer, and FIG. 78(*d*) is a sectional view taken on line A—A in FIG. 78(*b*); and FIGS. 79(*a*) and 79(*b*) are plan views of principal portions of photomasks according to still further embodiments of the present invention, which photomasks were used for transfer of the information shown in FIG. 78(*b*).

BEST MODE FOR CARRYING OUT THE INVENTION

The meanings of terms as used herein will be described below before describing the present invention in detail.

1. Mask (Optical Mask)

A substrate with a light shielding pattern and a light phase changing pattern formed thereon. A reticle formed with a pattern several times as large as the actual size Is also included. The expression "on the substrate" is meant to include an upper surface of the substrate, as well as an interior or overlying region close to the substrate upper surface, (including an arrangement on another substrate close to the substrate upper surface). The expression "a first main surface of the mask" is meant to identify a surface where the aforesaid light shielding pattern and light phase changing pattern are formed, and the expression "a second main surface of the mask" is meant to identify a surface located on the side opposite to the first main surface. The expression "an ordinary mask (binary mask)" refers to a conventional mask with a mask pattern formed on a substrate, the mask pattern comprising a light shielding pattern and a light transmitting pattern.

2. A pattern surface of the mask is classified into the following regions: an "integrated circuit pattern region" in which integrated circuit patterns to be transferred are arranged, a "pellicle cover region" as a region: covered with a pellicle, an "integrated circuit pattern peripheral region" as a pellicle cover region other than the integrated circuit pattern region, a "peripheral region" as an outside region not covered with a pellicle, a "peripheral inside region" as an inside region in the peripheral region where an optical pattern is formed, and a "peripheral outside region" as the other peripheral portion used for a vacuum chuck, for example.

3. In connection with the mask shield material, by the term "metal" is meant chromium, chromium oxide, another metal, or a compound thereof, more widely, a simple substance, Including a metal element, a compound, and a composite, having a light shielding action.

4. By the terms "light shielding region," "light shielding film," and "light shielding pattern" is meant one having an optical characteristic which permits less than 40%, usually several % to less than 30%, of exposure light radiated to the region concerned to pass therethrough. On the other hand, by the terms "transparent," "transparent film," "light transmitting region," and "light transmitting pattern," is meant one having an optical characteristic which permits not less than 60%, usually not less than 90%, of exposure light radiated to the region concerned to pass therethrough. The term "light shielding portion" is used as a generic concept of a light shielding region, light shielding film, and light shielding pattern, which are formed of metal or a resist film.

5. Halftone Mask

A kind of a phase shift mask, having a halftone shifter wherein the transmittance of a halftone film serving as both shifter and light shielding film is not less than 1% and is less than 40%, and wherein a phase shift quantity compared with a halftone film-free portion inverts the phase of light.

6. Levenson Type Phase Shift Mask (an alternating phase shift mask)

A kind of a phase shift mask which causes the phases of adjacent openings spaced by a light shielding region to be mutually inverted with the intention of obtaining a clear image by the resulting interfering action.

7. Regular Illumination

Indicates a non-modified illumination having a relatively uniform light intensity distribution.

8. Modified Illumination

Indicates an illumination wherein the illuminance of a central portion is lowered, including oblique illumination, zone illumination, multi-pole illumination, such as quadrupole illumination and pentapole illumination, as well as an equivalent super-resolution technique using a pupil filter.

9. Resolution

Pattern size can be expressed by standardization using the NA (Numerical Aperture) of a projection lens and the wavelength λ of exposure light. In case of using a different wavelength and a different NA, a conversion may be made because the resolution R is represented by the equation R=K1·λ/NA, provided the focal depth D is different, because it is also expressed by D=K2·λ/(NA)$^2$.

10. In the semiconductor field, ultraviolet rays are classified as follows. Rays shorter than about 400 nm and not shorter than about 50 nm in wavelength are ultraviolet rays, rays not shorter than 300 nm are near ultraviolet rays, rays not shorter than 200 nm are far ultraviolet rays, and rays shorter than 200 nm are vacuum ultraviolet rays. Main embodiments of the present invention will refer mainly to the vacuum ultraviolet region that is shorter than 200 nm in wavelength, but it goes without saying that the present invention is also applicable to the far ultraviolet region using a KrF excimer laser providing rays shorter than 250 nm and not shorter than 200 nm, if such modifications are made as will be described in connection with the following embodiments. Further, the principle of the present invention is applicable even to a short wavelength region of ultraviolet rays shorter than 100 nm and not shorter than 50 nm in wavelength.

11. Scanning Exposure

An exposure method wherein a fine slit-like exposure band is moved (scanned) continuously and relatively in a direction perpendicular to the longitudinal direction of the slit (an oblique movement will do) with respect to both the semiconductor wafer and the photomask (or reticle, since the term "photomask" as referred to herein is meant to include a wide concept including a reticle), thereby transferring the circuit pattern on the photomask onto a desired portion of the semiconductor wafer.

12. Step-and-Scan Exposure

A combined method of the above scanning exposure and stepping exposure to expose the whole of the to-be-exposed portion on the wafer to light, corresponding to a more specific concept of the scanning exposure.

13. The term "semiconductor integrated circuit wafer (semiconductor integrated circuit substrate)" or "wafer (semiconductor substrate)" is meant to include a silicon single crystal substrate (generally flat and circular), sapphire substrate, glass substrate, another insulating or semi-insulating substrate, a semiconductor substrate, or a composite substrate thereof.

14. The term "device surface" is meant to identify a main surface of a wafer on which are formed device patterns corresponding to plural chip regions by photolithography.

15. Masking Layer

Generally indicates a resist film, but an inorganic mask and a non-photosensitive organic mask are also included.

16. Transfer Pattern

A pattern transferred onto a wafer through the mask, indicating, more specifically, the foregoing photoresist pattern and a pattern on a wafer formed actually using the photoresist pattern as a mask.

17. Resist Pattern

Indicates a film pattern obtained using patterning a photosensitive organic film by the photolithography technique. In this pattern is included a mere resist film free from any opening in the portion concerned.

18. Hole Pattern

A fine pattern, such as a contact hole or through hole pattern, having a two-dimensional size equal to or smaller than the wavelength of exposure light on a wafer. On the mask, the hole pattern generally assumes a square shape or a rectangular or octagonal shape close to the square shape, but on wafer the hole pattern assumes a circular shape in many cases.

19. Line Pattern

A band-like pattern extending in a predetermined direction.

20. Custom Circuit Pattern

A pattern which constitutes a circuit whose design is changed in accordance with a customer's request, such as, for example, a custom I/O circuit or a custom logic circuit.

21. Redundant Circuit Pattern

A pattern which constitutes a circuit for replacing a spare circuit formed on an integrated circuit with a defective pattern.

In the following embodiments, if necessary for convenience' sake, a division of the subsequent matter will be made into plural sections or embodiments, but unless otherwise specified, they are not unrelated to one another, but are in such a relation that one is a modification or a detailed or supplemental explanation of part or the whole of the others.

In the following embodiments, when reference is made to the number of elements (including the number of pieces, numerical values, amount, and range), no limitation is made to such a specific number and both a number larger than and a number smaller than the specific number will do unless otherwise specified, and except in the case where a limitation is made to the specific number, basically or obviously.

Moreover, it goes without saying that in the following embodiments, the components (including component steps) are not always essential unless otherwise specified, and except in the case where they are considered essential, basically or obviously.

Likewise, in the following embodiments, when reference is made to the shape and positional relation of components, those substantially similar or closely similar to such shape and positional relation are also included unless otherwise specified, and except in the case where they are considered different, basically or obviously. This is also the case with the foregoing numerical value and range.

The term "semiconductor integrated circuit device" as referred to herein is meant to include not only one fabricated on a semiconductor or insulator substrate such as silicon or sapphire wafer, but also one fabricated on another insulating substrate, such as TFT (Thin-Film-Transistor) and STN (Super-Twisted-Nematic) liquid crystal.

In all of the drawings, portions having the same functions are identified by like reference numerals and repeated explanations thereof will be omitted.

In the drawings, even in a plan view, a light shielding pattern or a phase shift pattern may be hatched in order to make the drawing easier to understand.

Further, in the following embodiments, MIS-FET (Metal Insulator Semiconductor Field Effect Transistor), p-channel type MIS-FET, and n-channel type MIS-FET, will be abbreviated as MIS, pMIS, and nMIS, respectively.

Embodiments of the present invention will be described in detail hereinunder with reference to the accompanying drawings.

(First Embodiment)

FIG. 1(a) is a plan view of a photomask according to an embodiment of the present invention, and FIG. 1(b) is a sectional view taken on line A—A in FIG. 1(a) with the photomask attached to a predetermined apparatus.

The mask of this embodiment, indicated at PM1, is a reticle for focusing and transferring an original of integrated circuit patterns, sizing one to ten times the actual size, for example, onto a wafer through a reducing projection optical system. The illustrated mask is used in the case where a peripheral portion of a semiconductor chip serves as a light shielding portion and where line patterns are formed using a positive type resist film on a wafer.

A mask substrate 1 of the mask PM 1 is formed, for example, by a transparent, synthetic quartz glass plate having a square shape, as seen in plan view, and having a thickness of about 6 mm. Centrally of a main surface of the mask substrate 1 there is formed a light transmitting opening region having a rectangular shape, as seen in plan view, to which is exposed the main surface of the mask substrate 1. This light transmitting opening region forms the foregoing integrated circuit pattern region. On the main surface of the mask substrate 1 in this light transmitting opening region there are arranged light shielding patterns 2a and 3a for transferring the integrated circuit patterns onto a wafer. In the illustrated example, the light shielding patterns 2a and 3a are transferred as line patterns on the wafer.

In this embodiment, the light shielding patterns 2a are formed of metal like an ordinary mask, while the light shielding patterns 3a, lying in a limited region RE (the region indicated with a broken line) within the integrated circuit pattern region, are formed of resist film. Therefore, as will be described later, the light shielding patterns 3a present in the region RE (the region indicated with a broken line) can be removed in a relatively simple manner. Then, new light shielding patterns 3a can be formed easily and in a short time. The resist film which forms the light shielding patterns 3a possesses the property of absorbing exposure light, such as, for example, a KrF excimer laser beam (wavelength: 248 nm), ArF exciter laser beam (wavelength: 193 nm), or $F_2$ laser beam (wavelength: 157 nm), and it has a light shielding function almost equal to that of the light shielding patterns 2a formed of metal. As to the structure of the resist film, including the material thereof, these features will be described later. As to the technique of forming light shielding patterns by a resist film, a description thereof is found in Japanese Patent Application No. Hei 11(1999)-185221 (filed Jun. 30, 1999) relating to an invention made by the present inventors.

On the main surface of the mask substrate 1, an outer periphery of the integrated circuit pattern region is covered with a light shielding pattern 2b. The light shielding pattern 2b is formed in a frame shape, as seen in plan view, so as to span the region between the outer periphery of the integrated circuit pattern region and that of the mask substrate 1. For example, the light shielding pattern 2b is formed of the same metal as that of the light shielding patterns 2a and in the same pattern forming step as that of the patterns 2a. The light shielding patterns 2a and 2b are formed, for example, by chromium or chromium oxide deposited on chromium, provided the material of the light shielding patterns 2a and 2b is not limited thereto and various other materials may be employed. For example, there may be used a refractory metal, such as tungsten, molybdenum, tantalum, or titanium, or a nitride, such as tungsten nitride, or a refractory metal silicide (compound) such as tungsten suicide (WSix) or molybdenum suicide (MoSix), or a laminate film thereof. In the case of the mask PM1 according to this embodiment, there sometimes is a case where, after removal of the light shielding patterns 3a formed of resist film, the mask substrate 1 is washed and is used again. Therefore, it is preferable that the light shielding patterns 2a and 2b be formed using a material superior in peeling resistance and abrasion resistance. Such a refractory metal as tungsten is superior in all of the areas of oxidation resistance, abrasion resistance and peeling resistance, and it is therefore preferable as the material of the light shielding patterns 2a and 2b.

A generally octagonal framed region formed on the light shielding pattern 2b represents the foregoing pellicle cover region. That is, in the figure being considered there is illustrated a case where a pellicle PE is bonded to the main surface side of the mask substrate 1 of the mask PM1 through a pellicle affixing frame PEf. The pellicle PE is a constituent having a transparent protective film and is spaced a predetermined distance from the main surface, or both the main surface and the back side, of the mask substrate 1 for preventing the adhesion of dust particles to the mask PM1. The predetermined distance is designed taking dust particles deposited on the surface of the protective film and the transferability thereof onto the wafer into account.

A base portion of the pellicle affixing frame PEf is bonded and fixed in direct contact with the light shielding pattern 2b of the mask PM1, whereby the pellicle affixing frame PEf can be prevented from peeling off. If a resist film is formed at the mounted position of the pellicle affixing frame PEf, the resist film will peel off at the time of mounting or removing the pellicle PE and cause the generation of dust particles. The generation of dust particles can be prevented by bonding the pellicle affixing frame PEf in direct contact with the light shielding pattern 2b.

In the pellicle cover region, the region exclusive of the integrated circuit pattern region represents the integrated circuit pattern peripheral region, in which there are formed mark patterns 4a for detecting information on the mask PM1. The mark patterns 4a provided are for detecting position information on the mask PM1 directly from the same mask at the time of plotting a predetermined pattern on the mask with use of an electron beam plotter. More specifically, at the time of plotting a predetermined integrated circuit pattern in the integrated circuit pattern region of the mask PM1 with use of an electron beam plotter, the mark patterns 4a of the mask PM1 are read at a rate of once per several seconds and the plotting of a pattern is carried out, while correcting (adjusting) the position to which a pattern plotting electron beam is to be radiated. As a result, it becomes possible to improve the accuracy of the pattern plotting position by the electron beam plotter. Such mark patterns 4a are provided for the following reason, for example.

Figure 2:
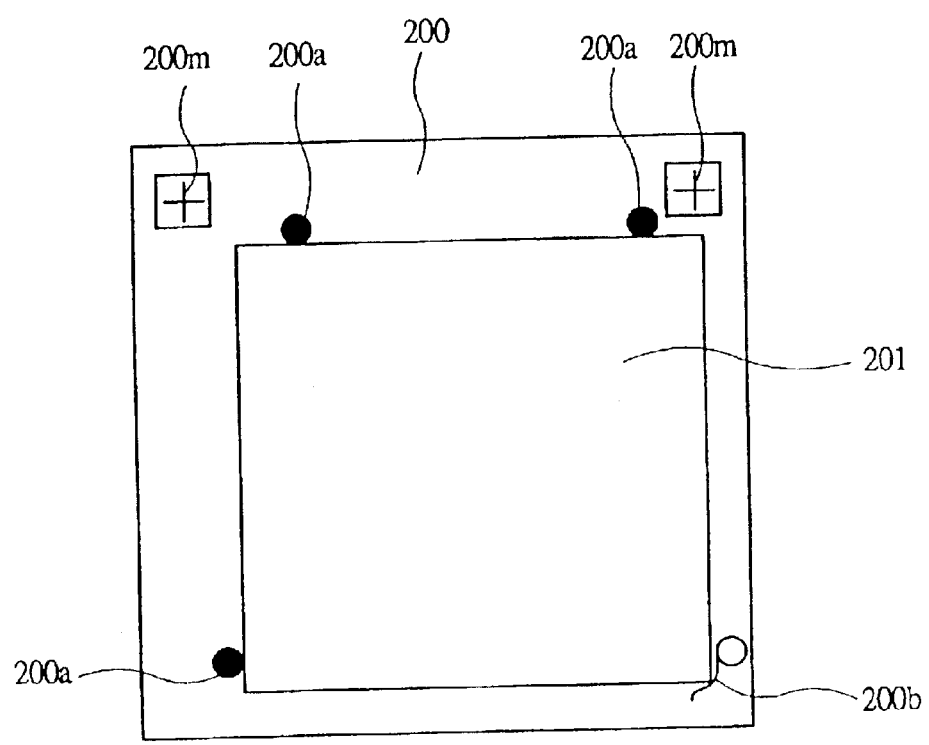
FIG. 2 is a schematic diagram showing a photomask holding means at the time of plotting a predetermined pattern onto the photomask.

In the conventional electron beam plotter, the plotting process for the mask is carried out in a vacuum. The mask is held in a vacuum in the following manner. As schematically shown in FIG. 2, the mask PM1, or a cassette 201 with the mask PM1 loaded thereon, is pushed against three-point pins 200a provided in a mask holder 200, the mask holder 200 being mounted on a moving stage of the electron beam potter, and it is then fixed mechanically with a push pin 200b. In the conventional electron beam plotter, position detecting mark patterns 200m are detected plural times during plotting to correct any positional deviation, the mark patterns 200m being attached to the mask holder 200 for the purpose of preventing a deviation of the pattern plotting position caused by a positional drift of the electron beam during plotting. Since the PM1 on the mask holder 200 (stage) is fixed mechanically, as mentioned above, the relative positional relation between the mark patterns 200*m* in the mask holder 200 and the mask PM1 ought to be constant Actually, however, there may occur a slight positional deviation between the mark patterns 200*m* and the mask PM1 due to a shock applied to the stage, which is moving at high speed. Consequently, a positional deviation of the plotted pattern occurs despite the position of the mask PM1 being read from the mark patterns 200*m* in the electron beam plotting step. To avoid such an inconvenience, position correcting mark patterns 4*a* are arranged on the mask PM1 itself to detect the position of the mask PM1 directly from the mask itself. By so doing, not only the positional deviation of the plotted pattern, but also a deviation in the retention of the mask PM1 can be corrected, so that it is possible to diminish a pattern arrangement error The mark patterns 4*a* are each constituted on the basis of whether the pattern position concerned lies in the light transmitting region or in the light shielding region, and information is detected from the state of reflection of a position detecting beam or light radiated there. As position detecting means, one may use one which uses an electron beam from the electron beam plotter, one which uses a laser beam from a laser writer, or any other suitable means. Particularly, the use of position detecting means superior in position accuracy is desirable. The mark patterns 4*a* may be formed at the time of forming a common light shielding pattern in the mask production or at the time of fabricating mask blanks.

The outside of the pellicle cover region in FIG. 1 represents a peripheral region, in which are formed mark patterns 4*b* for detecting information on the mask PM1. The mark patterns 4*b* are used, for example, as alignment marks or as calibration marks used in mask production. The alignment marks are used for detecting the position of the photomask PM1 when the mask is attached to a predetermined position in an inspection system or an exposure system, thereby making alignment between the mask PM1 and the inspection system or exposure system. The calibration marks are used for detecting the non-registration of a pattern and also for detecting the shape of a pattern and pattern transfer accuracy.

The mark patterns 4*b* are formed of light transmitting patterns. More specifically, the mark patterns 4*b* are formed by removing portions of the light shielding pattern 2*b*, thereby allowing portions of the underlying transparent mask substrate 1 to be exposed. Therefore, even in a case of using a conventional exposure system, which uses a halogen lamp or the like for detecting the position of the mask PM1, it is possible to obtain a sufficient contrast of light having passed through each mark pattern 4*b*, whereby the recognition ability of the mark patterns 4*b* can be improved. Consequently, a relative alignment between the mask PM1 and the exposure system can be done easily and with high accuracy. According to the results of studies made by the present inventors, it has become possible to effect an alignment equal to that in the use of a conventional mask.

The mark patterns 4*a* and 4*b* are not transferred onto the wafer.

In this embodiment, a resist film for pattern formation is not formed in the peripheral region. If such a resist film is formed in the peripheral region, the resist film may be peeled off or chipped, generating dust particles, due to a mechanical shock induced when the mask PM1 is loaded onto an inspection system or an exposure system. According to this embodiment, however, since no resist film is present in the peripheral region, it is possible to prevent peeling and chipping of the resist film. In actual practice, it was possible to prevent the occurrence of such an inconvenience as the generation of dust particles caused by peeling of the resist film.

The mask PM1 is installed in the inspection system or exposure system in a directly contacted state of loading portions 5 of the system with the light shielding pattern 2*b* of the mask. Regions 5A indicated with thick frames in FIG. 1(*a*) represent regions with which the loading portions 5 come into contact. Thus, even when the mask PM1 is loaded onto the inspection system or exposure system, the generation of dust particles caused by peeling or chipping of the resist film is prevented, because no resist film is formed on the light shielding pattern 2*b*. The generation of dust particles caused by peeling or chipping of metal is also prevented because the metal which constitutes the light shielding pattern 2*b* is hard. The illustrated loading portions 5 are each provided with a vacuum chuck mechanism.

Next, an example for a method for manufacturing the mask PM1 shown in FIG. 1 will be described with reference to FIGS. 3(*a*) to 4.

Figure 3:
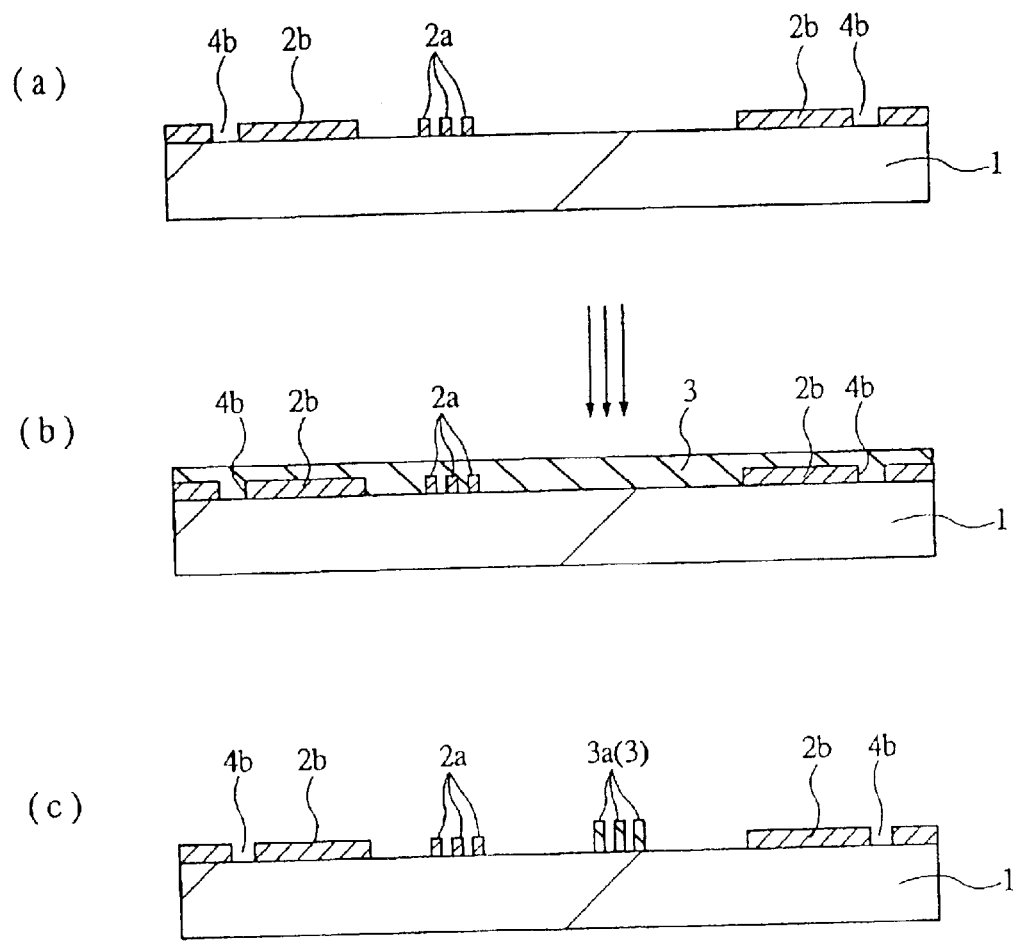
FIGS. 3(a) to 3(c) are sectional views of the photomask of FIG. 1 in a manufacturing process for the photomask.

First, as shown in FIG. 3(*a*), there is provided a mask substrate 1 formed, for example, of a transparent quartz substrate having a thickness of about 6 mm. In this stage, light shielding patterns 2*a* and 2*b* have already been formed on a main surface of the mask substrate 1 by the same method as used to form the conventional mask. That is, the light shielding patterns 2*a* and 2*b* are formed by depositing a metal film superior in light shieldability on the main surface of the mask substrate 1 by sputtering, for example, and subsequently patterning the metal film by a photolithography technique and etching technique. As a resist film used as an etching mask in forming the light shielding patterns 2*a* and 2*b*, a positive type resist film is used. This is because the area of plotting with an electron beam, for example, can be reduced and the plotting time can be shortened. After the patterning for the formation of light shielding patterns 2*a* and 2*b*, the positive type resist film is removed.

Subsequently, as shown in FIG. 3(*b*), a resist film 3 which possesses the property of absorbing exposure light, such as a KrF excimer laser beam, ArF excimer laser beam, or $F_2$ laser beam, is applied to the whole of the main surface of the mask substrate 1 by a spin coating method, for; example. The resist film 3 is sensitive to an electron beam. In this embodiment, a novolak resist film was formed at a thickness of 150 nm, for example.

Next, after alignment using alignment marks, light shielding patterns 3*a* were formed of the resist film 3 with use of the same electron beam plotting method as the desired pattern forming method used in the conventional mask fabricating process, as shown in FIG. 3(*c*). In this case there was adopted a measure against electric charging of the electron beam. Moreover, since the peripheral portion of the mask PM1 serves as a portion of contact with a projection exposure system, consideration was given so that the resist film 3 was removed, thereby preventing the generation of dust particles caused by a mechanical shock and resultant peeling or chipping of the resist film 3.

The resist film 3 that is used contains as a principal component, for example, a copolymer of α-methylstyrene and α-chloroacrylic acid, novolak resin and quinone diazide, novolak resin and polymethylpentene-1-sulfone, or chloromethylated polystyrene. For example, one may use a chemically amplified resist comprising such a phenolic resin as polyvinyl phenol resin or a novolak resin and an inhibitor and an add generator both incorporated in the resin. It is necessary that the material of the resist film 3 posses a light shielding characteristic against light emitted from a light source in the projection exposure system and be sensitive to light emitted from a light source in the pattern plotter, e.g., an electron beam or light having a wavelength of 230 nm or more. No limitation is made to the materials referred to above, but various other materials may be used. Also, as to the film thickness, no limitation is made to 150 nm, but various other film thicknesses may be adopted insofar as the conditions described above are satisfied.

Figure 4:
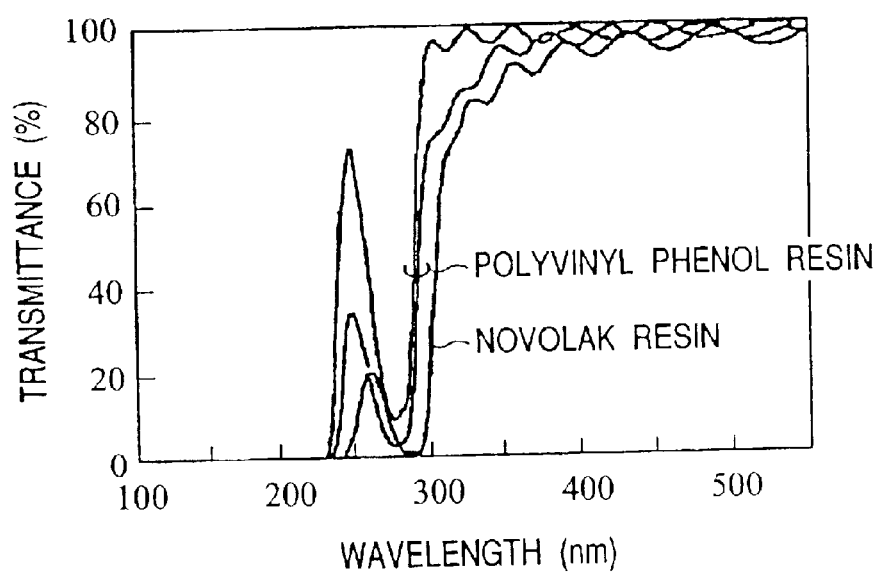
FIG. 4 is a graph showing the spectral transmittances of typical electron beam resist films.

Spectral transmittances of typical electron beam resist films are shown in FIG. 4. In the case where a polyphenol or novolak resin is formed into a film of about 100 nm in thickness, the transmittance is almost zero at wavelengths of 150 to 230 nm, for example. Such a film exhibits a satisfactory masking effect against, for example, ArF excimer laser beam having a wavelength of 193 nm and $F_2$ laser beam having a wavelength of 157 nm. Although description has here been directed to vacuum ultraviolet rays not longer than 200 nm in wavelength, no limitation is made thereto. For such a laser beam as a KrF excimer laser beam having a wavelength of 248 nm, it is necessary to use another mask material or add a light absorbing or shielding material to the resist film. After the light shielding patterns 3a have been formed of the resist film, it is also effective to apply a hardening process to the resist film, which process involves, for example, a heat treatment or a pre-radiation of a powerful ultraviolet light for the purpose of improving the resistance to the exposure light being radiated.

As an example, a negative type resist film was used as the resist film 3. This is because the mask PM1 can be fabricated in Q-TAT (Quick Turn Around Time). More particularly, if the resist film is allowed to remain outside the integrated circuit pattern region, the resist film will cause the generation of dust particles, as noted previously, so it is necessary to remove the outside resist film. Therefore, if a positive type resist film is used, the electron beam plotting must also cover most of the outer peripheral portion of the integrated circuit pattern region, which is time-consuming. In contrast therewith, if a negative type resist film is used, it suffices for the plotting to cover a region of a relatively small area in the main surface of the mask substrate 1, whereby it is possible to reduce the plotting area and shorten the plotting time.

Figure 6:
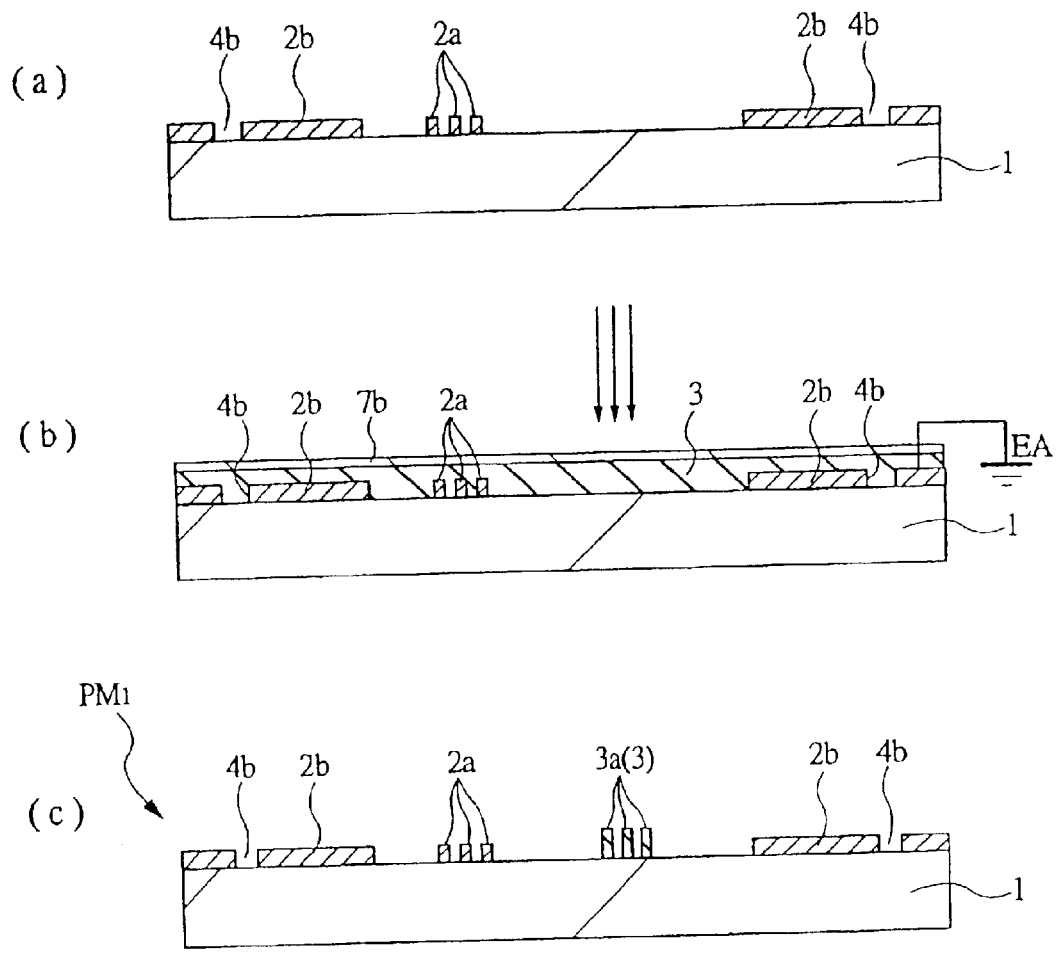
FIGS. 6(a) to 6(c) are sectional views showing another modified example of a manufacturing process for the photomask of FIG. 1.

Another example of a method of fabricating the mask PM1 of FIG. 1 will now be described with reference to FIGS. 5 and 6. In case of fabricating the above-mentioned conventional mask, if the metal film for forming light shielding patterns is connected to ground at the time of plotting the resist patterns for forming the light shielding patterns with use of an electron beam plotter or the like, electrons generated during electron beam plotting can be prevented from being charged electrically, so it is not necessary to perform any processing for the prevention of such electric charging. However, in fabricating the mask PM1 according to this embodiment and at the time of forming light shielding patters on the resist film 3 with use of an electron beam plotter, since both the mask substrate 1 and resist film 3 are insulators, radiated electrons have their escape cut off and are charged electrically, which may exert a bad influence on the formation of resist patterns (i.e., light shielding patterns 3a). For example, therefore, the mask PM1 is fabricated in the following manner.

First, as shown in FIG. 5(a), a transparent conductive film 7a is deposited on the main surface of the mask substrate 1. As the transparent conductive film 7a ITO (indium-tin-oxide) film may be used, for example. No processing is needed for the transparent conductive film 7a. Subsequently, light shielding patterns 2a and 2b are formed on the transparent conductive film 7a in the same way as in the fabrication of the conventional mask described above. Next, as shown in FIG. 5(b), the resist film 3 is applied onto the transparent conductive film 7a in the same manner as in the first embodiment. The conductive film 7a is electrically connected to earth EA. Thereafter, predetermined patterns (light shielding patterns 3a) are plotted on the resist film 3 by means of the electron beam plotter, as in the above example. In this case, electrons radiated to the mask substrate 1 can be allowed to escape to the earth EA through the transparent conductive film 7a, and, therefore, it becomes possible to suppress or prevent inconveniences caused by electric charging of electrons, such as deterioration in the shape and positional deviations of the resist patterns. Thereafter, the mask substrate is subjected to development and washing to fabricate the mask PM1 shown in FIG. 5(c).

The following modification may be made for the same purpose as discussed above. First, as shown in FIG. 6(a), there is provided a mask substrate 1 already formed with light shielding patterns 2a and 2b, followed by application of the resist film 3 onto the main surface of the mask substrate, as shown in FIG. 6(b). Subsequently, a water-soluble conductive organic film 7b is applied onto the resist film 3. As the water-soluble conductive organic film 7b, there was used espacer (a product of Showa Denko K. K.) or aquasave (a product of Mitsubishi Rayon Co., Ltd.), as an example. Thereafter, with the water-soluble conductive organic film 7b and the earth EA connected together electrically, an electron beam plotting process was performed for the pattern plotting described above. Then, the water-soluble conductive organic film 7b was also removed during development of the resist film 3. In this way, it was possible to prevent the electron beam from being electrically charged and to prevent the occurrence of such inconveniences as an abnormal pattern shape and a positional deviation of a pattern. The mask PM1 shown in FIG. 6(c) is thus fabricated.

In the mask PM1 thus fabricated, it is also effective to hold the pattern surface in an inert gas atmosphere, such as a nitrogen gas ($N_2$) atmosphere, for the purpose of preventing the oxidation of light shielding patterns 3a formed of resist film. The pattern plotting method for the resist film, which method is adopted for forming the light shielding patterns 3a, is not limited to the above-mentioned electron beam plotting method, but the plotting of patterns may be done using, for example, an ultraviolet ray having a wavelength of 230 nm or more (e.g., i-ray (wavelength: 365 nm)). The main point of the present invention resides in using the resist film directly as a mask (light shielding patterns) to provide a practical mask structure. Accordingly, other wavelengths to be shielded and other resist materials and mask substrate materials may be used.

Patterns were transferred onto a wafer 8, shown in FIG. 7(a) by means of a reducing projection exposure system using the mask PM1. FIG. 7(a) is a plan view of a principal portion of the wafer 8, and FIG. 7(b) is a sectional view taken on line A—A in FIG. 7(a). The wafer 8, which serves as a substrate to be projected, is formed of a silicon single crystal, for example, and has an insulating film 9a deposited on a main surface of the wafer. A conductor film 1a is deposited on the whole upper surface of the insulating film 9a. Further, an ordinary positive type resist film 11 a, that is sensitive to ArF, is deposited at a thickness of 300 nm or so on the conductor film 10a.

As an example, in the reducing projection exposure system, there were used an ArF excimer laser beam having a wavelength of 193 nm as projection light, a projection lens NA of 0.68, and a light source coherency a of 0.7. Alignment between the reducing projection exposure system and the mask PM1 was performed by detecting mark patterns 4b of the mask PM1. For the alignment, a helium-neon (He—Ne) laser beam having a wavelength of 633 nm was used, as an example. In this case, since it is possible to take a sufficient contrast of light that has passed through the mark patterns 4b, a relative alignment between the mask PM1 and the exposure system could be done easily and with high accuracy.

Thereafter, the integrated circuit pattern on the mask PM1 was projected onto the main surface of the wafer 8 by the conventional exposure method, followed by conventional heat treatment and development to form resist patterns 11a1, as shown in FIG. 8(a). FIG. 8(a) is a plan view of a principal portion of the wafer 8 and FIG. 8(b) is a sectional view taken on line A—A in FIG. 8(a). RE identifies a region onto which light shielding patterns 3a formed of resist film have been transferred. Thereafter, using the resist patterns 11a1 as an etching mask, the conductor film 10a was subjected to etching to form such conductor film patterns 10a1 as shown in FIG. 9(a). FIG. 9(a) is a plan view of a principal portion of the wafer 8, and FIG. 9(b) is a sectional view taken on line A—A in FIG. 9(a). As a result, there was obtained about the same pattern transfer characteristic as in the exposure using the conventional mask described above. For example, a 0.19 $\mu$m line and space could be formed at a focal depth of 0.4 $\mu$m.

Figure 10:
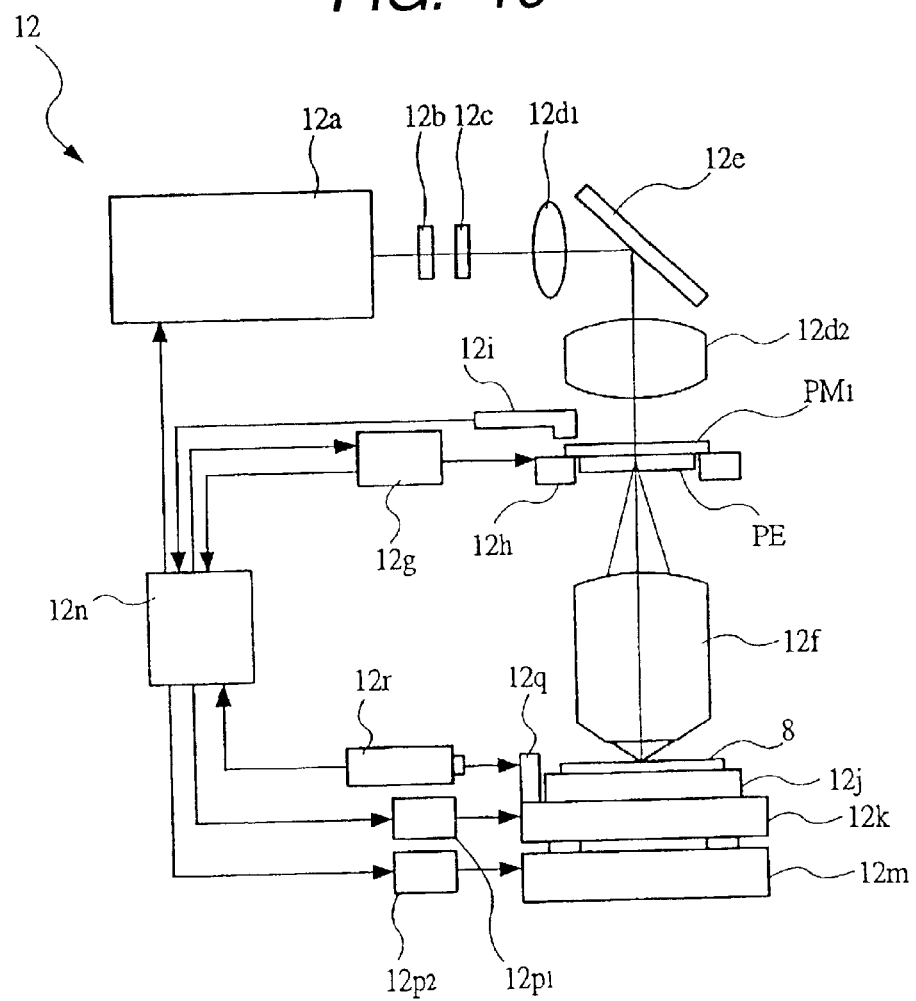
FIG. 10 is a schematic block diagram showing an example of a reducing projection exposure system of the type used in this embodiment.

An example of the reducing projection exposure system used in this exposure processing is shown in FIG. 10. Exposure light emitted from a light source 12a of a reducing projection exposure system 12 passes through a fly-eye lens 12b, an illumination shape adjusting aperture 12c, condenser lenses 12d1, 12d2, and a mirror 12e, and is radiated to the mask PM1. As the source of exposure light there is used, for example, a KrF excimer laser, ArF excimer laser, or $F_2$ laser. The mask PM1 is rested on the reducing projection exposure system 12 with its main surface facing downward (to the wafer :8 side), on which main surface are formed light shielding patterns 2a and 2b. Therefore, the exposure light is radiated to the back side of the mask PM1, whereby the mask pattern plotted on the mask PM1 is projected through a projection lens 12f onto the wafer 8, which is a sample substrate. As the case may be, the pellicle PE is provided on the main surface of the mask PM1. The mask PM1 is vacuum-chucked to the loading portions 5 of a mask stage 12h, which is controlled by a mask position control means 12g, and it is then aligned by a position detecting means 12i, whereby the alignment between the center thereof and an optical axis of the projection lens 12f is effected accurately.

The wafer 8 is vacuum-chucked onto a sample rest 12j. The sample rest 12j is placed on a Z stage 12k, which in turn is placed on an XY stage 12m, the Z stage 12k being movable in the optical axis direction of the projection lens 12f, i.e., in the Z axis direction. The Z stage 12k and the XY stage 12m are driven by drive means 12p1 and 12p2, respectively, in accordance with control instructions provided from a main control system 12n, and they are therefore movable to a desired exposure position. With a laser range finder 12r, that position is monitored accurately as the position of a mirror 12q which is fixed to the Z stage 12k. As the position detecting means 12i, there is used an ordinary halogen lamp, for example. That is, it is not necessary to use any special light source as the position detecting means 12i (it is not necessary to introduce a new technique or a difficult technique), but a conventional reducing projection exposure system may be used. Therefore, even with use of such a novel mask PM1, as in this embodiment, there is no fear of an increase of the product cost. The main control system 12n is electrically connected to a network system, making it possible to remotely monitor the state of the reducing projection system 12. It is optional whether the exposure method is to be, for example, a step and repeat exposure method or a step and scanning exposure method.

Next, with reference to FIGS. 11 to 14, the description of a case where the technical idea of the present invention is applied to the manufacturing process for a semiconductor integrated circuit device having a twin well type CMIS (Complimentary MIS) circuit will be presented.

Figure 11:
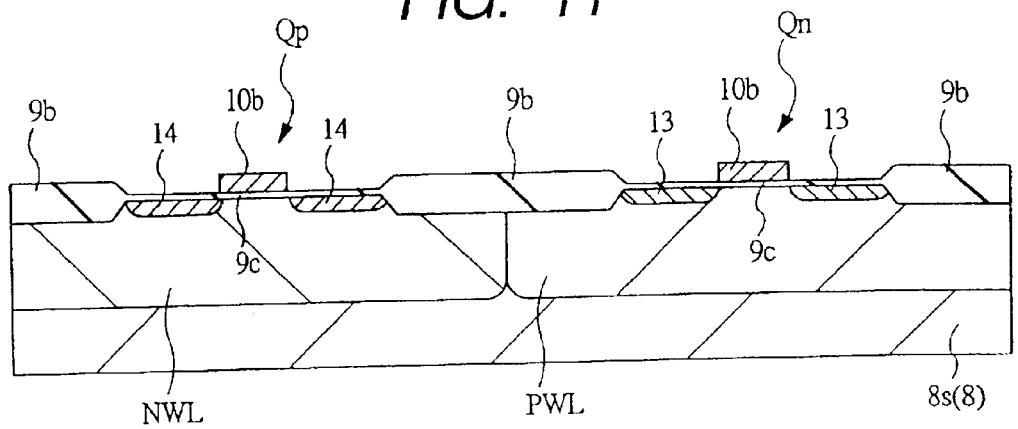
FIG. 11 is a sectional view of a principal portion of the semiconductor wafer in a step in the manufacture of a semiconductor integrated circuit device using the photomask of FIG. 1.

FIG. 11 is a sectional view of a principal portion of a wafer 8 in the manufacturing process. The wafer 8 is formed of a thin plate which is generally circular, as seen in plan view, for example. A semiconductor substrate 8s, which constitutes the wafer 8, is formed of an n-type Si single crystal, for example, and above the substrate 8s, there are formed an n well NWL and a p well PWL. For example, phosphorus (P) or arsenic (As) is introduced into the n well NWL, while boron is introduced into the p well PWL.

On a main surface of the semiconductor substrate 8s, there is formed a field Insulating film 9b for isolation, for example, a silicon oxide film, in accordance with a LOCOS (Local Oxidization of Silicon) method. The isolating portion may be formed as a trench. More specifically, the isolating portion may be formed by embedding an insulating film in a trench which is dug in the thickness direction of the semiconductor substrate 8s. Both nMIS Qn and pMIS Qp are formed in an active region surrounded by the field insulating film 9b.

Gate insulating films 9c of the nMIS Qn and pMIS Qp are constituted by silicon oxide films, for example, which are formed by a thermal oxidation method, for example. Gate electrodes 10b of the nMIIS Qn and pMIS Qp are formed on the main surface of the wafer 8 by depositing a gate forming conductor film in accordance with the CVD method, the conductor film being constituted by a low-resistance polysilicon, for example, and then by subjecting the conductor film to patterning by a photography technique using the reducing projection exposure system 12 and the photomask PM1 and the conventional etching technique. The gate length is, for example, 0.18 $\mu$m or so, though this value does not constitute any limitation.

A semiconductor region 13, which constitutes the source or drain of the nMIS Qn, is formed self-alignmentwise with respect to the associated gate electrode 10b by introducing, for example, phosphorus or arsenic into the semiconductor substrate 8s in accordance with the ion implantation method, for example, using the gate electrode 10b as a mask. Likewise, a semiconductor region 14, which constitutes the source or drain of the pMIS Qp, is formed self-alignmentwise with respect to the associated gate electrode 10b by introducing, for example, boron into the semiconductor substrate 8s in accordance with the ion implantation method, using the gate electrode 10b as a mask.

However, it is possible for the gate electrodes 10b to be each formed of a simplex film of a low-resistance polysilicon, for example. Various changes may the made. For example, a so-called polycide structure may be adopted wherein a silicide layer, such as a layer of tungsten silicide or cobalt silicide, is formed on a low-resistance polysilicon film, or a so-called polymetal structure may be adopted wherein a metal film, such as tungsten film, is formed on a low-resistance polysilicon film through a barrier conductor film, such as titanium nitride or tungsten nitride film.

Figure 12:
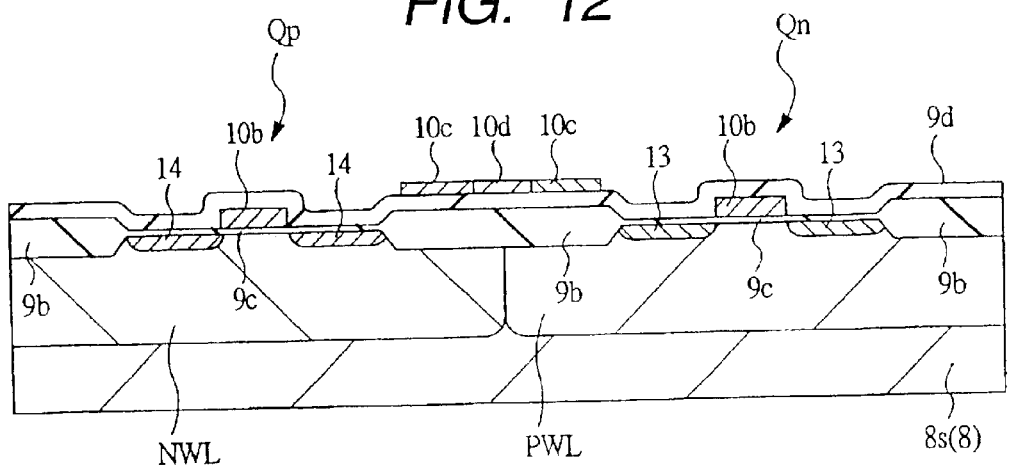
FIG. 12 is a sectional view of the principal portion of the wafer in a step which follows the step of FIG. 11.

First, as shown in FIG. 12, an interlayer insulating film 9d, e.g., silicon oxide film, is deposited on the semiconductor substrate 8s by CVD, for example, and then a polysilicon film is deposited thereon by CVD. Subsequently, the polysilicon film is subjected to patterning in accordance with the photolithography technique using the reducing projection exposure system 12 and the mask PM1 and the conventional etching technique, and thereafter an impurity is introduced into predetermined regions of the thus patterned polysilicon film to form wiring lines 10c and a resistor 10d.

Figure 13:
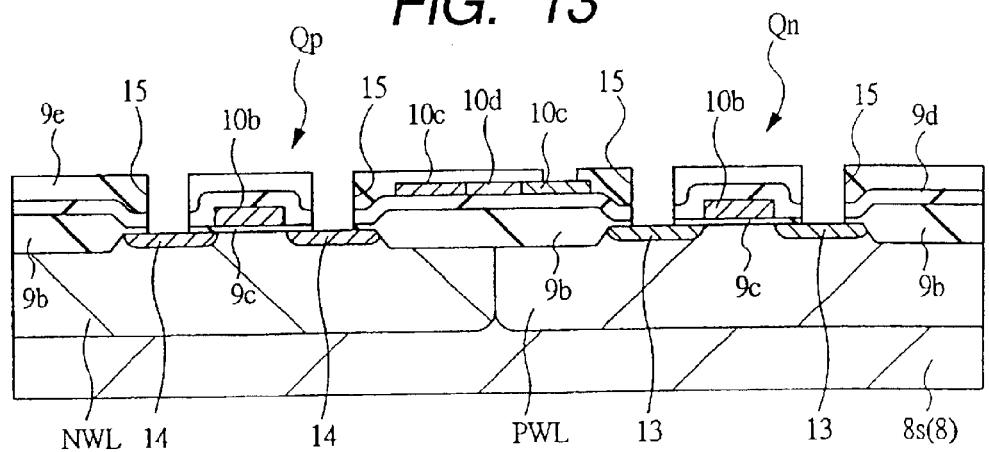
FIG. 13 is a sectional view of the principal portion of the wafer in a step which follows the step of FIG. 12.
Figure 14:
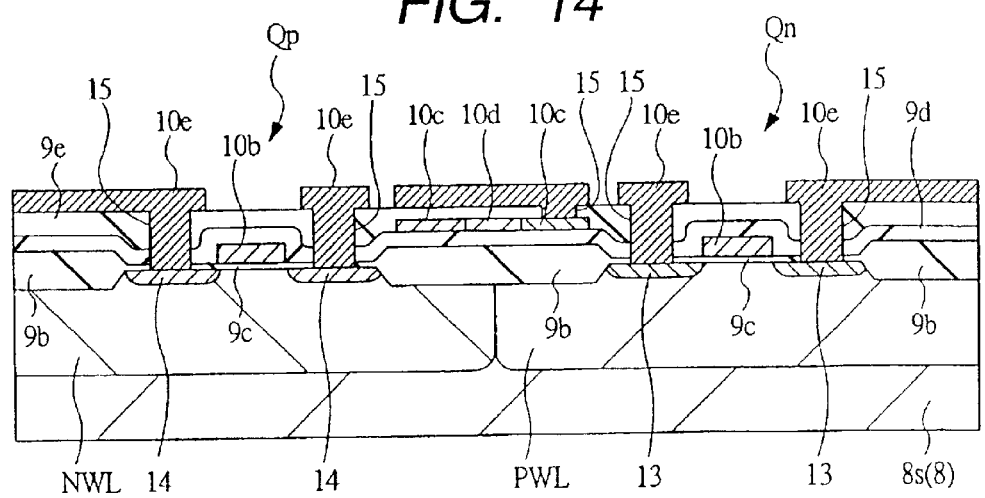
FIG. 14 is a sectional view of the principal portion of the wafer in a step which follows the step of FIG. 13.

Thereafter, as shown in FIG. 13, an SOG (Spin On Glass) film 9e constituted by a silicon oxide film, for example, is deposited on the semiconductor substrate 8s by coating, for example, and then contact holes 15 are formed in the interlayer insulating film 9d and SOG film 9e so that semiconductor regions 13, 14 and the wiring lines 10c are partially exposed in accordance with the photolithography technique using the reducing projection exposure system 12 and mask PM1 and the conventional etching technique. Further, a metal film formed of aluminum (Al) or Al alloy, for example, is deposited on the semiconductor substrate 8s by sputtering, for example, and it is then subjected to patterning by the photolithography technique using the reducing projection exposure system 12 and mask PM1 and the conventional etching technique to form first-layer wiring lines 10e. Subsequently, like the first-layer wiring lines 10e, second and further layer wiring lines are formed to fabricate a semiconductor integrated circuit device. Here, in each of the above-mentioned photolithography steps, mask patterns (light shielding patterns and light transmitting patterns) are formed corresponding to the patterns to be formed.

Next, a description will be given of an application example of the semiconductor integrated circuit device manufacturing method using the mask PM1 according to this embodiment Reference will here made to a method of partially correcting or changing the pattern of the semiconductor integrated circuit device.

In the development or manufacturing stage of the semiconductor integrated circuit device, there may occur the necessity of partially correcting or changing the integrated circuit patterns. In such a case, with use of a conventional mask, a new mask substrate is provided, a metal film is deposited thereon and is subjected to patterning. Thus, the correcting and changing works are troublesome in that they constitute labor- and time-consuming work. Besides, if a defect is found in a pattern of the mask thus fabricated, the mask is generally not employable, depending on the degree of the defect, so that there is typically no choice but to discard the mask, and it is necessary to provide a new mask substrate and fabricate the mask again from the beginning. For this reason, the production work may become wasteful and uneconomical.

On the other hand, in case of using the mask pM1 according to this embodiment, it is possible to take the following measures. First, the light shielding patterns 3a, that are formed of resist film on the mask PM1 in FIG. 1, are removed, as seen in FIG. 15(a). FIG. 15(a) is a plan view of the mask pM1 after removal of light shielding patterns 3a, and FIG. 15(b) is a sectional view taken on line A—A in FIG. 15(a). On the mask PM1 there remain light shielding patterns 2a and 2b formed of metal, but the light shielding patterns 3a in the region RE have been removed, allowing the region RE to serve as a light transmitting region.

The light shielding patterns 3a formed of resist film were peeled off with an organic solvent, n-methyl-2-pyrrolidone, which may be replaced by a heated amine-based organic solvent or acetone. One also may use an aqueous tetramethyl ammonium hydroxide (TMAH) solution, ozone sulfuric acid, or a mixed solution of an aquous hydrogen peroxide and a concentrated sulfuric acid. When an aqueous TMAH solution was used at a concentration of about 5%, the resist film (light shielding patterns 3a) could be peeled off without soaking the metal (light shielding patterns 2a and 2b), and thus the use of the aqueous TMAH solution at such a concentration was found preferable.

As another method for removing the resist film (light shielding patterns 3a), an oxygen plasma ashing method also may be adpted. This method is effective particularly in the case where the resist film (light shielding patterns 3a) on the mask PM1 has been subjected to a hardening treatment This is because the resist film (light shielding patterns 3a) having been subjected, to a hardening treatment is in a hardened state and may not be removed to a satisfactory extent by the above-mentioned chemical removing method.

The light shielding patterns 3a may be subjected to peeling for mechanical removal thereof. More specifically, an adhesive tape is affixed to the surface of the mask PM1, on which surface the light shielding patterns 3a are formed, and it is then removed to peel off the light shielding patterns 3a. In this case, there scarcely is used any organic solvent, and it is not necessary to create a vacuum state, so that the light shielding patterns 3a can be peeled off relatively easily and in a short time.

The step, of removing the resist film (light shielding patterns 3a) is followed by washing to remove dust particles present on the surface of the mask PM1. For such washing there was used, as an example, a combination of ozone sulfuric acid washing, and brush washing, but any other method may be adopted insofar as the method adopted has a high dust particle removing ability and does not affect the metal (light shielding patterns 2a and 2b).

Figure 16:
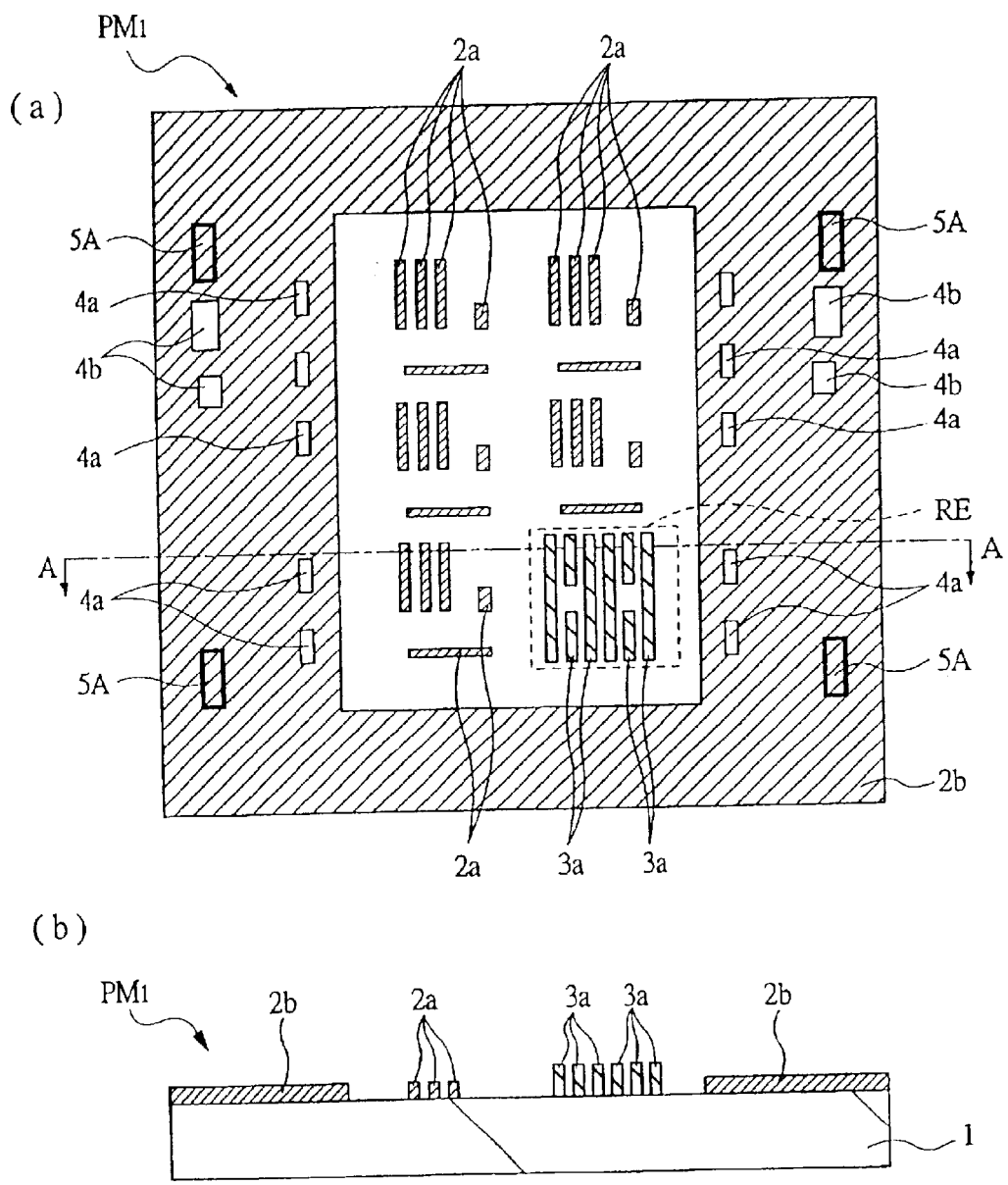
FIGS. 16(a) and 16(b) illustrate a step following the step shown in FIG. 15(a), In which FIG. 16(a) Is a plan view of the photomask of FIG. 1 as used in the modifying/changing step for the light shielding pattern formed of resist film.

Thereafter, as shown in FIG. 16(a), a group of desired light shielding patterns 3a different in shape from the group of light shielding patterns 3a shown in the region RE in FIG. 1 is formed in the region RE. How to form the light shielding patterns 3a is the same as that described in the manufacturing method used for producing the mask PM1, and, therefore, an explanation thereof will be omitted. FIG. 17 shows these patterns of mask PM1 that have been transferred onto the wafer with use of the foregoing reducing projection exposure system 12 (see FIG. 10). FIG. 17(a) is a plan view of a principal portion of the wafer 8, and FIG. 17(b) is a sectional view taken on line A—A in FIG. 17(a). In this way a group of conductor film patterns 10a1 that are different in shape from those shown in FIG. 9(a) can be formed in the region RE.

Thus, in the case of the mask PM1 being considered, the light shielding patterns 3a, as part of the mask PM1, are formed of a resist film, so that in the event there occurs a correction or change with respect to patterns present in part (region RE) of the mask PM1, all that is required is to remove the light shielding patterns 3a and reform like patterns in the same manner as in the lithography commonly adopted in the semiconductor integrated circuit device manufacturing process. Therefore, the correction or change can be done in a simple manner and in an extremely short time. That is, it becomes possible to greatly shorten the time of manufacture of the mask PM1. Consequently, by using the mask PM1 in the development or manufacture of a semiconductor integrated circuit device, it is made possible to greatly shorten the time required for the development or manufacture of a semiconductor integrated circuit device.

In correcting or changing patterns of the mask PM1, it is hot necessary to newly provide or re-fabricate a mask substrate 1. Besides, even in the event the light shielding patterns 3a on the mask being fabricated are found to involve a defect, it suffices to remove the light shielding patterns 3a and again perform patterning of the mask. Accordingly, not only can the number of manufacturing steps for the mask PM1 be reduced to a great extent, but also the quantity of materials required in the manufacture of the mask PM1 can be greatly decreased, and, hence, it becomes possible to greatly reduce the manufacturing cost of the mask PM1. It follows that the use of the mask PM1 in the development or manufacture of a semiconductor integrated circuit device permits a great reduction in the cost of the circuit device.

Figure 18:
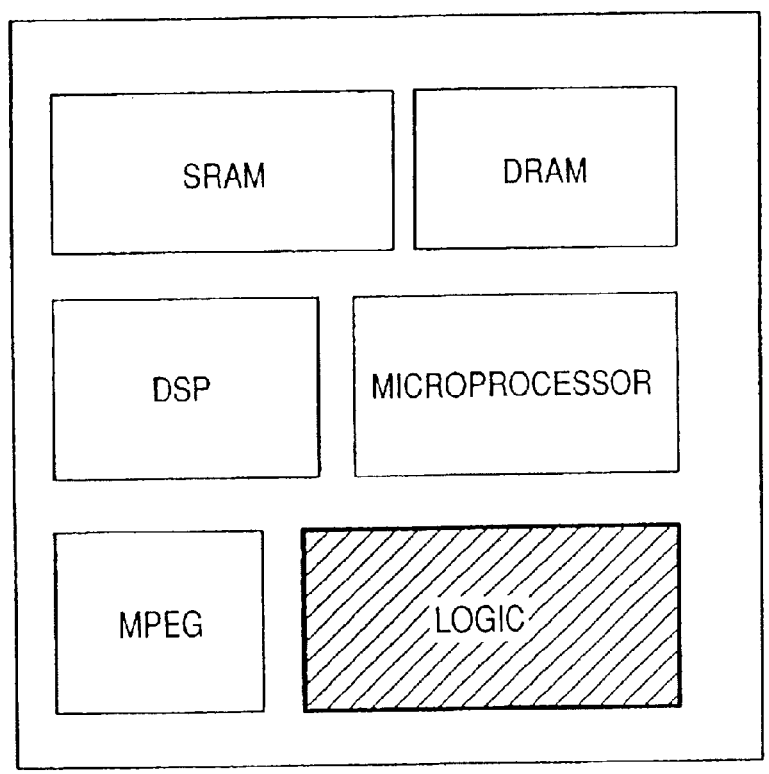
FIG. 18 is a diagrammatic plan view showing an example of a semiconductor chip which is effectively employable during development or manufacture of the photomask of this embodiment.
Figure 19:
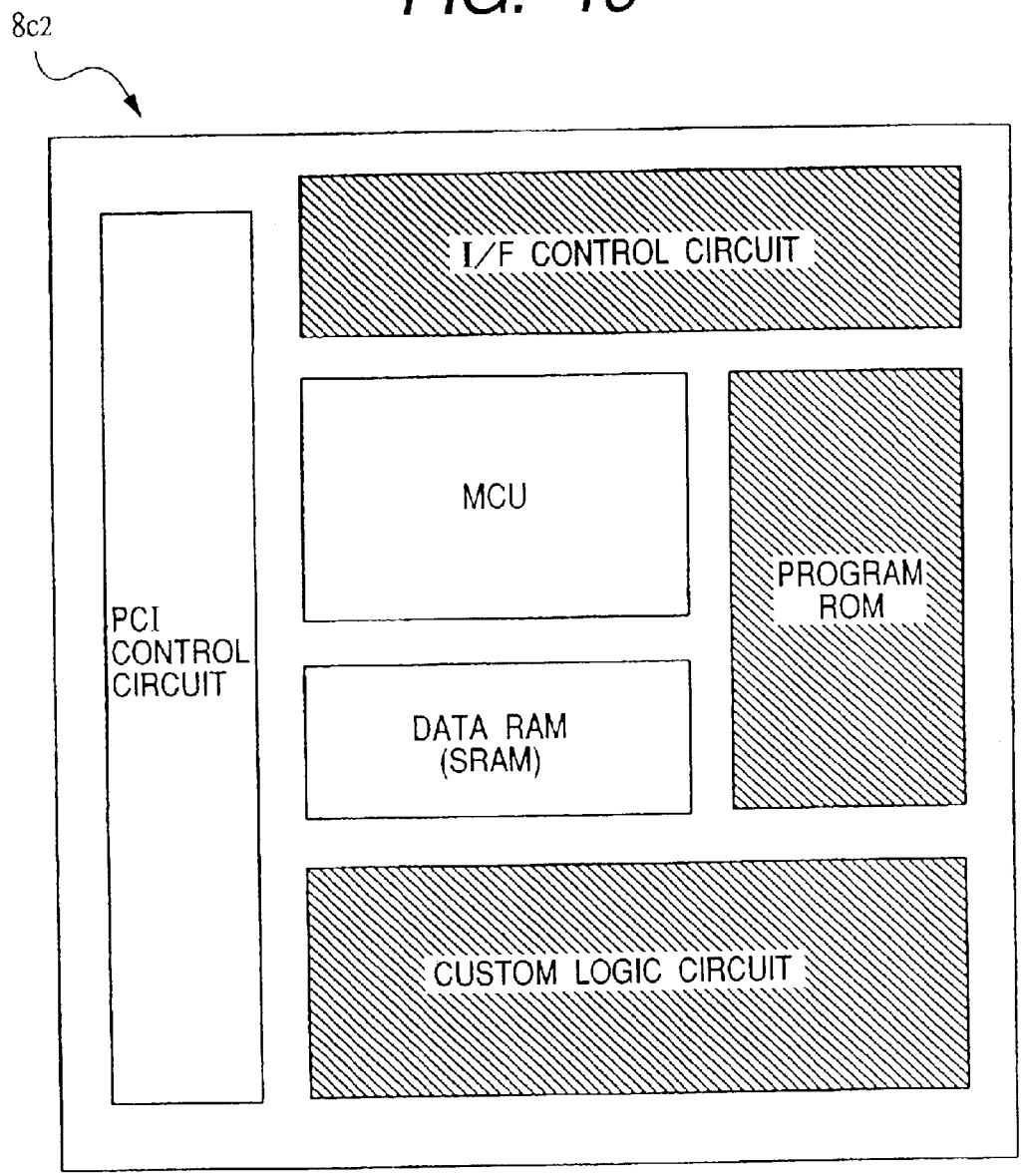
FIG. 19 is a diagrammatic plan view showing another example of a semiconductor chip which is effectively employable during development or manufacture of the photomask of this embodiment.
Figure 20:
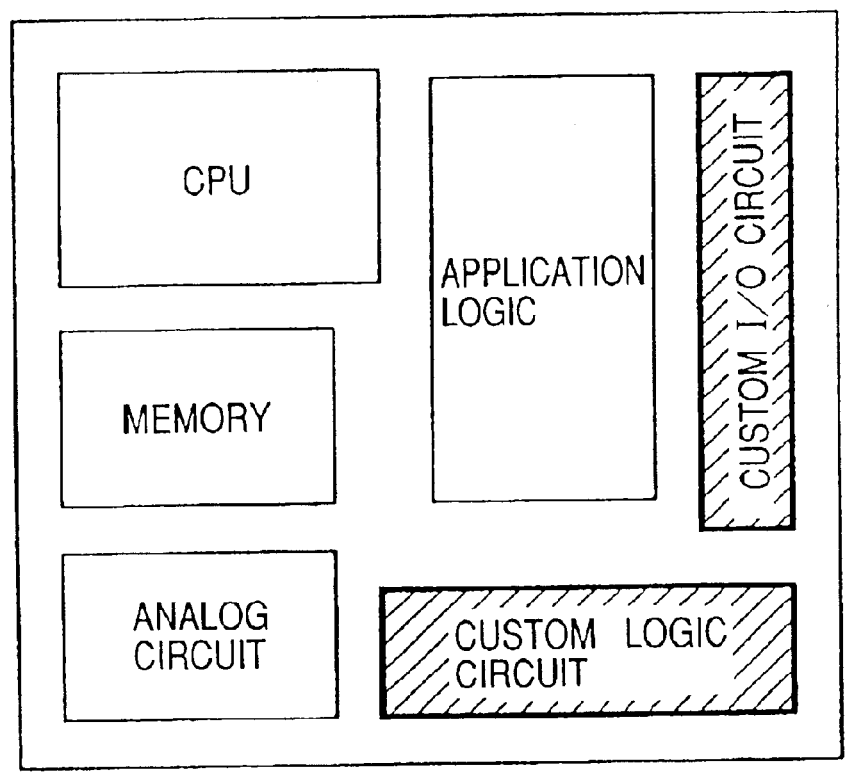
FIG. 20 is a diagrammatic plan view showing a further example of a semiconductor chip which is effectively employable during development or manufacture of the photomask of this embodiment.

FIGS. 18 to 20 show examples of semiconductor chips 8c1 to 8c3 of semiconductor integrated circuit devices to which the technical idea of the present invention is applicable, effectively. The semiconductor chips are small semiconductor pieces, that are square a seen in plan view, cut out from the wafer 8. On the wafer, the hatched area indicates an area where light shielding patterns are formed of resist film.

In the semiconductor chip 8c1 shown in FIG. 18, there are arranged such circuit regions as SRAM (Static Random Access Memory), DRAM (Dynamic Random Access Memory), DSP (Digital Signal Processor), a microprocessor, MPEG (Moving Picture Experts Group), and Logic. Since Logic is apt to be changed on a customer's request, light shielding patterns on the mask for forming patterns in the Logic circuit region are formed of a resist film. More specifically, mask patterns for forming patterns in the Logic circuit region are formed of a resist film (light shielding patterns 3a). Light shielding patterns on the mask PM1 for forming patterns in the other circuit region are formed of a metal.

In the semiconductor chip 8c2 shown in FIG. 19, there are arranged such circuit regions as PCI control circuit, I/F control circuit, MCU, program ROM, data RAM (e.g., SRAM), and custom logic circuit Light shielding patterns on the mask for forming I/F control circuit, program ROM, and custom logic circuit are formed of a resist film. To be more specific, three regions RE are provided on the mask PM1, and mask patterns for forming patterns of I/F control circuit, program ROM, and custom logic circuit are formed of resist film (light shielding patterns 3a) in the three regions RE, respectively. Light shielding patterns on the mask PM1 for forming patterns in the other circuit region are formed of a metal. This is because, in the I/F control circuit, different pattern shapes occur in the case of different interface standards like, for example, IEEE (I triple E) 1394, USB (Universal Serial Bus), SCSI (Small Computer System Interface), AGP (Accelerated Graphics Port), Ether, and Fiber-channel. Moreover, in the program ROM, there arises the necessity of rewriting the program. Here it is possible to give an example in which light shielding patterns on the mask are formed of resist film for divisions (memory cells) of the ROM. Further, in the custom logic circuit, there arises the case where a circuit pattern is changed in compliance with a customer's request, as typified, for example, by a gate array or a standard cell.

In the semiconductor chip 8c3 shown in FIG. 20, there are arranged a CPU (Central Processing Unit), memory, application logic circuit, custom I/O (input/output) circuit, analog circuit, and custom logic circuit. Light shielding patterns on the mask for forming patterns of the custom I/O circuit and custom logic circuit are formed of a resist film. More specifically, there are provided two regions RE of the mask PM1 and mask patterns for forming patterns of the custom I/O circuit and custom logic circuit are formed of resist film (light shielding patterns 3a) in the two regions RE, respectively. Light shielding patterns on the mask PM1 for forming patterns in the other circuit region are formed of a metal. This is because, for the custom I/O circuit, the same reason applies as with the I/F control circuit set forth above.

(Second Embodiment)

Figure 21:
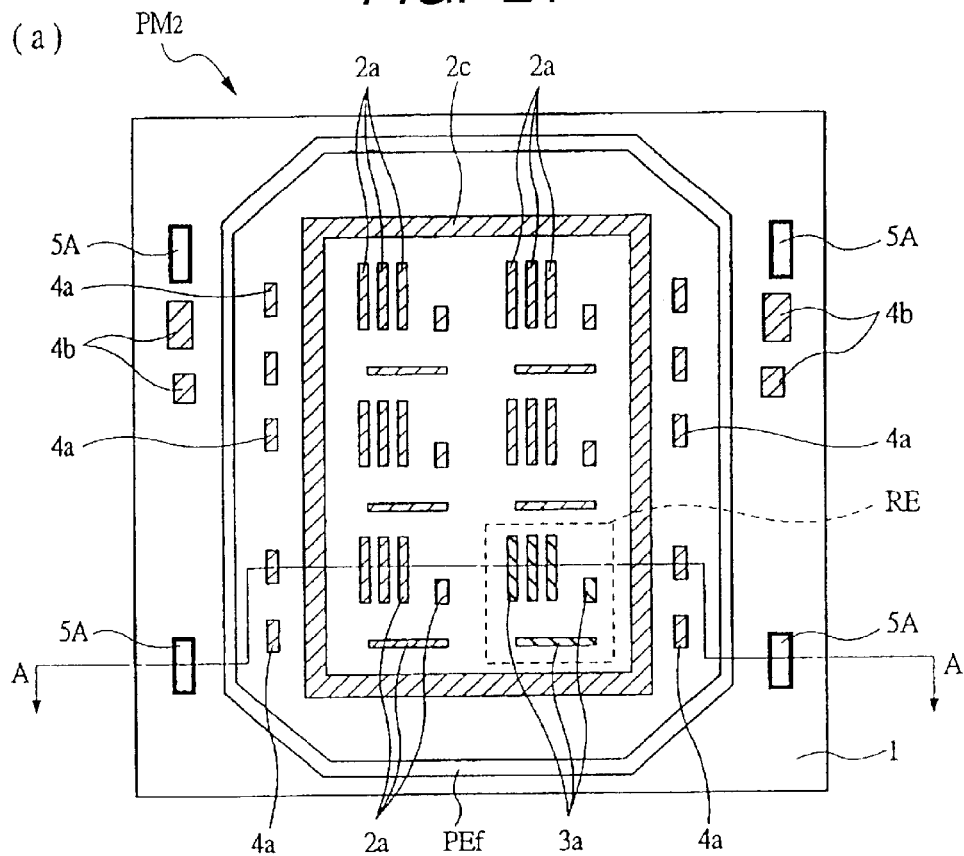
FIG. 21(a) is a plan view of a photomask according to another embodiment of the present invention.
FIG. 21(b) is a sectional view taken on line A—A in FIG. 21(a)

In this second embodiment a modified example of a mask will be described. Other points are the same as in the first embodiment In a mask PM2 shown in FIG. 21(a), a peripheral contour of a semiconductor chip serves as a light shielding portion, and line patterns are formed on the wafer with use of a positive type resist film. FIG. 21(a) is a plan view of the mask PM2, and FIG. 21(b) is a sectional view taken on line A—A in FIG. 21(a).

Light shielding patterns 2a and 3a in an integrated circuit pattern region on the mask PM2 are the same as in the first embodiment. Patterns which are transferred onto the wafer with use of the mask PM2 are also the same as those shown in FIGS. 8(a) and 9(a). In this second embodiment, a band-like light shielding pattern 2c is formed of metal along an outer periphery of the integrated circuit pattern region and in a surrounding relation to the same region. The greater part of the portion located outside the light shielding pattern 2c serves as a light transmitting region, with the light shielding film removed. Mark patterns 4a and 4b located in the peripheral region of the mask PM2 are formed of metallic light shielding patterns. Consequently, it is possible to obtain a sufficient contrast of detection light, and, hence, it is possible to improve the sensitivity and accuracy in mark detection.

The light shielding patterns 2a, 2c and mark patterns 4a, 4b are formed in the same patterning step, using the same metal material. In forming the light shielding patterns 2a, 2c and mark patterns 4a, 4b on this mask substrate 1, a negative type resist film is used as an etching mask. This is because the mark PM2 can be fabricated in Q-TAT. More particularly, if a resist film is allowed to remain outside the integrated circuit pattern region, it will cause the generation of dust particles as noted earlier, so it is necessary to remove the outside resist film. In this connection, if a positive type resist film is used, the greater part of the interior and outer periphery of the integrated circuit pattern region must be subjected to electron beam plotting, which takes time. However, if a negative type resist film is used, it suffices to effect plotting for the regions of light shielding patterns 2a, 2c and mark patterns 4a, 4b, which are relatively small in area within the main surface of the mask substrate 1, whereby the plotting area and plotting time can be made small and short, respectively.

A base portion of a pellicle affixing frame PEf of the pellicle PE is bonded in direct contact with the mask substrate 1. As in the first embodiment, therefore, it is possible to prevent peel-off of the pellicle affixing frame PEf. Loading portions 5 of the exposure system also assume a state of direct contact with the mask substrate 1. Consequently, the generation of dust particles caused by peel-off of the resist can be suppressed or prevented, as in the first embodiment.

How to change the light shielding patterns 3 of the mask PM2 is also the same as in the first embodiment A brief description on this point will be given below with reference to FIGS. 22(a) to 23(b). Each of FIGS. 22(a) and 23(a), is a plan view of the mask PM2, and FIG. 22(b) and 23(b) are sectional views taken on line A—A in FIGS. 22(a) and 23(a), respectively.

First, the light shielding patterns 3a in region RE of the mask PM2 are removed in the same way as in the first embodiment, as shown in FIG. 22(a). Light shielding patterns 2a and 2c present in elements transfer regions D1 to D3 are allowed to remain because they are formed of metal. Subsequently, as shown in FIG. 23(a), light shielding patterns 3a, that are different in shape from those in FIG. 21(a), are formed of resist film in the region RE of the mask PM2 in the same manner as in the first embodiment As the resist film which forms the light shielding patterns 3a in the above manner, a negative type resist was used.

Also, in this second embodiment, constructed as described above, the same effects are obtained as in the first embodiment (Third Embodiment)

Figure 24:
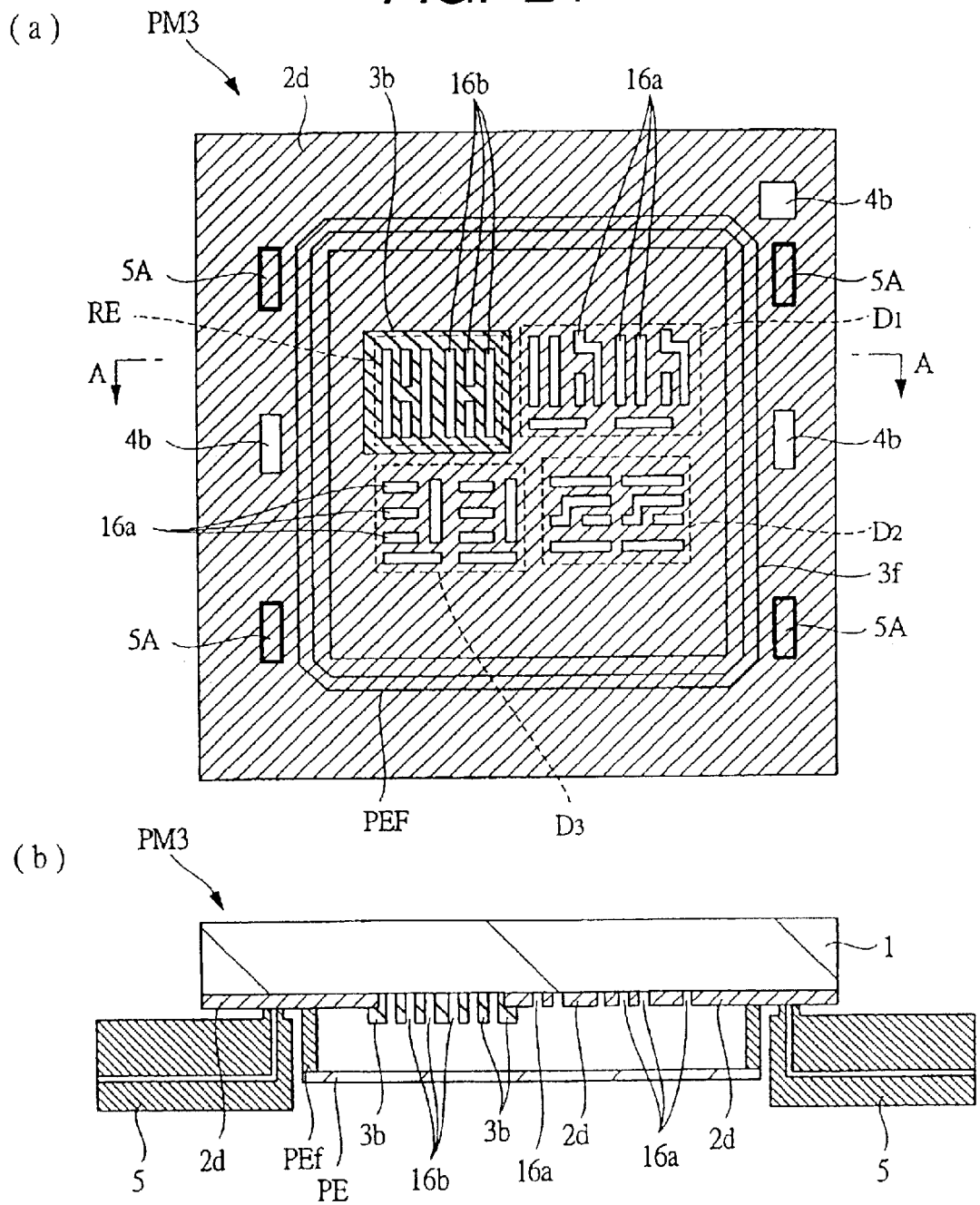
FIG. 24(a) is a plan view of a photomask according to a further embodiment of the present invention.
FIG. 24(b) is a sectional view taken on line A—A in FIG. 24(a)

In connection with this third embodiment, a description will be given of a modified example of a mask. Other points are the same as in the first embodiment A mask PM3 according to this third embodiment is used in forming line patterns on a wafer with use of a negative type resist film. FIG. 24(a) is a plan view of the mask PM3, and FIG. 24(b) is a sectional view taken on line A—A in FIG. 24(a).

A main surface of a mask substrate 1 of the mask PM3 is covered substantially throughout the whole area thereof with a light shielding film 2d formed of metal. The material of the light shielding film 2d is the same as that of the light shielding patterns 2a to 2c described previously. In element forming regions D1 to D3 located within an integrated circuit pattern region of the mask PM3, part of the light shielding film 2d is removed to form light transmitting patterns 16a. In a region RE located within the integrated circuit pattern region, the light shielding film 2d is partially removed in a square shape, as seen in plan view, to form a light transmitting opening region, which instead is covered with a light shielding film 3b formed of a resist film. The light shielding film 3b is partially removed to form light transmitting patterns 16b. An outer periphery of the light shielding film 3b formed of resist film is partially stacked on part of the light shielding film 2d. The resist material of the light shielding film 3b is the same as that of the light shielding patterns 3a described in connection with the first embodiment. In the illustrated example, the light transmitting patterns 16a and 16b are transferred as line patterns on the wafer. That is, patterns of the light transmitting patterns 16a and 16 are transferred onto the wafer. Further, mark patterns 4a and 4b of the mask PM3 are formed as light transmitting patterns, as in the first embodiment. That is, they are formed by removing part of the light shielding film 2d. Therefore, it is possible to obtain a sufficient contrast of detection light, and, hence, it is possible to improve the sensitivity and accuracy in mark detection.

In processing the light shielding film 2d on the mask substrate 1 (i.e., in forming the light transmitting patterns 18a, the light transmitting opening region in region RE and mark patterns 4a, 4b), a positive type resist film is used. This is because the mask PM3 can be formed in Q-TAT. In more particular terms, if a negative type resist film is used in the aforesaid processing, the greater part both inside and outside of the integrated circuit pattern region must be subjected to electron beam plotting, which requires much time.

A base portion of a pellicle affixing frame PEf of pellicle PE is bonded in direct contact with the light shielding film 2d, which is formed of a metal on the mask substrate 1. Therefore, as in the first and second embodiments, it is possible to prevent peel-off of the pellicle affixing frame PEf. Loading portions 5 In the exposure system also assume a state of direct contact with the light shielding film 2d formed of metal. Consequently, the generation of dust particles caused by peeling of resist can be suppressed or prevented, as in the first and second embodiments.

Also, as to the method of changing the light transmitting patterns 16b of the mask PM3, it is the same as in the first and second embodiments. This point will be described below briefly with reference to FIGS. 25(a) to 26(b).

First, the light shielding film 3b formed of resist film in region RE of the mask PM 3, which is shown in FIG. 24(A), is removed in the same way as in the first and second embodiments, as shown in FIG. 25(A), allowing the light transmitting opening region 16c in region RE to be exposed. At this time, the light shielding film 2d formed of metal is allowed to remain, so that the light transmitting patterns 16a in the element transfer regions D1 to D3 are maintained in their state, as shown in FIG. 24(a). A light transmitting opening region 16c is opened in a square shape, as seen in plan view, for example, from which a main surface of the mask substrate 1 is exposed.

Subsequently, a resist film for forming light shielding patterns is applied onto a main surface (the surface formed with the light shielding film 2d) of the mask PM3. As the resist film, a negative type resist film was used. This is because the mask can be fabricated in Q-TAT. More particularly, if a positive type resist film is used, it is required to perform electron beam plotting both inside and outside the integrated circuit pattern, and thus it takes time. However, with a negative type resist film, the plotting area can be reduced and the plotting time can be shortened. Then, the light shielding region-forming portion of the resist film is irradiated with an electron beam, for example, to plot patterns, followed by development, whereby the light shielding film 3b and light transmitting patterns 16b, which result from partial removal of the film 3a, are formed in the region RE, as shown in FIG. 26(a).

Also, in this third embodiment, which is constructed as described above, the same effects are obtained as in the first and second embodiments.

(Fourth Embodiment)

In this fourth embodiment, a description will be given of the application of the present invention to a so-called superimposed exposure technique, wherein one pattern or a group of patterns on a wafer are formed by exposure through plural stacked masks. Other points are the same as in the first to third embodiments.

FIG. 27(a) shows an example of a first mask PM41 that is used in this fourth embodiment. In an integrated circuit pattern region of the mask PM41 there is formed a light transmitting opening region 16d, which has an inverted L-shaped, as seen in plan view, for example. In the light transmitting opening region 16d there are formed light shielding patterns 2a of metal for transferring an integrated circuit pattern onto a wafer. The illustrated mask PM41 is used to transfer line patterns onto the wafer. The surrounding portion of the light,transmitting opening region 16d is mostly covered with a light shielding film 2e of metal, which extends up to an outer periphery of the mask substrate 1. Region RE is also covered with the light shielding film 2e. As to mark patterns 4b and the pellicle used in the first mask PM41, they are the same as used in the third embodiment.

The mask PM41 is used to transfer patterns of a circuit (see FIGS. 18 to 20) constituted by a group of constant-shape patterns, which are basically not corrected or changed in a semiconductor integrated circuit device. The light shielding patterns 2a and the light shielding film 2e are made of the same material, but as their material, a material other than chromium and chromium oxide may be used. This is because the mask PM41 is used in the same manner as an ordinary type of mask. More particularly, since a change in the pattern is not made, it suffices for the light shielding patterns 2a and light shielding film 2e to have such a resistance as is required of an ordinary type of mask. Of course, the light shielding portions (light shielding patterns and light shielding film) of the mask PM41 may be formed of resist film.

FIG. 28(a) shows an example of a second mask PM42 that is used in this fourth embodiment. In region RE in an integrated circuit pattern region of the mask PM42 there is formed a light transmitting opening region 16e, which is square, as seen in plan view, for example. In the light transmitting opening region 16e, light shielding patterns 3a are formed by resist film to transfer an integrated circuit pattern onto a wafer. The mask PM42 is used to transfer line patterns onto the wafer. The surrounding portion of the light transmitting opening region 16e is mostly covered with a light shielding film 2f of metal, which extends to an outer periphery of a mask substrate 1. The light shielding film 2f is formed of the same material as that of the light shielding patterns 2a described in connection with the first embodiment, etc. Mark patterns 4b and the pellicle used in the second mask PM42 are also the same as in the third embodiment.

The second mask PM42 is used to transfer patterns of a circuit (see FIGS. 18 to 20) constituted by a group of patterns which are subjected to correction or change in a semiconductor integrated circuit device. How to correct or change the light shielding patterns 3a In the second mask PM2 is also the same as in the first to third embodiments. This point will now be described briefly with reference to FIGS. 29(a) to 30(b), in which FIG. 29(a) and 30(a) are plan views of the mask PM42, and FIGS. 29(b) and 30(b) are sectional views taken on line A—A in FIGS. 29(a) and 30(a), respectively.

First, the light shielding patterns 3a, that are formed of resist film in the region RE of the mask PM2 shown in FIG. 28(a), are removed in the same manner as in the first to third embodiments, as shown in FIG. 29(a). At this time, the light shielding film 2f of metal is allowed to remain. Subsequently, a resist film for forming light shielding patterns is applied onto a main surface (the surface formed with the light shielding film 2f) of the mask PM42. As the resist film, a negative type resist film was used. This is because the mask PM42 can be formed in Q-TAT. More particularly, if the resist film is allowed to remain outside the integrated circuit pattern region, it causes the generation of dust particles, as noted earlier, so that it is necessary to remove the outside resist film. Therefore, if a positive type resist film is used, the greater part of an outer periphery of the integrated circuit pattern region must also be subjected to electron beam plotting, which takes time. In contrast therewith, if a negative type resist film is used, it suffices to plot only the region of light shielding patterns 3a, which are relative small in area, within the main surface of the mask substrate 1, whereby the plotting area can be reduced and the plotting time can be shortened. Subsequently, an electron beam, for example, is radiated to the light shielding region-forming portion of the resist film to plot patterns, followed by development, to form light shielding patterns 3a in region RE, which patterns are different in shape from the light shielding patterns 3a shown in FIG. 28(a). Of course, even if all the light shielding portions (light shielding patterns and light shielding film) of the masks PM41 and PM42 are formed of such a metal as chromium, all that is required is only a change of the mask PM42, so it becomes possible to attain Q-TAT in mask production.

An example of the method of transferring patterns onto a wafer with use of such first and second masks PM41 and PM42 will be described below with reference to FIGS. 7(a), 7(b) and other figures.

First, as shown in FIG. 7(b), a positive type resist film 11a is formed by coating onto a conductor film 10a that is formed on wafer 8, and then the mask patterns of the first mask PM41 shown in FIG. 27(a) are transferred onto the resist film 11a by means of the reducing projection exposure system 12 shown in FIG. 10. At this time, exposure light passes through the light transmitting opening region 16d of the first mask PM1, so that the region corresponding to the light transmitting opening region 116d in the resist film la is exposed to the light However, since the region RE of the first mask PM41 is covered with the light shielding film 2e, the region corresponding to the region RE in the resist film 11a is not exposed to the light.

Subsequently, without removing the resist film 11a, the mask patterns of the second mask PM42, shown in FIG. 28(a), are transferred onto the resist film 11a using the reducing peon exposure system 12 shown in FIG. 10. In this case, contrary to the case of the first mask PM41, only the region corresponding to the region RE of the second mask PM42 is exposed to light in the resist film 11a.

Thereafter, the resist film 11a is subjected to development, whereby resist patterns which reflect the first and second masks PM41, PM42, are formed on the conductor film 10a. Then, using the resist patterns as an etching mask, etching is performed for the conductor film 10a to form conductor film patterns. If the necessity for correction or change for the region RE of the second mask PM42 arises during development or manufacture of the semiconductor integrated circuit device, the light shielding patterns 3a on the second mask PM42 may be reformed in the manner described above.

Thus, according to this fourth embodiment, the following effects can be obtained in addition to the effects obtained in the first to third embodiments.

In the case where both light shielding patterns 2a, which seldom require correction or change, and light shielding patterns 3a, which require correction or change, are formed in one and same mask, then at the time of pattern correction or change, peeling and washing of the resist film (light shielding patterns 3a) are applied also to the light shielding patterns 2a, which are fine patterns free of correction or change, so that the light shielding patterns 2a may be deteriorated or peel off. On the other hand, in this fourth embodiment, a division is made into the first mask PM41 for the transfer of patterns, which are seldom subjected to correction or change and the second mask PM41 for the transfer of patterns which are subjected to correction or change, so at the time of pattern correction or change, peeling and washing of the resist film are not applied to the fine light shielding patterns 2a that are seldom subjected to correction or change. Besides, since the fine light shielding patterns 2a are not present in the second mask PM2, peeling or washing of the light shielding patterns 3a can be carried out without the need to pay attention to deterioration or peel-off of the light shielding patterns 2a. Consequently, it is possible to improve the mask life and reliability.

(Fifth Embodiment)

The fifth embodiment is directed to a modified example of a mask, in which the present invention is applied to a translucent phase shift mask (the foregoing halftone mask).

FIG. 31(a) shows a mask PM5 of this fifth embodiment. Halftone patterns 3c for the transfer of an integrated circuit pattern are formed in a light transmitting region, which is a part of an integrated circuit pattern region of the mask PM5. The halftone patterns 3c are formed of a resist film 3, which forms the light shielding patterns 3a described in the first embodiment, etc., but they are translucent to exposure light and the thickness thereof is adjusted to a thickness for inversion of the phase of the exposure light In the mask substrate 1, the halftone patterns 3c are formed flush with light shielding patterns 2a and 2b.

FIG. 31(b) shows a state of phase inversion of the exposure light radiated from the back side of the mask PM5 of this fifth embodiment. The exposure light that has passed through the halftone patterns 3c is 180° inverted in phase relative to the exposure light that has passed through a transparent portion (the light transmitting region). That is, both exposure lights are opposite in phase. The transmittance of the halftone patterns 3c is about 2 to 10% in terms of light intensity relative to the exposure light before passing through the halftone patterns 3c. Therefore, the halftone patterns 3c substantially act as light shielding portions, but are effective in making the boundary portion of the transferred patterns clear. Processing and changing methods for the halftone patterns 3c are the same as those for the light shielding patterns 3a in the first to fourth embodiments.

In case of using an ArF excimer laser as an exposure light source, the absorption in the resist film serving as a mask is large, so for realizing both the foregoing transmittance of about 2 to 10% and phase inversion simultaneously, it is necessary to make an appropriate adjustment for the resist film for the formation of halftone patterns 3c. On the other hand, the use of an $F_2$ laser beam with a wavelength of 157 nm as an exposure light source is advantageous to the simultaneous realization of both the foregoing transmittance of about 2 to 10% and the phase inversion.

Also, in this fifth embodiment, the same effects are obtained as in the first to fourth embodiments.

(Sixth Embodiment)

The sixth embodiment is directed to a modification of the mask of the fifth embodiment.

In the fifth embodiment, the phase difference is set by adjusting the thickness of the halftone patterns, so that it is necessary that the thickness be adjusted to within a predetermined range. Consequently, there sometimes occurs a case where it is difficult to properly set the intensity of the light passing through the halftone patterns of the resist film.

In view of this point, in this sixth embodiment, the phase difference of light is set not by adjusting only the film thickness of the halftone patterns of the resist film, but by adjusting both the film thickness and the depth of each trench formed in the mask substrate (i.e., the thickness of the mask substrate in the trenched portion). As a result, the following effects can be obtained in addition to the effects obtained in the fifth embodiment. Firstly, it is possible to facilitate the setting of the intensity of light passing through the halftone patterns. Secondly, it is possible to widen the selection range of the material which forms the halftone patterns.

FIG. 32(a) shows a specific example of the mask PM6 of this sixth embodiment. In the mask PM6, halftone patterns 3d of resist film are made of the same material as that of the halftone patterns 3c used in the fifth embodiment, but the translucent film is thinner than the halftone patterns 3c, and a phase inversion of transmitted light was realized by both the thickness of the halftone patterns 3d and that of the mask substrate 1 in the portion of each trench 18 formed in the mask substrate.

As an example, the halftone patterns 3d were formed using a novolak resin having a thickness of about 50 nm. As a result, the transmittance of the halftone patterns 3d became 5%. However, the transmittance is not limited to 5%, but various changes may be made. For example, in the range of 2% to 20%, it is possible to make selection according to a purpose. In the example being considered, the phase inversion was about 90°. More specifically, trenches 18 each having a depth of about 90 nm was formed in the mask substrate 1 so as to create a phase inversion of about 180° in total for the exposure light having passed through the mask PM6. The thickness of the halftone patterns 3d is not limited to the one referred to above, but various changes may be made if only adjustment is made so as to cause an inversion of the phase according to the refractive index of the material, the wavelength of the exposure light, etc.

The mask PM6 thus constructed can be formed, for example, in the following manner. First, as in the fifth embodiment, light shielding patterns 2a, 2b and halftone patterns 3d are formed on the mask substrate 1, as shown in FIG. 32(b). Then, using the patterns 2a, 2b and 3d as an etching mask, the mask substrate 1 exposed therefrom is etched off selectively by only be foregoing depth, whereby the grooves 18 shown in FIG. 32(a) are formed self-alignmentwise with respect to the halftone patterns 3d. In this sixth embodiment, the mask PM6 having halftone patterns 3d with a transmittance of 5% could be fabricated in this way. In the example shown in FIG. 32(a), for simplification of the mask fabricating process, the mask substrate 1 in the region of mark patterns 4b is also etched off and is dug thereby at the time of formation of the trenches 18, but the mask substrate portion in this region may be left as it is without being etched off. In the mask PM6, correction or change, if necessary, of the halftone patterns 3d is made before forming the trenches 18.

Also, in this sixth embodiment, the same effects are obtained as in the first to fifth embodiments.

(Seventh Embodiment)

The seventh embodiment is directed to a modification of the masks of the fifth and sixth embodiments.

In this seventh embodiment, for solving the problem referred to in the sixth embodiment, the phase of exposure light is adjusted not by only halftone patterns, but by the provision of another film which overlaps the halftone patterns planarly. By so doing, as in the sixth embodiment, it is possible to easily set the intensity of light passing through the halftone patterns. It is also possible to widen the selection range of the material which forms the halftone patterns.

FIG. 33(a) shows a specific example of a mask PM7 according to this seventh embodiment. In the mask PM7, a transparent phase adjusting film 19 formed of a silicon oxide film, for example, is provided between the same halftone patterns 3d of resist film as in the sixth embodiment and the mask substrate 1, and the foregoing phase inversion is realized by adjusting the thickness of each halftone pattern 3d and phase adjusting film 19.

The mask PM7 thus constructed is formed, for example, in the following manner. First, as shown in FIG. 33(b), a phase adjusting film 19, constituted by a silicon oxide film, for example, is formed on the main surface of the substrate 1 by sputtering, CVD (Chemical Vapor Deposition), or coating. Subsequently, light shielding patterns 2a, 2b and halftone patterns 3d are formed thereon in the same way as in the fifth and sixth embodiments. Thereafter, as noted above, with the halftone patterns 3d alone, the phase inversion was about 90°, so using the halftone patterns 3d and light shielding patterns 2a, 2b as an etching mask, the underlying phase adjusting film 19 was dug about 90 nm so as to afford a phase inversion of about 180° in total. In this case, the mask substrate 1 may be used as an etching stopper. The mask PM7 shown in FIG. 33(a) is fabricated in this way. Also in this seventh embodiment, a halftone type mask PM7 having a transmittance of 5%, for example, could be fabricated. As in the sixth embodiment, the thickness of the halftone patterns 3d is not limited thereto. Also, in this seventh embodiment, for simplifying the mask fabricating process, the phase adjusting film 19 in the region of mark patterns 4b is also etched off during patterning thereof, but the phase adjusting film portion in this region may be left as it is without being etched off. In this case, it is preferable that correction or change, if necessary, of the halftone patterns 3d of the mask PM7 be made before etching the phase adjusting film 19.

Also, in this seventh embodiment, the same effects are obtained as in the first to sixth embodiments.

(Eighth Embodiment)

The eighth embodiment is directed to modifications of the masks and fabrication methods described in reference to the fifth to seventh embodiments.

An example of a method of fabricating a mask according to this eighth embodiment will be described below with reference to FIGS. 34(a) to 34(d).

As shown in FIG. 34(a), light shielding patterns 2a, 2b and mask patterns 4b are formed on the main surface of the mask substrate 1 in the same way as in the first and seventh embodiments. Subsequently, as shown in FIG. 34(b), a resist film 20, which is transparent to exposure light, is formed by coating on the main surface of the mask substrate 1, so as to cover the light shielding patterns 2a, 2b and the substrate main surface. Further, a resist film 3 having a light shielding property, such as that used in the fifth embodiment, was formed thereon as a thin translucent film. As the transparent resist film 20 there was used, as an example, PGMA24 (polyglycidyl methacrylate) exhibiting a negative type. The light shielding resist film 3 was formed of a novolak resin of about 50 nm In thickness exhibiting a negative type, as an example. Thereafter, a desired integrated circuit pattern was plotted on the resist film 3 with an electron beam. Also, at this time, the foregoing antistatic treatment was performed. Then, the resist film 3 was subjected to development In the conventional manner to form halftone patterns 3e by the resist film, as shown in FIG. 34(c).

Subsequently, the main surface of the mask substrate 1 was subjected to exposure in the conventional manner, so that the portion of the resist film 20 exposed from the light shielding halftone patterns 3e was exposed to light, followed by development to form a phase adjusting film constituted by the resist film 20 in a self-alignment manner relative to the halftone patterns 3e, as shown in FIG. 34(d). In this way, a mask PM8 was fabricated.

In the mask PM8, the resist film 20 (phase adjusting film) is present only under each halftone pattern 3e. The phase of exposure light passing through the mask PM8 is adjusted by adjusting the thickness of each halftone pattern 3e and resist film 20 (phase adjusting film). In this way there could be attained a phase inversion of 180° between the light that has passed through the laminated pattern region of the halftone patterns 3e and the resist film 20 (phase adjusting film) and the light that has passed through only the mask substrate 1. The transmittance of the laminated pattern region was about 5%. That is, as in the sixth and seventh embodiments, there could be produced a mask PM8 having halftone patterns 3e of 5% in transmittance. In this case, correction or change of the halftone patterns 3e may be made after patterning of the resist film 20. In case of making a pattern change, both halftone patterns 34 and the resist film 20 are removed, and the fabrication process is again started, beginning with the coating of the resist film 20.

Also, in this eighth embodiment the same effects are obtained as in the first to seventh embodiments.

(Ninth Embodiment)

The ninth embodiment is directed to a modified example of a mask, which is a combination of an ordinary halftone mask and such a halftone mask using a resist film as provided in the fifth to eighth embodiments.

FIG. 35(a) shows an example of a mask PM9 according to this ninth embodiment. In the mask PM9, line patterns, such as wiring lines, are transferred onto a wafer through halftone patterns. More specifically, ordinary halftone patterns 21a of MoSiOx or MoSiON and halftone patterns 3c of resist film, as described in the fifth to eighth embodiments, are formed in the integrated circuit pattern region on the main surface of the mask substrate 1.

The film thickness of the halftone patterns 3c was set at a thickness required for phase inversion and to satisfy a desired light shielding performance, as in the fifth to eighth embodiments. Therefore, the phase difference of transmitted lights is not limited to 180°, but can be selected from among various values, including 540° and 900°.

FIG. 35(b) shows a state of phase inversion of exposure light radiated from the back side of the mask PM9. Exposure light which has passed through the halftone patterns 3c and 21a is 180° inverted in phase with respect to exposure light that has passed through a transparent portion (light transmitting region). That is, the phases of the exposure lights are reverse to each other.

An example of a method of fabricating the mask PM9 will be described below with reference to FIGS. 36(a) to 36(e).

Figure 36:
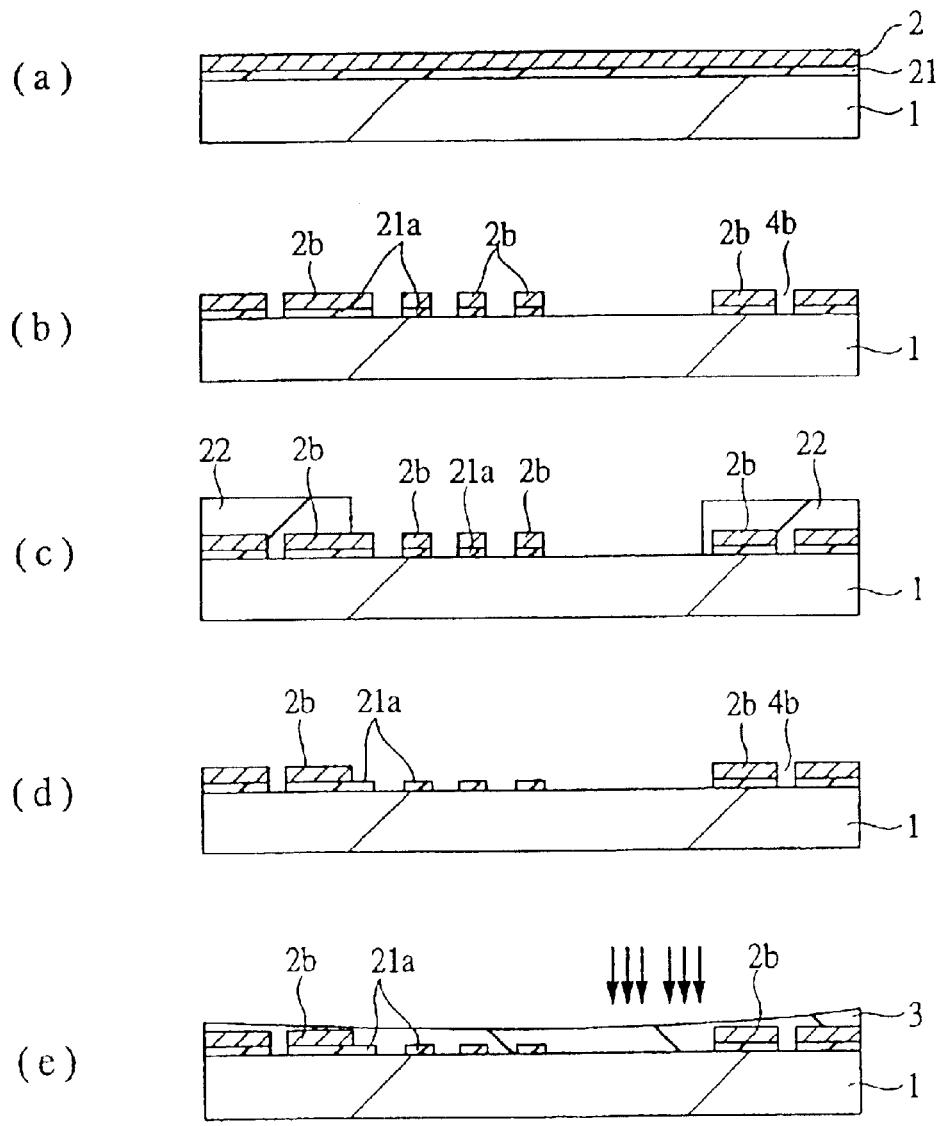
FIGS. 36(a) to 36(e) are sectional views of the photomask of FIG. 35(a), showing manufacturing steps for the photomask.

First, as shown in FIG. 36(a), a halftone film 21 of, for example, MoSiOx or MoSiON is formed on the main surface of the mask substrate 1 by sputtering or CVD, for example. Thereafter, using the foregoing metal for a light shielding film, a light shielding film 2 is deposited on the halftone film 21 by sputtering. Subsequently, the light shielding film 2 and the halftone film 21 are subjected to patterning in accordance with the conventional photolithography technique and etching technique to form halftone patterns 21a, light shielding patterns 2b, and mark patterns 4b, as shown in FIG. 36(b). Then,is shown in FIG. 36(c), a resist film 22 is formed so as to cover the light shielding patterns 2b in the other region than the region where the halftone patterns 21 are formed. Thereafter, using the resist film 22 as an etching mask, the light shielding film 2 exposed therefrom is removed, allowing the halftone patterns 21a to be exposed, as shown in FIG. 36(d). Then, as shown in FIG. 36(e), a resist film 3 for a light shielding mask is formed by coating and an electron beam is radiated to predetermined positions of the resist film 3 to form halftone patterns 3c, As shown in FIG. 35(a). How to correct or change the halftone patterns 3c is the same as in the first embodiment.

Also, in this ninth embodiment, the same effects are obtained as in the first to seventh embodiments.

(Tenth Embodiment)

FIG. 10 is directed to a modified example of a mask, which is a combination of an alternating phase shift mask, i.e., a Levenson type phase shift mask, and a a light shielding pattern mask using a resist film such as used in the first to fourth embodiments.

FIG. 37(a) shows an example of a mask PM10 according to this tenth embodiment, which mask is used for the transfer of such line patterns as wiring lines onto a wafer. In an integrated circuit pattern region on a main surface of the mask PM10, there are arranged a Levenson type phase:shift pattern region (left-hand side in FIG. 37(*a*)) and a light shielding pattern 3*a* region (right-hand side in FIG. 37(*a*)) of resist film, as described for the first to fourth embodiments.

In the Levenson type phase shift pattern region, there are arranged plural light shielding patterns 2*a* of metal, light transmitting patterns 16*f* adjacent to each other on both sides of each fight shielding pattern 2*a*, and phase shifters 22*a* positioned on one side of the adjacent light transmitting patterns 16*f*. For example, the phase shifters 22*a* are trench shifters. As the structure of the trench shifters, one may adopt a structure wherein a portion in the transverse direction of each trench is allowed to overhang lower portions of the light shielding patterns 2*a*. According to this structure, it is possible to improve the pattern transfer accuracy.

FIG. 37(*b*) shows a state of phase inversion of exposure light radiated from the back side of the mask PM10. Exposure light which has passed through the phase shifters 22*a* is 180° inverted in phase with respect to exposure light that has passed through the light transmitting patterns 16*f* free from phase shifters 22*a*. That is, the phases of both exposure lights are opposite to each other. On the other hand, the light shielding patterns 3*a* are the same as used in the first embodiment, etc. Therefore, correction and change of the light shielding patterns 3*a* can be done easily.

It is preferable that the mask PM10 be applied to a semiconductor integrated circuit device having a memory such as a DRAM. In the semiconductor integrated circuit device having a memory such as a DRAM, elements and wiring lines in the memory cell region are becoming more and more fine. Therefore, in forming word lines, data lines, or hole patterns, a case sometimes occurs where the transfer of a pattern is not feasible unless a Levenson type phase shift mask is used. In other peripheral circuit regions and logic circuit regions than the memory cell region, it is not necessary to use a Levenson type phase shift mask, but there sometimes is a case where a customer or product specification requires various changes of peripheral circuit and logic circuit patterns. The mask PM10 can cope with both such requests. More particularly, on the memory cell region side, it is possible to transfer patterns of fine elements and wiring lines, while in the other circuit region than the memory cell region, it is possible to cope with various changes in pattern shape flexibly in a short time. Since correction and change of the patterns can be done after formation of trenches for phase shifters, it is possible to shorten the time required for mask fabrication. Additionally, also in this tenth embodiment, the same effects can be obtained as in the first to ninth embodiments.

(Eleventh Embodiment)

The eleventh embodiment is directed to a modified example of a mask, which is a combination of a conventional Levenson type phase shift mask and a Levenson type phase shift mask fabricated using such light shielding patterns of resist film as described for the first to fourth embodiments.

Figure 38:
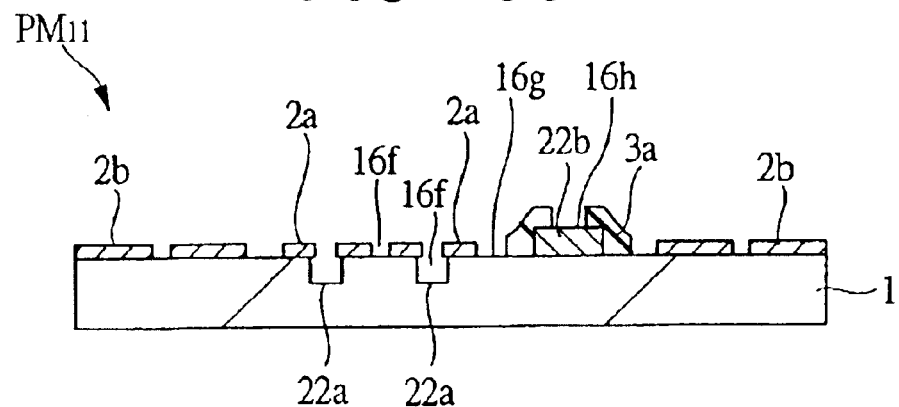
FIG. 38 is a sectional view of a photomask according to a still further embodiment of the present invention.

FIG. 38 shows an example of a mask PM1 according to this eleventh embodiment, which mask is used for transferring line patterns, such as wiring lines, onto a wafer. In an integrated circuit pattern region on a main surface of the mask PM11, are arranged a Levenson type phase shift pattern region (left-hand side in FIG. 38) and a Levenson type phase shift pattern (right-hand side in FIG. 28) constituted by such light shielding patterns 3*a* of resist film as described in the first to fourth embodiments.

The left-hand Levenson type phase shift pattern region is the same as in the tenth embodiment, so an explanation thereof will here be omitted. On the right-hand side of FIG. 38, phase shifter 22*b* is formed by patterning a photosensitive transparent film, such as a photosensitive SOG film, and light shielding patterns 3*a* of resist film are formed by patterning so as to cover the side faces and the vicinity thereof of the phase shifter 22*b*. With the light shielding patterns 3*a*, there are defined light transmitting patterns 16*g* to which a part of the main surface of the mask substrate 1 is exposed and a light transmitting pattern 16*h*, to which a part of an upper surface of the phase shifter 22*b* is exposed. The phases of lights which have passed through mutually adjacent light transmitting patterns 16*g* and 16*h* are 180° inverted with respect to each other.

The mask PM11 thus constructed is fabricated in the following manner. First, light shielding patterns 2*a* and 2*b* of metal are formed on the main surface of the mask substrate 1 in the same way as in the fabrication of the ordinary mask, and then trenches are formed by digging predetermined portions of the main surface of the mask substrate 1 so as to form phase shifters 22*a*.

Subsequently, a photosensitive SOG film, for example, is formed on the main surface of the mask substrate 1 by coating, followed by patterning in accordance with the photolithography technique to form a phase shifter 22*b*. Then, the foregoing resist film for the formation of a light shielding film is formed on the main surface of the mask substrate 1 by coating and is subjected to patterning by photolithography to form light shielding patterns 3*a*.

Also, in this eleventh embodiment, the same effects can be obtained as in the first to ninth embodiments.

(Twelfth Embodiment)

The twelfth embodiment is directed to a modified example of a mask, which is a combination of an ordinary mask and a Levenson type phase shift mask constituted by such light shielding patterns of resist film as used in the eleventh embodiment.

Figure 39:
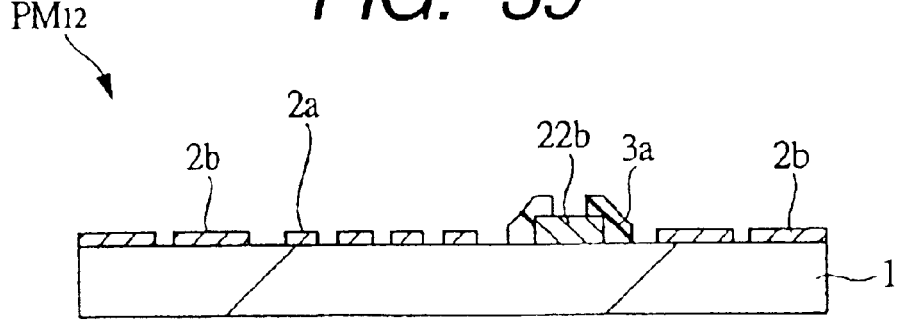
FIG. 39 is a sectional view of a photomask according to a still further embodiment of the present invention.

FIG. 39 shows an example of a mask PM12 according to this twelfth embodiment, which mask is used to transfer line patterns, such as wiring lines, onto a wafer. In an integrated circuit pattern region on a main surface of the mask PM12, there are arranged a pattern region of an ordinary mask (left-hand side in FIG. 39) and a Levenson type phase shift pattern region (right-hand side in FIG. 39) constituted by such light light shielding patterns 3*a* of resist film as described for the eleventh embodiment. The method of fabricating the mask PM12 is almost the same as that used in the eleventh embodiment and is different in that the step of forming the trenched phase shifters 22*a* is not included.

Also, in this twelfth embodiment, the same effects as in the first to ninth embodiments can be obtained.

(Thirteenth Embodiment)

The thirteenth embodiment is directed to a modified example of a mask.

In the mask of this embodiment, as noted previously, since patterns on the mask are removed, the light shielding patterns formed of metal are required to have a certain degree of resistance. In this thirteenth embodiment, therefore, a protective film is formed on the surfaces of light shielding patterns formed of metal.

FIG. 40(*a*) shows an example of a mask PM13 according to this thirteenth embodiment. A thin protective film 23 of silicon oxide, for example, is formed on surfaces of light shielding patterns 2*a* and 2*b* (more specifically, on upper surfaces and side faces of the light shielding patterns 2*a* and 2*b*) which are formed of metal on the mask substrate 1. Consequently, the light shielding patterns 2*a* and 2*b* can be protected at the time of peeling and washing of the resist film (light shielding patterns 3*a*) of the mask PM13, whereby the resistance of the light shielding patterns 2a and 2b can be improved. Particularly, when light shielding patterns 2a are formed for the transfer of fine integrated circuit patterns, the structure of this embodiment, wherein the protective film 23 covers the whole surfaces of the light shielding patterns 2a, is preferable from the point of view of improving the resistance to peeling of the light shielding patterns 2a. The protective film 23 is formed by CVD or sputtering, for example, after patterning of the light shielding patterns 2a and 2b. Light shielding patterns 3a of resist film are formed on the protective film 23 by patterning.

FIG. 40(b) shows a removed state of the light shielding patterns 3a. For forming new light shielding patterns, a resist film for forming light shielding patterns is applied, and patterns are plotted thereon using electron beam, for example, in the same manner as in the first embodiment. This structure is applicable to all of the first to twelfth embodiments.

In this thirteenth embodiment, there can be obtained the effect that the service life of the mask PM13 can be improved, in addition to the effects obtained in the first to twelfth embodiments.

(Fourteenth Embodiment)

The fourteenth embodiment is directed to a modification of the thirteenth embodiment FIG. 41(a) shows an example of a section of a mask PM14 according to this fourteenth embodiment In this fourteenth embodiment, a protective film 23 is applied to only the upper surfaces of the light shielding patterns 2a and 2b. In this case, the protective film 23 is formed simultaneously with formation of the light shielding patterns 2a and 2b by first depositing a light shielding film on the mask substrate 1 by sputtering, then depositing the protective film 23 by CVD or sputtering, and thereafter patterning the light shielding film. Other points are the same as in the thirteenth embodiment. FIG. 41(b) shows a removed state of the light shielding patterns 3a. Also in this case, the resistance of the light shielding patterns 2a and 2b can be improved, and, hence, it becomes possible to improve the service life of the mask PM14.

(Fifteenth Embodiment)

The fifteenth embodiment is directed to a modified example of a mask.

According to studies made by the present inventors, it has been found that it is also effective to first form light shielding patterns of resist film on a main surface of a mask substrate, which patterns are used for forming the foregoing integrated circuit patterns and mark patterns, and thereafter to form a transparent protective film on the mask substrate main surface so as to cover the light shielding patterns. As a result, it is possible to improve the mechanical strength of the light shielding patterns formed of resist film. Besides, since oxygen is shut out by the protective film, it is possible to prevent a change in the film quality of the light shielding patterns formed of resist film.

FIG. 42(a) shows an example of such a mask PM15 according to this fifteenth embodiment. On the whole of a main surface of a mask substrate which constitutes the mask PM15, a protective film 24 is formed using, for example, a silicon oxide film or an applied silicon compound. In case of forming the protective film 24 as a silicon oxide film, the film formation may be carried out by sputtering or CVD; while, in the case of forming the protective film 24 as an applied silicon compound, it is preferable to conduct a heat treatment at 100° to 200° C., for example, after the application.

In the mask 15 of this fifteenth embodiment, the protective film 24 is deposited on the entire main surface of the mask substrate 1 so as to cover light shielding patterns 2a, 2b, and 3a. That is, in case of attaching the mask PM15 to an inspection system or an exposure system, the protective film 24 of the mask PM15 comes into contact with loading portions of the inspection system or exposure system. Thus, as in the first to fourteenth embodiments, the loading portions of the inspection system or exposure system do not come into direct contact with resist film patterns (light shielding patterns 3a, etc.), so it is possible to prevent peel-off and chipping of the resist film caused by mounting of the mask, and, hence, it is possible to prevent the resultant generation of dust particles.

(Sixteenth Embodiment)

In considering this sixteenth embodiment, a description will be given below about problems induced when both light shielding patterns of metal and light shielding patterns of resist film are formed on a mask, and also about means for solving the problems.

FIG. 43(a) is a plan view of a principal portion of a mask which is used to transfer a plurality of adjacent line patterns onto a wafer. In the same figure, there are shown connections between light shielding patterns 2a of metal and light shielding patterns 3a of resist film, which are for the transfer of line patterns. FIG. 43(b) is a sectional view taken on line A—A in FIG. 43(a).

In the illustrated example, the light shielding patterns 2a and 3a overlap each other without positional deviation. However, since the light shielding patterns 2a and 3a are subjected to patterning separately from each other, it is not always possible to arrange the two in such a satisfactory state of alignment. Thus, a displacement in the pattern width direction may occur, as shown in FIG. 44(a). Upon occurrence of such a displacement of the pattern, a problem arises in that a required spacing d1 between adjacent patterns cannot be ensured. Further, as shown in FIG. 44(b), even in an overlapped portion of isolated light shielding patterns 2a and 3a, the respective patterns are greatly displaced in their width direction, making it impossible to ensure a satisfactory state of connection.

Therefore, in a mask PM16 of this sixteenth embodiment, as shown in FIG. 45, even for a portion where a light shielding pattern 2a of metal and a light shielding pattern 3a of resist film are to be connected together, if a predetermined condition is satisfied, both patterns are arranged so as to be spaced from each other.

Figure 47:
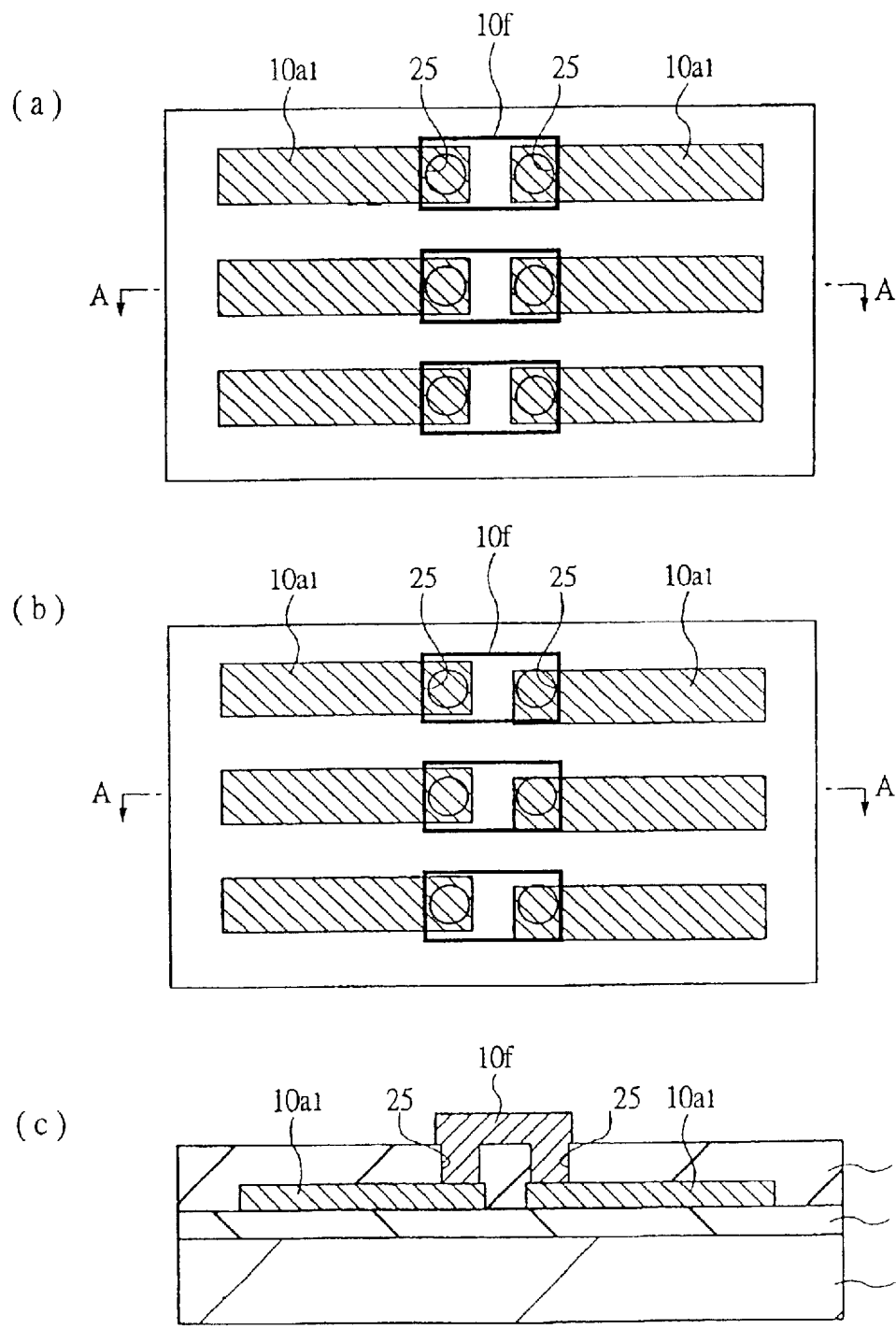
FIGS. 47(a) and 47(b) are diagrammatic plan views of a principal portion of the semiconductor wafer, also showing pattern layers which overlie the patterns illustrated in FIG. 46(b)
FIG. 47(c) is a sectional view taken on line A—A in FIGS. 47(a) and 47(b)

FIG. 46(a) shows a case where light shielding patterns 2a of metal and light shielding patterns 3a of resist film are displaced from each other in the pattern width direction in the mask PM16 of this sixteenth embodiment FIG. 46(b) is a plan view showing a case where conductor film patterns 10a1 were formed on a wafer 8 with use of the mask PM16. FIG. 46(c) is a sectional view taken on line A—A in FIG. 46(b). Adjacent conductor film patterns 10a1 must be connected together, and, therefore, as shown in FIGS. 47(a) to 47(c), adjacent conductor film patterns 10a1 are connected together through an overlying conductor film pattern 10f. FIG. 47(a) shows a case where adjacent conductor film patterns 10a1 are in a satisfactory relative positional relation, FIG. 47(b) shows a case where both patterns are displaced from each other, and FIG. 47(c) is a sectional view taken on line A—A in FIGS. 47(a) and 47(b). Adjacent conductor film patterns 10a1 are electrically connected to the conductor film pattern 10f, respectively, through through-holes 25 formed in an insulating film 9b, and they are thereby connected electrically to each other.

(Seventeenth Embodiment)

The seventeenth embodiment is directed to another means for solving the problems referred to in the discussion of the sixteenth embodiment.

According to this seventeenth embodiment, in both or one of a light shielding pattern of metal and a light shielding pattern of resist film, each connecting portion is made wider than the other pattern portion. FIGS. 48(a) and 48(b) show an example thereof. FIG. 48(a) is a plan view of a principal portion of a mask PM17, and FIG. 48(b) is a sectional view taken on line A—A in FIG. 48(a). In the illustrated example, an end portion of a light shielding pattern 2a of metal is wider than the other portion, and an end portion of a light shielding pattern 3a of resist film overlaps the wide portion of the light shielding pattern 2a of metal. In this way, even if a slight deviation occurs in the relative position between the light shielding patterns 2a and 3a, it is possible to ensure a sufficient overlap quantity of both patterns. Patterns transferred by the mask PM17 are shown in FIGS. 49(a) and 49(b). A conductor film pattern 10a transferred through the light shielding pattern 2a of metal and a conductor film pattern 10a1 transferred through the light shielding pattern 3a of resist film are connected together as designed, although a wider portion is formed in the connection between both patterns. FIG. 49(a) is a plan view of a principal portion of a wafer, and FIG. 49(b) is a sectional view taken on line A—A in FIG. 49(a).

As another method, the overlap quantity of both light shielding patterns 2a and 3a may be set at a value not lower than the alignment accuracy of patterns.

(Eighteenth Embodiment)

The eighteenth embodiment is directed to a modification of the previous seventeenth embodiment According to this eighteenth embodiment, as shown in Figs. 50(a) and 50(b), in both of a light shielding pattern 2a of metal and a light shielding pattern 3a of resist film in a mask PM of this eighteenth embodiment, respective connecting portions are made wider than the other portions. FIG. 50(a) shows a case where both light shielding patterns 2a and 3a are arranged in a satisfactory state of alignment, while FIG. 50(b) shows a case where both light shielding patterns 2a and 3a are displaced from each other in their width direction. Thus, in this case, even if a relative position of both light shielding patters 2a and 3a undergoes a slight positional deviation, it is possible to ensure a sufficient overlap quantity of both patterns. This method is also applicable to the transfer of patterns that are narrow in the pitch of adjacent patterns, because the thickening quantity of end portions of both light shielding patterns 2a and 3a can be made small.

(Nineteenth Embodiment)

The nineteenth embodiment is directed to a case where the technical idea of the present invention is applied to the manufacture an ASIC (Application Specific IC), such as a gate array or a standard cell.

Figure 51:
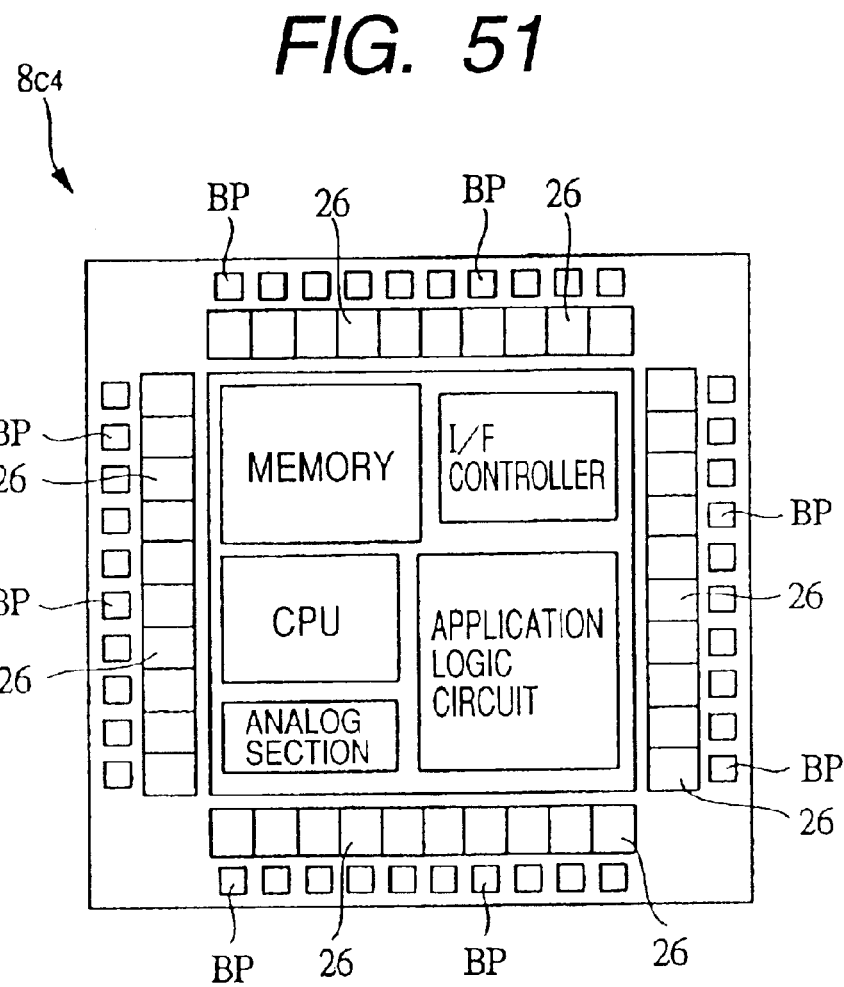
FIG. 51 is a diagrammatic plan view of a semiconductor chip according to a still further embodiment of the present invention.

FIG. 51 shows an example of the configuration of a semiconductor chip 8c4 according to this nineteenth embodiment On a main surface of the semiconductor chip 8c4, there are arranged a memory, an IF controller, a CPU, an application logic circuit, and an analog section. Along an outer periphery of these circuits in the semiconductor chip 8c4, there are arranged a plurality of I/O circuit regions 26, in which input and output circuits or I/O bilateral circuits are arranged. Further, bonding pads BP are arranged along an outer periphery of and in corresponding relation to the I/O circuit regions 26.

Of those circuits, the I/F controller and the application logic circuit are apt to undergo correction or change in accordance with a customer's request. In this nineteenth embodiment, therefore, the portion concerned is gate-arrayed and the light shielding patterns on the mask for the transfer of that portion are formed of a resist film, as explained above with reference to the first to eighteenth embodiments, and light shielding patterns on the mask for the transfer of patterns in the other circuit region are formed of metal.

Figure 52:
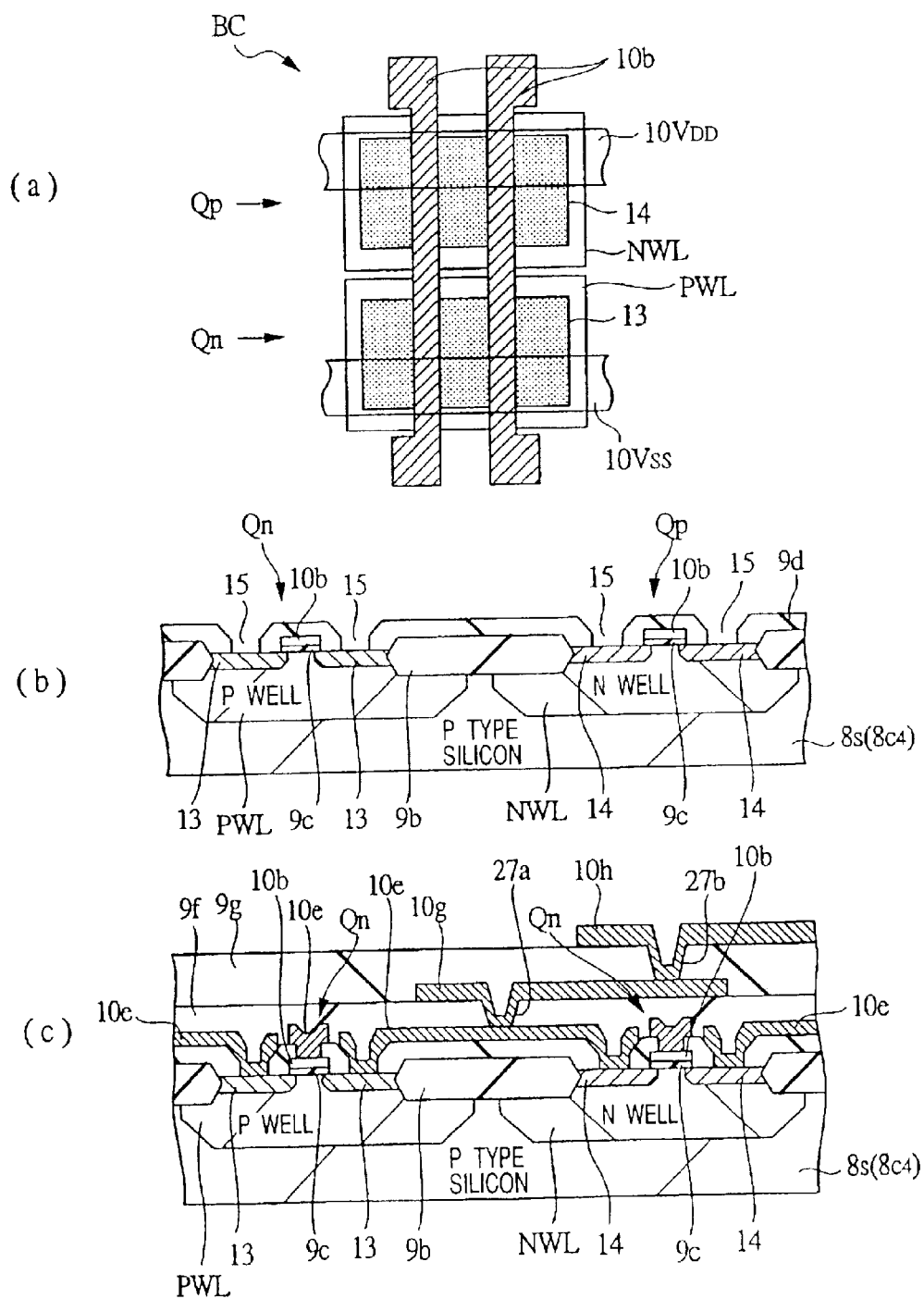
FIG. 52(a) is a diagrammatic plan view of a basic cell in the semiconductor chip of FIG. 51.
FIG. 52(b) is a sectional view of a principal portion of FIG. 51(a)
FIG. 52(c) is a sectional view of a principal portion of the semiconductor chip of FIG. 52(b) with wiring layers formed thereon.

FIG. 52(a) is a plan view of a basic cell BC disposed in the IF controller and the application logic circuit and FIG. 52(b) is a sectional view of FIG. 52(a). In the region where the IF controller and the application logic circuit are formed, plural basic cells BC are arranged so as to spread all over the whole surface (socalied SOG structure: Sea Of Gate). For example, each BC is composed of two nMIS Qn and two pMIS Qp. Gate electrodes 10b are shared by nMIS Qn and pMIS Qp and are arranged so as to span both regions. A power line 10VDD is a high voltage (3.3V or 1.8V for example) power line, while a power line 10VSS is a low voltage (0V for example) power line. The power lines 10VDD and 10VSS are arranged so as to cross the gate electrodes 10b and to extend along an extending direction of n well NWL and p well PWL. Vertical structures of the nMIS Qn and pMIS Qp have already been described for the first embodiment, and so explanations thereof will here be omitted.

Fabrication up to the stage of the basic cell BS has been completed and the shape of the pattern up to that stage has been determined. Therefore, the basic cell BC is subjected to patterning through an ordinary type of mask. Desired circuits are formed by overlying wiring layers and by arranging contact holes and through holes. FIG. 52(c) is a sectional view after formation of a first-layer wiring 10e, a second-layer wiring log, and a third-layer wiring 10h. The second-layer wiring 10g is electrically connected to the first-layer wiring 10e through a through hole 27a formed in an interlayer insulating film 9f. The third-layer wiring 10h is electrically connected to the second-layer wiring 10g through la through hole 27b formed in an interlayer insulating film 9g. The pattern shape of the first- to third-layer wirings 10e, 10g, 10h and the arrangement of contact holes 15 and through holes 27a, 27b may be changed in compliance with a customer's request, so that, for forming their patterns, a mask having light shielding patterns formed of resist film is used.

Next, a description is provided of an example of changing patterns on a mask.

FIGS. 53(a) to 53(c) illustrate a NAND circuit ND formed using the basic cell BC described above. FIG. 53(a) is a symbol diagram of the NAND circuit ND, FIG. 53(b) is an equivalent circuit diagram thereof, and FIG. 53(c) is a plan view showing the layout thereof. The NAND circuit ND illustrated therein has two inputs I1, I2 and one output F.

Figure 53:
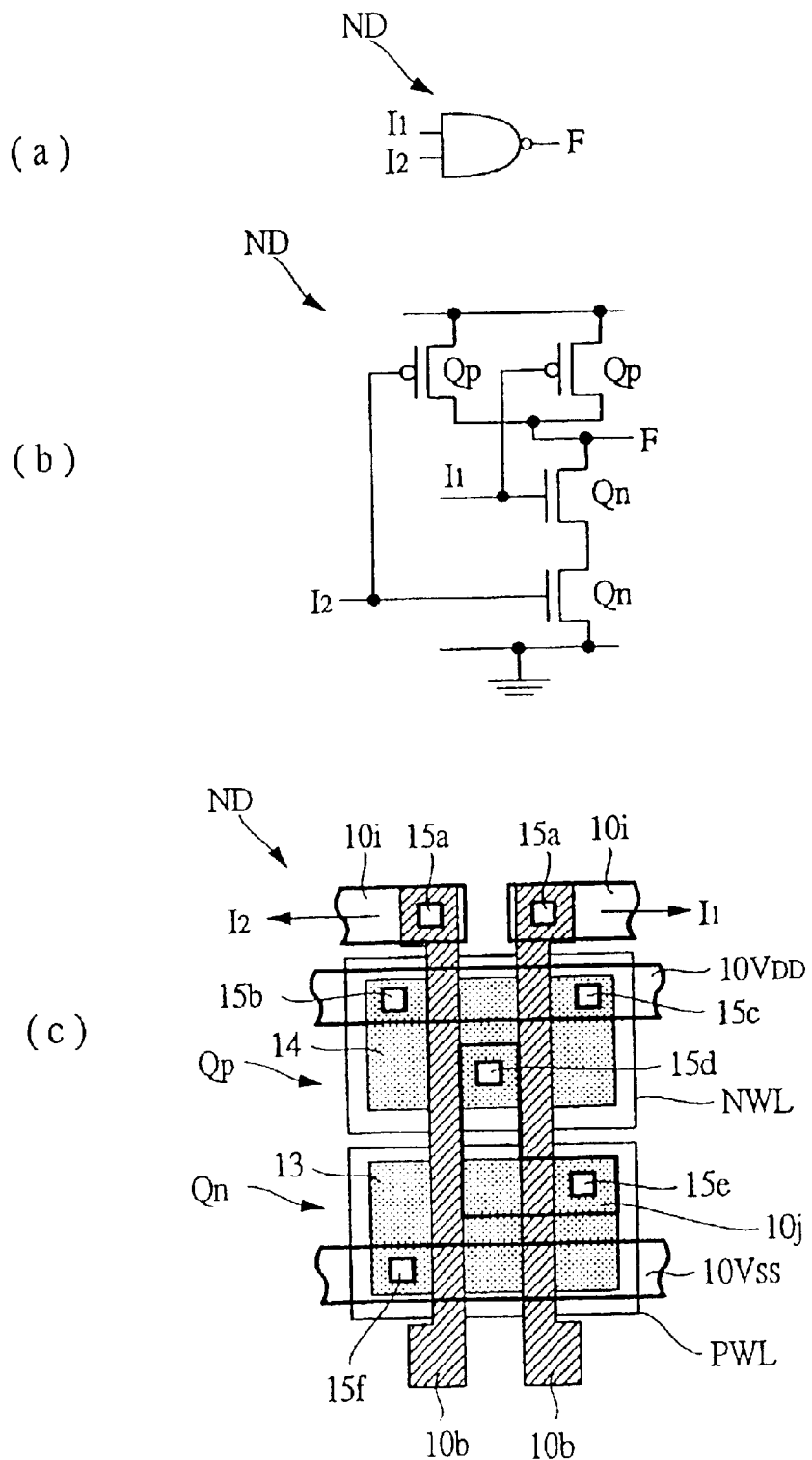
FIG. 53(a) is a symbol diagram of a NAND circuit formed on the semiconductor chip of FIG. 51.
FIG. 53(b) is an equivalent circuit diagram of FIG. 53(a)
FIG. 53(c) is a plan view of a principal portion, showing a pattern layout in FIG. 53(b)

As shown in FIG. 53(c), wiring lines 10i connected respectively to the inputs I1 and I2 are electrically connected to the gate electrodes 10b, respectively, through contact holes 15a. The power line 10VDD is electrically connected to semiconductor regions 14, of both pMIS Qp through contact holes 15b and 15c. The wiring line 10j is electrically connected through a contact hole 15d to a semiconductor region 14 which is common to both pMIS Qp. The wiring line 10j is also connected electrically through a contact hole 15e to a semiconductor region 13 of one nMIS Qn. Further, the power line 10VSS is electrically connected through a contact hole 15f to the semiconductor region 13 of one nMIS On. Although in FIG. 53 the contact holes 15a to 15f are shown as having a square shape, as seen in plan view, they actually have a generally circular shape.

FIGS. 54(a) and 54(b) are plan views of pattern principal portions in masks which are used for the transfer of patterns of the contact holes and wiring lines used in the NAND circuit ND. The masks shown in FIGS. 54(a) and 54(b) are separate masks, and, therefore, the X, Y axes are used to make a positional relation of the two clear.

FIG. 54(a) illustrates patterns of a mask PM19C which is used for transferring the contact holes 15a to 15f shown in FIG. 53(c) onto a wafer. A light shielding film 3f is formed using the same resist material as that of the light shielding patterns 3a described for the first embodiment, etc. The light shielding film 3f is partially removed to form fine light transmitting patterns 16g in plural positions, which patterns 16g are each square, as seen in plan view. The light transmitting patterns 16g are used for forming the contact holes 15a to 15f. In transferring the patterns on the mask onto a wafer, a positive type resist film is used on the wafer.

FIG. 54(b) illustrates patterns of a mask PM19C which is used for transferring the wiring lines 10i, 10j and power lines 10VDD, 10VSS shown in FIG. 53(c) onto a wafer. A light shielding film 3g is formed using the same resist material as that of the light shielding patterns 3a described for the first embodiment, etc. The light shielding film 3g is partially removed to form light transmitting patterns 18h in plural positions. The light transmitting patterns 18h are used for the formation of wiring lines 110i, 10j and power lines 10VDD, 10VSS. In transferring the patterns on the mask onto a wafer, a negative type resist film is used on the wafer.

Figure 55:
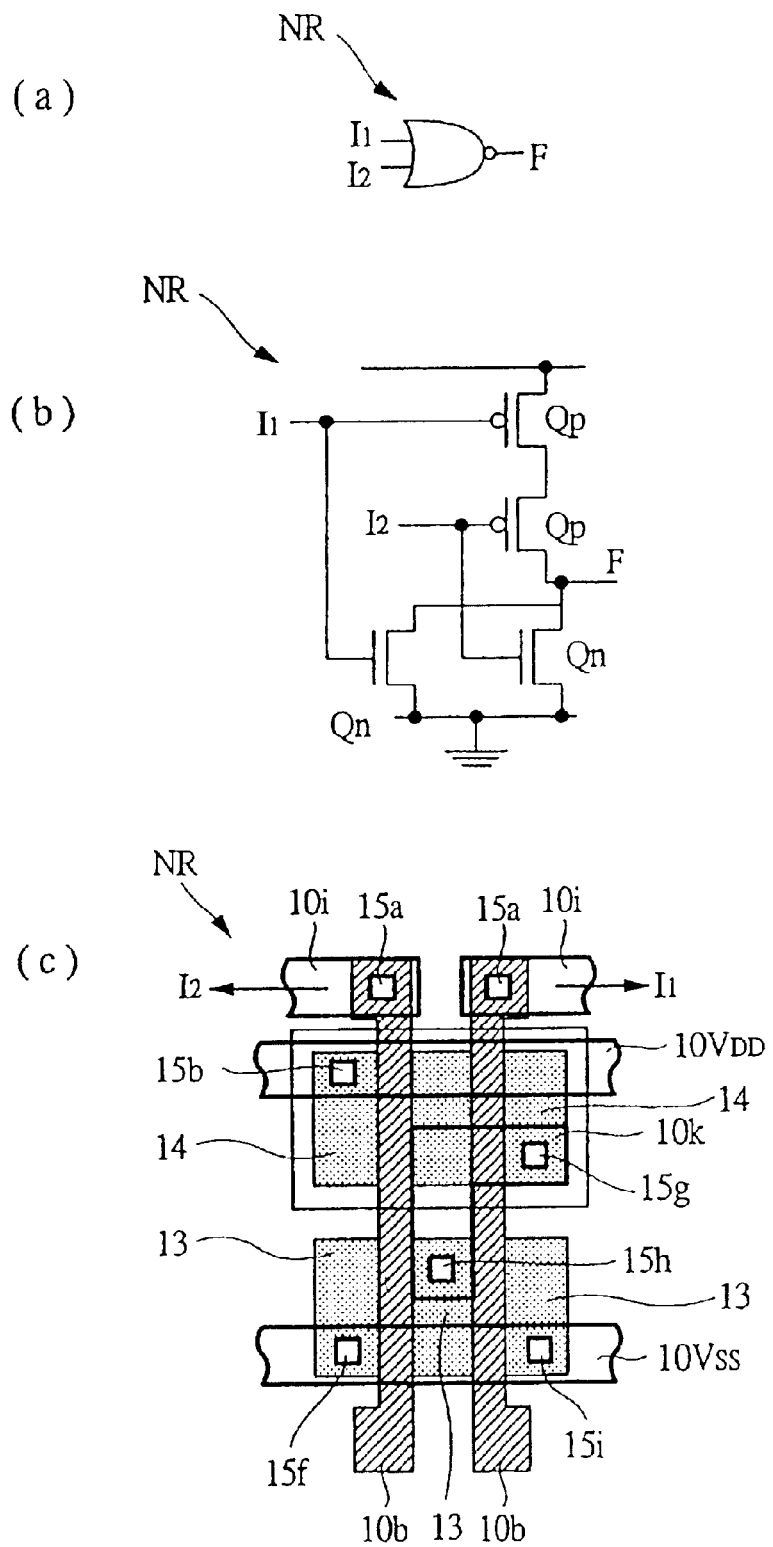
FIG. 55(a) is a symbol diagram of a NOR circuit formed on the semiconductor chip of FIG. 51.
FIG. 55(b) is an equivalent circuit diagram of FIG. 55(a)
FIG. 55(c) is a plan view of a principal portion, showing a pattern layout of FIG. 55(b)

FIGS. 55(a) to 55(c) illustrate a two-input NOR circuit NR formed using the basic cell BC described above. FIG. 55(a) is a symbol diagram of the NOR circuit NR, FIG. 55(b) is an equivalent circuit diagram thereof, and FIG. 55(c) is a plan view showing the layout thereof. A description will be given below about a portion that is different from the NAND circuit configuration of FIG. 53(c).

As shown in FIG. 55(c), a power line 10VDD is electrically connected to a semiconductor region 14 of one pMIS Qp through a contact hole 15b. A wiring line 10k is electrically connected to the semiconductor region 14 of one pMIS Qp through a contact hole 15g. The wiring line 10k is also connected electrically to a common semiconductor region 13 of both nMIS Qn through a contact hole 15h. Further, a power line 10VSS is electrically connected to the semiconductor region 13 of both nMIS Qn through contact holes 15f and 15i. Also, in FIG. 55(c), the contact holes 15a, 15b, 15f, 15g to 15i are shown as having a square shape, as seen in plan view, but actually they have a generally circular shape.

FIGS. 56(a) and 56(b) show plan views of pattern principal portion in masks which are used for the transfer of patterns of the contact holes and wiring lines in the NOR circuit NR. The masks shown in FIGS. 56(a) and 56(b) are separate masks, and, therefore, the X and Y axes are used to make the positional relation of the two clear.

FIG. 56(a) illustrates patterns of a mask PM19C which is used for transferring the contact holes 15a, 15b, 15f, and 15g to 15i shown in FIG. 55(c) onto a wafer. A light shielding film 3h is formed using the same resist material as that of the light shielding patterns 3a described for the first embodiment The light shielding pattern 3h is partially removed to form fine light transmitting patterns 16i in plural positions, which patterns 16i each have a square shape, as seen in plan view. The light transmitting patterns 16i are used for forming the contact holes 15a, 15b, 15f, and 15g to 15i. In transferring the patterns on the mask onto a wafer, a positive type resist film is used on the wafer.

FIG. 56(b) illustrates patterns of a mask PM19L which is used for transferring the wiring lines 10i, 10k and power lines 10VDD, 10VSS shown in FIG. 55(c) onto a wafer. A light shielding film 3i is formed using the same resist material as that of the light shielding patterns 3a described for the first embodiment, etc. The light shielding film 3i is partially removed to form light transmitting patterns 16j in plural positions. The light transmitting patterns 16j are used for forming the wiring lines 10i, 10k and power lines. 10VDD, 10VSS. In transferring the patterns on the mask onto a wafer, a negative type resist film is used on the wafer.

A change of the patterns on the masks PM19C and PM19L shown in FIGS. 54 and 56 may be carried out in the same way as in the first embodiment, etc. For example, patterns for the NAND circuit of the mask PM19C shown in FIGS. 54(a) and 54(b) can be changed into patterns for the NOR circuit of the mask PM19C shown in FIG. 56(a) by first removing the light shielding film 3f on the mask PM19C shown in FIG. 54(a), then newly applying the resist film for forming a light shielding film onto the mask substrate and, thereafter, plotting patterns for the NOR circuit with use of an electron beam or ultraviolet ray to form the light shield film 3h and fight transmitting patterns 16i of the mask PM19C shown in FIG. 56(a). That is, a change of patterns from NAND circuit to NOR circuit and vice versa can be done easily in a short time. Consequently, it is possible to greatly shorten the time required for the development and manufacture of a semiconductor integrated circuit device using the mask. Besides, since the material cost and process cost can be reduced, it becomes possible to greatly reduce the cost of the semiconductor integrated circuit device obtained. Therefore, even in the case of a semiconductor integrated circuit device to be produced in a small lot, it is possible to attain a reduction of the cost.

Thus, also in this nineteenth embodiment the same effects can be obtained as in the first embodiment, etc.

(Twentieth Embodiment)

In this twentieth embodiment a description will be given of a case where the technical idea of the present invention is applied to the manufacture of a mask ROM.

In a mask ROM, it is possible to Implement a memory having a large capacity because the mask ROM is formed of a MIS using one memory cell. Besides, the entire circuit configuration can be made simple because a write operation is not needed. However, since the contents of memory changes depend on a customer's request, TAT becomes longer than in other ROMs (e.g., EEPROM (Electric Erasable Programmable Read Only Memory). Moreover, it is required to fabricate different masks for various ROM codes of customers, thus giving rise to the problem that the product cost will become high in the case of a small lot production. In this twentieth embodiment, in view of these problems, various patterns for the change of a memory cell region are transferred on the basis of the above base data and using a mask which uses the foregoing light shielding patterns of resist film, to change the memory contents. As to patterns used for the transfer of patterns in the other region than the memory cell region on the mask, they were formed using light shielding patterns of metal. Of course, all of the integrated circuit patterns may be formed using light shielding patterns of resist film.

Figure 57:
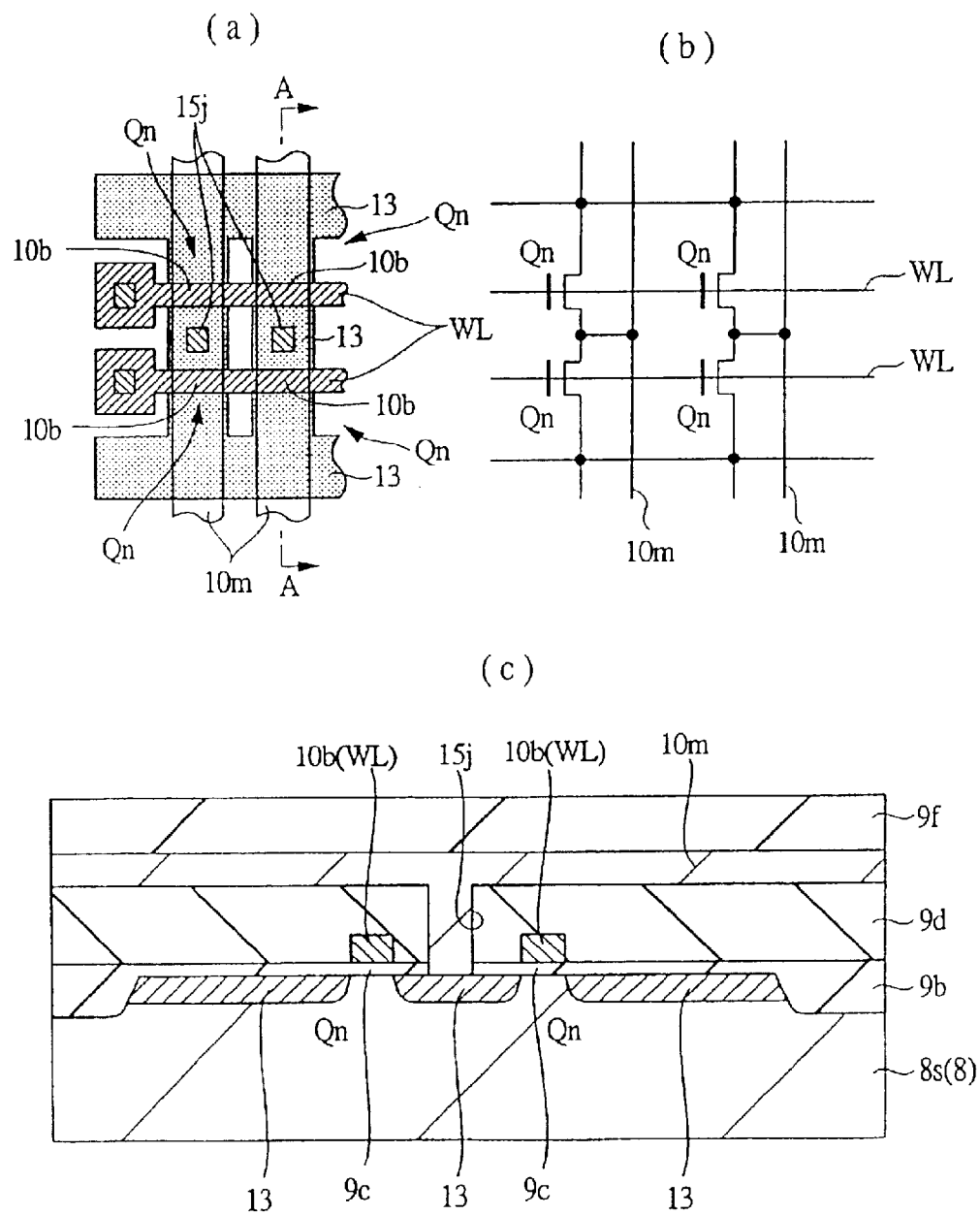
FIG. 57(a) is a diagrammatic plan view of a principal portion of a mask ROM.
FIG. 57(b) is an equivalent circuit diagram of FIG. 57(a)
FIG. 57(c) is a sectional view taken on line A—A in FIG. 57(a)

FIGS. 57(a) to 57(c) show base data of a mask ROM, in which FIG. 57(a) is a plan view showing a layout of a memory cell region, FIG. 57(b) is an equivalent circuit diagram thereof, and FIG. 57(c) is a sectional view taken on line A—A in FIG. 57(a). The illustrated mask ROM is an ion implantation program type mask ROM. Data lines 10m are electrically connected to semiconductor regions 13 through contact holes 15j. Gate electrodes 10b are formed of portions of word lines WL. One memory cell is formed of one nMOS Qn located near an intersecting point between a data line 10*m* and a word line WL. In this ion implantation program type ROM, a type with a high threshold voltage of nMIS Qn (high to the extent of not turning conductive even at a high level of word line WL) and a type with a low threshold voltage of nMIS Qn (turns conductive at a high level of word line WL) are fabricated selectively depending on whether an impurity is introduced or not into the channel region of the nMIS Qn which constitutes the memory cell, and they are made to correspond to values of "0" and "1" the of information. For the transfer of patterns of the base data, a mask having the foregoing light shielding patterns of metal was used. Of course, the data base patterns may be formed using light shielding patterns of a resist film.

Next, an example of an information rewriting method in a mask ROM will be described with reference to FIGS. 58(*a*) to 60(*c*). FIGS. 58(*a*) and 59(*a*) are plan views of a principal portion of a mask, FIG. 58(*b*) and 59(*b*) are plan views of the layout of a memory cell region in a mask ROM, showing patterns for writing memory information, and FIG. 58(*c*) and 59(*c*) are sectional views taken on line A—A in FIG. 57(*a*) in an information write step.

First, an opening pattern 28*a* shown in FIG. 58(*b*) is formed on a data base using a mask PM20 shown in FIG. 58(*a*), then as shown in FIG. 58(*c*), an impurity is ion-implanted into a semiconductor substrate 8*s*, which is exposed from the opening pattern 28*a*, so as to write memory information. A light shielding film 3*j* of the mask PM20 is formed of the same resist material as that of the light shielding patterns 3*a* used in the first embodiment. A part of the light shielding film 3*j* is removed so as to form a light transmitting pattern 16*k* having a square shape, as seen in plan view. The light transmitting pattern 18*k* is used for forming the opening pattern 28*a* in a resist film 11*b* on wafer 8. As the resist film 11*b*, a positive type resist film is used. The impurity introducing step for the writing of information is carried out before the formation of gate electrodes 10*b* (i.e., word lines WL). As the impurity, there may be used, for example, boron if it is desired to increase the threshold value of the nMIS Qn, or phosphorus or arsenic, if it is desired to decrease the threshold value of the nMIS Qn.

Figure 59:
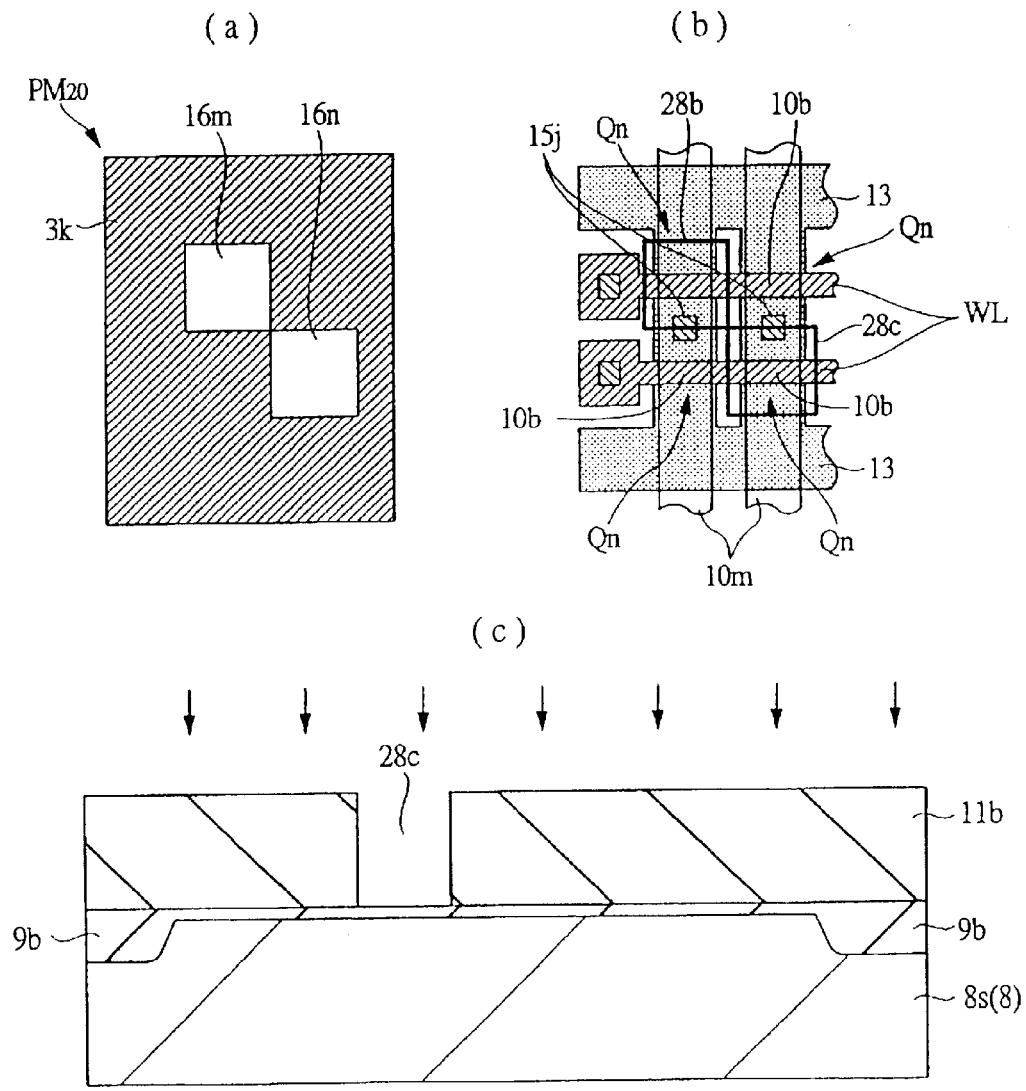
FIG. 59(a) is a diagrammatic plan view of a principal portion of a photomask according to a still further embodiment of the present Invention, which photomask is used at the time of transferring patterns onto a semiconductor wafer for the writing of data by ion implantation to the mask ROM of FIG. 57(a)
FIG. 59(b) is a plan view of a principal portion of the semiconductor wafer, showing positions of the patterns which are transferred using the photomask of FIG. 59(a)
FIG. 59(c) is a sectional view of the semiconductor wafer, showing in what state data are written in FIG. 59(a)

In FIG. 59(*b*), opening patterns 28*b* and 28*c* shown in FIG. 59(*b*) are formed on a data base using a mask PM20 shown in FIG. 59(*a*), then, as shown in FIG. 59(*c*), an impurity is ion-implanted into a semiconductor substrate 8*s*, which is exposed from the opening patterns 28*b* and 28*c*, to write memory information. A light shielding film 3*k* of the mask PM20 is formed using the same resist material as that of the light shielding patterns 3*a* described for the first embodiment The light shielding pattern 3*k* is partially removed to form two light transmitting patterns 18*m* and 16*n* having a square shape, as seen in plan view. The light transmitting patterns 16*m* and 16*n* are used for forming opening patterns 28*b* and 28*c* in a resist film 11*b* on wafer 8.

Next, an opening pattern 28*d* shown in FIG. 60(*b*) is formed on a data base using a mask PM20 shown in FIG. 60(*a*), then, as shown in FIG. 60(*c*), an impurity is ion-implanted into a semiconductor substrate 8*s*, which is exposed from the opening pattern 28*d*, to write memory information. A light shielding film 3*m* of the mask PM20 is formed using the same resist material as that of the light shielding patterns 3*a* described for the first embodiment. A part of the light shielding film 3*m* is removed to form a light transmitting pattern 16*p*. The light transmitting pattern 16*p* is used for forming the opening pattern 28*d* in a resist film 11*b* on wafer 8.

Using the masks PM20 shown in FIGS. 58(*a*) to 60(*a*), the change of pattern may be carried out in the same way as in the first embodiment, etc. For example, the pattern of mask PM20 in FIG. 58(*a*) can be changed into the patterns of mask PM20 in FIG. 59(*a*) by first removing the light shielding film 3*j* on the mask PM20 in FIG. 58(*a*), then newly applying the foregoing resist film for forming a light shielding film onto the mask substrate, and subsequently radiating an electron beam or ultraviolet ray to predetermined positions of the resist film to form the light shielding film 3*k* and light transmitting patterns 16*m*, 16*n* of the mask PM20 shown in FIG. 59(*a*). In this way various types of mask ROMs can be fabricated efficiently and can be greatly reduced in TAT. Moreover, since the material cost and process cost can be reduced, it is possible to greatly reduce the cost of a mask ROM even when produced in a small lot.

Thus, also in this twentieth embodiment, the same effects can be obtained as in the first embodiment, etc.

(Twenty-first Embodiment)

The twenty-first embodiment is a modification of the twentieth embodiment, and is directed to an information write method different from that using the mask ROM of the twentieth embodiment FIGS. 61(*a*) to 61(*c*) shows base data of a mask ROM according to this twenty-first embodiment, in which FIG. 61(*a*) is a plan view showing a layout of a memory cell region, FIG. 61(*b*) is an equivalent circuit diagram thereof, and FIG. 61(*c*) is a sectional view taken on line A—A in FIG. 61(*a*). The mask ROM of this embodiment is a contact hole program type ROM, in which programming is carried out by adjusting the layout of contact holes (indicated with broken lines in FIG. 61(*b*)) for connection between semiconductor region 13 and data lines 10*m*. The mask of this twenty-first embodiment also uses the foregoing light shielding patterns of metal for the transfer of base data patterns.

Figure 62:
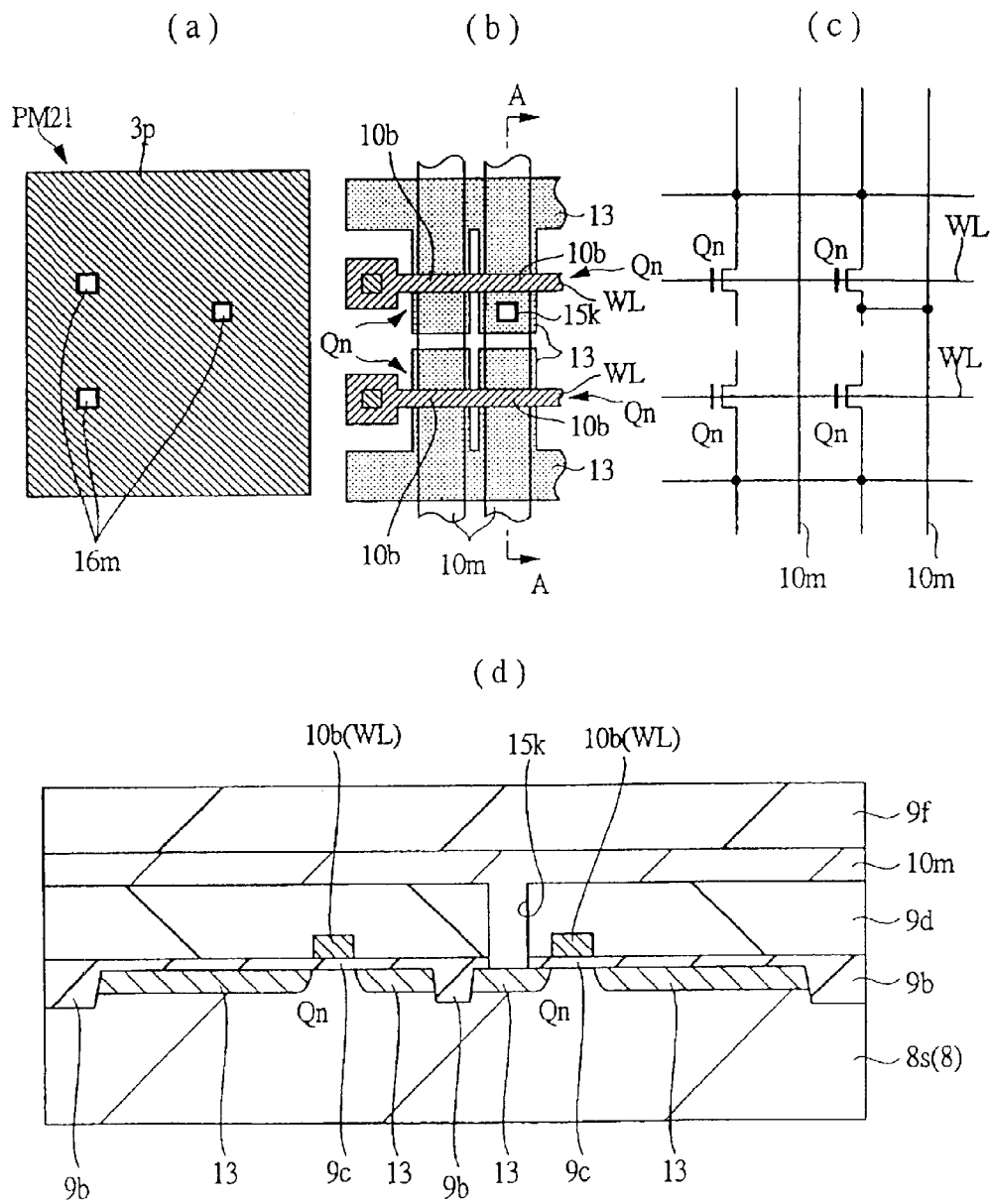
FIG. 62(a) is a diagrammatic plan view of a principal portion of a photomask according to a still further embodiment of the present invention, which photomask is used at the time of transferring contact hole patterns onto a semiconductor wafer for the writing of data to the mask ROM of FIG. 61.
FIG. 62(b) is a plan view of a principal portion of the semiconductor wafer, showing positions of the patterns which are transferred using the photo mask of FIG. 62(a)
FIG. 62(c) is an equivalent circuit diagram of FIG. 62(b)
FIG. 62(d) is a sectional view taken on line A—A in FIG. 62(b)

Next, an example of an information rewriting method using a mask ROM will be described with reference to FIGS. 62(*a*) to 65(*d*). FIGS. 62(*a*), 64(*a*), and 65(*a*) are plan views of a principal portion of a mask, FIGS. 62(*b*), 64(*b*) and 65(*b*) are plan views of layout of a memory call region in a mask ROM, showing patterns for the write of information into memory, FIGS. 62(*c*), 64(*c*) and 65(*c*) are circuit diagram thereof, and FIGS. 62(*d*), 64(*d*) and 65(*d*) are sectional views taken on line A—A in FIGS. 62(*b*), 64(*b*) and 65(*b*), respectively.

First, using the mask PM21 shown in FIG. 62(*a*), a contact hole 15*k* shown in FIG. 62(*b*) is formed on a data base, then, as shown in FIG. 62(*c*) and FIG. 62(*d*), semiconductor regions 13 in a predetermined nMIS Qn and data lines 10*m* are connected together to write memory information.

A light shielding film 3*p* of the mask PM21 is formed using the same resist material as that of the light shielding patterns 3*a* described for the first embodiment The light shielding film 3*p* is partially removed to form a light transmitting pattern 16*m* having a square shape, as seen in plan view. The light transmitting pattern 16*m* is used for forming an opening pattern for the formation of the contact hole 15*k* in a resist film on wafer 8. How to form the contact hole 15*k* is the same as in the first embodiment, etc. A brief description will now be given on this point. First, as shown in FIG. 63(*a*), a positive type resist film 11 is applied onto an insulating film 9*d*, followed by the transfer of a pattern onto the resist film 11*b*, using the mask PM21 of FIG. 62(*a*), and subsequent development, to form an opening pattern 28*e*. Then, using the resist film 11*b* as an etching mask, etching is performed to form a contact hole 15*k* in the insulating film 9 so as to expose a part of a semiconductor substrate 8s, as shown in FIG. 63(b).

Next, using the mask PM21 shown in FIG. 64(a), two contact holes 15m and 15n shown in FIG. (b) are formed on a data base, then, as shown in FIG. 64(c) and FIG. 64(d), semiconductor regions 12 and data lines 10m In a predetermined nMIS Qn are connected together to write memory information. A light shielding film 3q of the mask PM21 is formed using the same resist material as that of the light shielding patterns 3a described in the first embodiment. The light shielding film 3q is partially removed to form light transmitting openings 16q having a square shape, as seen in plan view. The light transmitting patterns 16q are used for forming opening patterns for the formation of contact holes 15m, 15n and word line contact holes in a resist film on wafer 8. How to form the contact holes 15m, 15n and word line contact holes is the same as that described in connection with FIGS. 63(a) and 63(b), so explanations thereof will here be omitted.

Next, using the mask PM21 shown in FIG. 65(a), three contact holes 15k, 15m, and 15n shown in FIG. 65(b) are formed on a data base, then as shown in FIGS. (c) and 65(d), semiconductor regions 13 and data lines 10m In a predetermined nMIS Qn are connected together to write memory information. A light shielding film 3r of the mask PM21 is formed using the same resist material as that of the light shielding patterns 3a described for the first embodiment. The light shielding film 3r is partially removed to form light transmitting patterns 16r having a square shape, as seen in plan view. The light transmitting patterns 16r are used to form opening patterns for the formation of contact holes 15k, 15m, 15n and word contact holes in a resist film on wafer 8. How to form the contact holes 15k, 15m, 15n and word contact holes is the same as that described in connection with FIGS. 63(a) and 63(b), so an explanation thereof will here be omitted.

In the masks PM21 of FIGS. 62(a), 64(a), and 65(a), a change of pattern may be carried out in the same way as in the first embodiment, etc. For example, for changing the patterns of the mask PM21 shown in FIG. 62(a) into the patterns of the mask PM21 shown in FIG. 64(a), first the light shielding film 3 on the mask PM2 of FIG. 62(a) is removed, then the foregoing resist firm for the formation of a light shielding film is newly applied onto the mask substrate, and an electron beam or ultraviolet ray is radiated to predetermined positions of the resist film to form the light shielding film 3q and light transmitting patterns 16q of the mask PM21 shown in FIG. 64(a). In this way various types of mask ROMs can be fabricated efficiently, as in the twentieth embodiment. Besides, various types of mask ROMs can be greatly reduced in TAT. Further, since the material cost and the process cost can be reduced, it becomes possible to greatly reduce the cost of a mask ROM even when it is produced in a small lot Thus, also in this twenty-first embodiment, the same effects can be obtained as in the first embodiment, etc.

(Twenty-second Embodiment)

This twenty-second embodiment is a modification of the previous twentieth embodiment, and it is directed a mask ROM having a different structure from the twentieth embodiment.

FIGS. 66(a) to 66(c) illustrate a part of a NAND type mask ROM of this twenty-second embodiment Plural nMISQn which constitute memory cells are connected in parallel through semiconductor regions 13. As a program method an ion implantation method is used. That is, the nMIS Qn (memory cell) of an ion-implanted portion becomes a depletion type, while the nMIS Qn (memory cell) of a portion not ion-implanted becomes an enhancement type, corresponding respectively to values of "0" and "1" of the information.

In FIGS. 66(a) to 66(c) there is Illustrated an example in which an impurity is introduced into a channel region of a nMIS Qnd to provide a depletion type. An opening pattern 28f indicative of a memory information write pattern represents an opening pattern of an ion-implantation mask used at the time of carrying out a program (ion-implantation of impurity) for the nMIS Qnd. A semiconductor region 13VSS also possesses a function as a low voltage (for example, 0V=GND) power line.

In this twenty-second embodiment, how to change patterns on the mask and how to introduce an impurity selectively into a wafer for a program are the same as in the twentieth embodiment, so explanations thereof will be omitted.

Also, in this twenty-second embodiment it is possible to obtain the same effects as in the twenty-first embodiment (Twenty-third Embodiment)

In this embodiment a description will be given of a case where a characteristic of a semiconductor integrated circuit is adjusted using a mask which has the foregoing light shielding patterns of resist film.

FIGS. 67 and 68 illustrate circuits, each implemented within a semiconductor integrated circuit device formed on a wafer and used for adjusting a characteristic of the Integrated circuit device.

FIG. 67 is a circuit diagram of a circuit used for characteristic adjustment, using plural resistors R1 to Rn connected in series. In this circuit, the state of connection between a terminal Ta connected to a circuit (e.g., CPU in a semiconductor integrated circuit) and terminals Tb1 to Tbn connected to resistors R1 to Rn is changed by a connector J1, to thereby change the resistance value of the entire circuit.

FIG. 68 is a circuit diagram of another circuit used for characteristic adjustment, using plural capacitors C1 to Cn connected in series. Here also the state of connection between a terminal Ta connected to a circuit and terminals Tb1 to Tbn connected to the capacitors C1 to Cn is changed by a connector J1, to thereby change the capacitance value of the entire circuit.

For example, in a development phase of a semiconductor integrated circuit there sometimes is a case where a characteristic adjustment for the semiconductor integrated circuit, such as adjustment of a signal timing, is made by changing the value of a resistance or capacitance variously as described above. If an ordinary mask is used in such a pattern transfer, if is necessary that the mask be refabricated at every adjustment even though the portion to be changed (connector J1) may be small, as is seen also from the circuit diagrams of FIGS. 67 and 68. Consequently, so much more time is required for the fabrication of the mask that the period for development of the semiconductor integrated circuit device becomes longer. Moreover, such a method is wasteful and causes an increase of both material cost and process cost, with a consequent increase in the cost of the semiconductor integrated circuit device.

In the mask of this embodiment, therefore, the portions for transfer of the connector j1 are formed of light shielding patterns of resist film. FIG. 69(a) is a schematic plan view of the terminals Ta and Tb1 to Tbn formed on a wafer, the terminal Ta being connected to none of the terminals Tb1 to Tbn. FIG. 69(b) shows light shielding patterns 2g on a mask PM23, which are used for transfer of the terminals Ta and Tb to Tbn shown in FIG. 69(a). The light shielding patterns 2g are formed of metal like the light shielding patterns 2a described for the first embodiment and which are used as base data. For example, if the terminals Ta and Tb1 are to be connected together, as in FIG. 70(a), this requirement can be met by forming a light shielding pattern 3s of resist film at a position corresponding to a connector J1 for both terminals Ta and Tb1 on a main surface (the surface on which the light shielding patterns 2g of metal are formed) of a mask substrate 1 of the mask PM23. The resist material of the light shielding pattern 3s, as well as how to form and change the same pattern, are the same as in the first embodiment Therefore, the change of connection betweens the terminal Ta and the terminals Tb1 to Tbn can be done easily in a short time and at low cost. Consequently, the time required for development of the semiconductor integrated circuit device can be shortened to a great extent, and it becomes possible to reduce the cost of the semiconductor integrated circuit device.

Also, in this twenty-third embodiment, the same effects can be obtained as in the first embodiment, etc.

(Twenty-fourth Embodiment)

In connection with this embodiment, a description will be given below about a technique for making a logic circuit of a semiconductor integrated circuit device redundant with use of a mask having the foregoing light shielding patterns of resist film.

FIG. 71 illustrates a redundant circuit formed on a wafer. Redundancy is effected by changing the manner of connection of a connector J2 to thereby change the state of connection among terminals Tc1 to Tc3. INV stands for an inverter circuit.

Even in such a redundant circuit configuration, if an ordinary mask is used for the transfer of a pattern, the mask must be re-fabricated for redundancy even when the portion to be changed (connector J2) itself is small. Consequently, it takes times for fabrication of the mask, and, hence, the period for the development and manufacture of the semiconductor integrated circuit device becomes longer. Besides, such a circuit configuration is wasteful and increases both the material cost and process cost, so that the cost of the semiconductor integrated circuit device increases.

In the mask of this embodiment therefore; the portion for transfer of the connector J2 is formed of a light shielding pattern of resist film. FIG. 72(a) is a schematic plan view of the portions of the terminals Tc1 to Tc3 formed on the wafer. In the same figure, the terminal Tc2 is connected to neither the terminal Tc1 nor the terminal Tc3. FIG. 72(b) shows light shielding patterns 2g of metal formed on a mask PM24 for transfer of the terminals Tc1 to Tc3 and, they are used as base data. For example, as shown in FIG. 73(a), if the terminals Tc1 and Tc2 are to be connected with each other, this connection can be effected by forming a light shielding pattern 3s of resist film at the position corresponding to the connector J2 between the terminals Tc1 and Tc2 on a main surface (the surface where the light shielding patterns 2g of metal are formed) of a mask substrate 1 of the mask PM24. The resist material of the light shielding pattern 3s, as well as how to form and change the same pattern, are the same as in the first embodiment Consequently, it becomes possible to change the connection of terminals Tc1 to Tc3 easily in a short time and at low cost Accordingly, the time required for the development and manufacture of the semiconductor integrated circuit can be greatly shortened, and it becomes possible to reduce the cost of the semiconductor integrated circuit.

Also, in this twenty-fourth embodiment, it becomes possible to obtain the same effects as in the first embodiment (Twenty-fifth Embodiment)

In connection with this embodiment, a description will be given of an example of a series of steps in a fabrication process for a mask as described above and in a manufacturing process for a semiconductor integrated circuit device using the mask.

An ordinary mask fabrication process is divided into a fabrication process for a substrate (mask blank) with a light shielding film of chromium, for example, and the foregoing translucent film (halftone film) formed on the whole of a main surface thereof and a mask fabrication process for forming semiconductor integrated circuit-forming patterns on the mask blank. There sometimes is a case where both are carried out at different departments.

A mask fabrication process according to this embodiment is divided into a mask blank fabrication process, a process for forming common light shielding patterns to be used in common in various projection exposure systems along an outer periphery of a mask substrate and for forming common device patterns to form integrated circuit patterns, and a resist pattern forming process. There sometimes is a case where these processes are carried out at different departments or different companies.

For example, FIG. 74(a) shows a process for forming common light shielding patterns and common device patterns. Common patterns can be provided for each semiconductor integrated circuit device or in accordance with a projection exposure system used in exposure. First, common light shielding patterns (corresponding to the light shielding patterns 2a and 2b in the, mask PM1 of FIG. 1) (step 100). Subsequently, a check is made to see if there is any defect (step 101). If there is no defect, the mask concerned is stocked as a common mask completed at the stage of forming common light shielding patterns and common device patterns (step 102). On the other hand, if there is any, defect, correction or the like is made (step 103) and thereafter the mask is stocked (step 102).

Thus, In the mask fabrication process of this embodiment, the mask substrate can be stocked during fabrication of the mask, and, therefore, the time required for fabrication and development of a semiconductor integrated circuit device can be greatly shortened. In the case of an ordinary mask, the substrate cannot be stocked in an intermediate step, so the operations from the deposition of a light shielding film (the mask blank manufacturing process) up to patterning of predetermined patterns must be carried out as a through process. On the other hand, in this embodiment the mask which has undergone steps up to the common light shielding patterns and common device pattern fabricating process can be stocked, so for forming concrete integrated circuit patterns (device patterns) in the development and manufacture of a semiconductor integrated circuit device, the fabrication of the mask concerned can be started from the mask stocked stage, thus permitting the mask fabrication time to be shortened. Accordingly, the process of forming integrated circuit patterns can be terminated in a short time. Thus, as noted previously, the technical idea of the present invention is suitable particularly to the fabrication of a mask for a logic device which is high in grade development frequency. In the case of the mask lying in the stage of FIG. 74(a), even if a defect, such as a pin-hole, is found in the region RE, no problem arises because the metal film in the region RE is removed. Consequently, it is possible to moderate the quality control of the mask blank, and, hence, it is possible to greatly improve the yield of the mask blank.

FIG. 74(b) shows a process for forming light shielding patterns by resist film on the common mask. First, light shielding patterns of resist film for device manufacture (corresponding to the light shielding patterns 3a in the mask PM1 of FIG. 1) are formed in the integrated circuit pattern region of the common mask in the manner described above (steps 104 and 105). Subsequently, the mask substrate is checked for defect and dimension (step 106). If the mask passes this inspection, it is completed (step 107). On the other hand, if the photomask is rejected in the inspection, the light shielding patterns of resist film are removed and the mask is re utilized (step 108). Thus, in this embodiment the common mask can be re-utilized. In the case where the light shielding patterns for device manufacture are formed of a metallic film, it is difficult to remove the film and reutilize the mask, from the standpoint of ensuring the quality of the mask. On the other hand, removing the resist film and re utilizing the mask, as in this embodiment, does not take time and can be done easily without deterioration of the mask quality. Consequently, it becomes possible to attain an effective utilization of resources.

FIG. 74(c) shows a process wherein the mask thus completed is used in fabricating a semiconductor integrated circuit device and patterns are transferred onto a wafer. In this process, using the completed mask, integrated circuit patterns are transferred onto a wafer (step 109). If the mask is degraded to an unemployable extent, or if a change in part of the semiconductor integrated circuit device occurs, the mask is again fed to the resist removing/regenerating step (step 108) so as to be re-utilized as a common mask.

Thus, according to this embodiment, the mask can be re-utilized from the manufacture of the mask until-the manufacture of the semiconductor integrated circuit device. Consequently, it becomes possible to shorten the period for the development and manufacture of the semiconductor integrated circuit device. Besides, since it is possible to diminish wasteful materials and steps, it becomes possible to greatly reduce the cost of the semiconductor integrated circuit device.

(Twenty-sixth Embodiment)

In this embodiment, reference will be made to an example of the above semiconductor integrated circuit device manufacturing process using a mask.

A description will now be given of the case where trimming is performed lot by lot More specifically, an average characteristic information of a multitude lot of semiconductor integrated circuit devices in mass production is fed back to a wiring layer forming step for semiconductor integrated circuit devices of a flow which follows, to correct wiring, thereby adjusting a characteristic of the semiconductor integrated circuit devices. This wiring correction is made with use of a mask having light shielding patterns of resist film.

FIG. 75 illustrates a related flow. In an element forming step 301, predetermined integrated circuit elements are formed on a wafer. In a wiring layer forming step (step 302) which follows, wiring lines are formed on the wafer to form an integrated circuit. All wiring layers for a semiconductor integrated circuit device are formed, and after the completion of manufacture of the semiconductor integrated circuit device, each semiconductor integrated circuit device on the wafer is tested for an electrical characteristic (step 303). Then, average characteristic variation information of the semiconductor integrated circuit devices thus fabricated is fed back to the wiring layer forming step for semiconductor integrated circuit devices of the lot which follows the tested lot. On the basis of the information thus fed back, the size and shape of patterns for forming wiring lines on a mask are changed (step 304). As the mask, a mask having light shielding patterns of resist film, such as described in the previous embodiment, is used. Using this mask, wiring layers of semiconductor integrated circuit devices of the flow which follows are formed. In this way, trimming of semiconductor integrated circuit devices is performed lot by lot Thus, semiconductor integrated circuit devices having uniform electrical characteristics and which are high in reliability can be provided in a short period. Besides, in changing patterns of the mask for trimming, it is possible to omit wasteful material and steps, and, hence, it is possible to provide a highly reliable semiconductor integrated circuit device at low cost (Twenty-seventh Embodiment)

This embodiment is directed to a modification of the twenty-sixth embodiment. According to this embodiment, each semiconductor integrated circuit device is tested for a characteristic halfway in the wiring layer forming step and the information obtained is fed forward to the subsequent wiring forming step to adjust the characteristic of the semiconductor integrated circuit device.

FIG. 76 shows a related flow. First, after the element forming step (step 301), the flow goes through a wiring layer forming step (step 302a), in which each semiconductor integrated circuit device on the wafer is subjected to an electric characteristic test (step 303). Then, on the basis of the obtained characteristic information on the semiconductor integrated circuit device, the size and shape of patterns for wiring formation on the mask, which patterns are to be, used in a subsequent final wiring layer forming step (step 302b), are changed (step 304). The final wiring layer is a layer for forming bonding pads which function as external terminals of a semiconductor chip, for example, or a wiring layer which precedes this by one. As the mask, a mask having light shielding patterns of resist film such as described in the previous embodiment is used. Using the mask, patterns of the final wiring layer are formed on the wafer. By thus trimming the semiconductor integrated circuit device, it becomes possible to obtain the same effect those obtained as in the twenty-sixth embodiment.

The technical idea of this embodiment according to the present invention is that, in the wiring layer forming step, a characteristic of the semiconductor integrated circuit device concerned is tested, then the characteristic information is sent to the wiring layer forming stop which follows, and trimming is performed on the basis of the characteristic information and using the mask. The technical idea In question is not limited to the transmission of the information to the final wiring layer forming step. For example, the characteristic information may be sent to any other wiring layer forming step than the final wiring layer forming step, or it may be sent to plural wiring layer forming steps. As a so-called wafer package technique wherein a sealing step is carried out, for example, at the wafer stage, there is a technique having a structure wherein wiring is conducted again after the formation of bonding pads. In this re-wiring layer forming step the characteristic information may be transmitted, and trimming may be conducted on the basis of the characteristic information and with use of the mask (Twenty-eighth Embodiment)

In connection with this twenty-eighth embodiment, reference will be made to a case where customer's information is written on a wafer with use of light shielding patterns of resist film formed on a mask.

In the semiconductor integrated circuit device manufacturing process, it is preferable that information pieces, such as, for example, a customer's name, number, lot number, manufacturing year, month and date, type, grade, and version be written in part of a wafer or a semiconductor chip insofar as possible. This is because, by so doing, an electrical characteristic of the resulting product and the state of pattern change can be seen, and it becomes easier to conduct a characteristic test and sorting of semiconductor integrated circuits. With an ordinary mask, however, the writing of very detailed information is not feasible because it takes time and Increased cost for the fabrication of mask. In this embodiment, therefore, customer's information is transferred with a mask using the foregoing light shielding patterns of resist film, whereby it becomes possible to transfer detailed customer's information on a wafer in a short time at low cost FIG. 77 shows a manufacturing process flow for a semiconductor integrated circuit device. In a wiring forming step 302, customer's information is transferred through a mask using light shielding patterns of resist film. At the completion of the wafer (step 303), customer's information is read optically and is managed, followed by an assembling step 304 and subsequent final test (step 305). In this case, by making reference to the customer's information automatically, a test program matching the semiconductor Integrated circuit device is recognized automatically and a circuit operation test is conducted. Thus, it becomes possible to perform a more accurate test.

FIG. 78(a) is a plan view of a principal portion of a wafer 8. Customer's information is formed within a semiconductor chip 8c (region 30a) or in a cut region (region 30b) located between adjacent semiconductor chips 8c. FIGS. 78(b) and 78(c) illustrate customer's information patterns formed in the region 30a or 30b. FIG. 78(d) is a sectional view taken on line A—A in FIG. 78(b). In FIG. 78(b), plural conductor film patterns 10n are arranged in parallel to form a bar code. In FIG. 78(c), characters and numerals are formed of conductor film patterns 10p. The conductor film patterns 10n and 10p are formed simultaneously with the formation of wiring line patterns.

FIGS. 79(a) and 79(b) shows examples of masks used for forming the conductor film patterns ion shown in FIG. 78(b). FIG. 79(a) illustrates a case where light shielding patterns 3t for the formation of customer's information are formed of resist film in part of the mask PM2 of the second embodiment, the light shielding patterns 3t being formed in the same step as the step of forming the light shielding patterns 3a and using the same material as that of the patterns 3a. FIG. 79(b) illustrates a case where light transmitting patterns 16s for the formation of customer's information are formed in part of the mask PM3 of the third embodiment, the light transmitting patterns 16s being by removing a part of a light shielding film 3u. The light shielding film 3u is formed in the same step as the step of forming the light shielding film 3b and uses the same material as that of the film 3b. The light shielding patterns 16s in the light shielding film 3u are formed simultaneously with the forming of the light transmitting patterns 16b in the light shielding film 3b.

A configuration may be adopted wherein simple circuit patterns are formed of light shielding patterns of resist, so that binary signals having values of "0" and "1" can be read from predetermined bonding pads (or lead pins after packaging) formed on a semiconductor chip. With this configuration, in the step of testing a semiconductor integrated circuit device after the assembling step, the foregoing customer's information can be read electrically from the semiconductor integrated circuit device, so that it becomes possible to automatically recognize a test program matching the semiconductor integrated circuit device and conduct a circuit operation test In such a circuit configuration, "1" or "0" is allocated to a bonding pad (or lead) depending on whether there is a connection of the pad with a power terminal (high potential or low potential (0V)) formed within a semiconductor chip or whether it is the high or the low power terminal that is connected with the pad. The connecting pattern portions are formed of light shielding patterns of resist film, as described for the twenty-third and twenty-fourth embodiments. In this way, it is possible to easily write or rewrite information on the mask. Of course, a simple circuit may be implemented in a semiconductor chip with use of light shielding patterns of resist film, so that binary signals for the customer's information are outputted to the leads.

Although the present invention has been described above concretely on the basis of embodiments thereof, it goes without saying that the invention is not limited to those embodiments, but that various changes may be made within a scope not departing from the gist thereof.

For example, the wiring lines used in the above embodiments are of an ordinary wiring structure, but this constitutes no limitation. For example, one may adopt what is called a damascene method or dual damascene method wherein a wiring line is formed by embedding a conductor film into a trench for wiring or for a hole, which trench is formed in an insulating film, for example.

Although in the above embodiments a semiconductor substrate constituted by a semiconductor alone is used as a semiconductor integrated circuit substrate, no limitation is placed thereon, one may use, for example, an SOI (Silicon On Insulator) substrate with a thin semiconductor layer formed on an insulating layer or an epitaxial substrate with an epitaxial layer formed on a semiconductor substrate.

In the case where the mark patterns are formed of a resist film in the above embodiments, a material which absorbs mark detection light (e.g., probe light in a defect inspecting apparatus (light having a longer wavelength than the wavelength of exposure light, for example, 500 nm in wavelength: information detection light)) may be incorporated in the resist film.

Although the present invention has been described above mainly with reference to case where it is applied to the fabrication of a semiconductor integrated circuit device, which is an application field serving as a background of the invention, no limitation is made thereto, but the invention is also applicable to the manufacture of other electronic devices (electronic circuit devices), such as a liquid crystal substrate and a magnetic head.

The following is a brief description of effects obtained by typical aspects of the invention disclosed herein.

(1) According to one aspect of the present invention, predetermined patterns are transferred onto a resist film formed on a main surface of a semiconductor wafer by an exposure process using a mask, the mask having on a main surface of a mask substrate a light shielding portion formed of resist film and a light shielding portion formed of metal, whereby it becomes possible to shorten the time required for changing or correcting the mask patterns. Consequently, with use of the mask, it becomes possible to greatly shorten the period for the development or manufacture of a semiconductor integrated circuit device.

(2) According to another aspect of the present invention, a light shielding portion using metal in a peripheral portion of a main surface of a mask substrate and an opening is formed in the light shielding portion to form an information detecting pattern, whereby the information detecting ability can be improved in a mask wherein the resist film is allowed to function as a light shielding portion. Therefore, by using this mask in a manufacturing process for a semiconductor integrated circuit device, it becomes possible to improve the reliability of the semiconductor integrated circuit device.

(3) According to a further aspect of the present invention, a light shielding portion is formed using metal in a peripheral portion of a main surface of a mask substrate, wherein it becomes possible to suppress or prevent the generation of dust particles in a mask wherein resist film is allowed to function as a light shielding film. Thus, by using this mask in a manufacturing process for a semiconductor integrated circuit device, it becomes possible to improve the yield of the semiconductor integrated circuit device.

The present Invention is applicable to a semiconductor integrated circuit device manufacturing technique, especially a lithography technique, in a manufacturing process for a semiconductor integrated circuit device.

What is claimed is:

1. A method of manufacturing a semiconductor integrated circuit device, comprising a step of transferring patterns onto a resist film formed on a main surface of a semiconductor wafer by an exposure process using a photomask, the photomask having on a main surface of a mask substrate a halftone pattern formed of a resist film and a light shielding portion formed of a metal, wherein in the photomask, the halftone pattern is formed flush with the light shielding portion.

2. A method of manufacturing a semiconductor integrated circuit device, comprising a step of transferring patterns onto a resist film formed on a main surface of a semiconductor wafer by an exposure process using a photomask, the photomask having on a main surface of a mask substrate a halftone pattern formed of a resist film and a light shielding portion formed of a metal, wherein transmittance of light through said halftone pattern of said photomask is 1%–40% in terms of light intensity of the exposure light irradiated thereon, the halftone pattern inverting phase of light passing therethrough as compared with a phase of light passing through a halftone film-free portion of the photomask.

3. The method of manufacturing a semiconductor integrated circuit device according to claim 2, wherein transmittance of light through said halftone pattern is about 2%–10% in terms of light Intensity of the exposure light irradiated thereon.

4. The method of manufacturing a semiconductor integrated circuit device according to claim 2, wherein portions of the mask substrate exposed to the exposure light have trench regions therein, with phase inversion of transmitted light being achieved between light transmitted through the trench regions and light transmitted through the halftone pattern.

5. The method of manufacturing a semiconductor integrated circuit device according to claim 4, wherein transmittance of light through said halftone pattern is 2%–20% in terms of light intensity of the exposure light irradiated thereon.

6. A method of manufacturing a semiconductor integrated circuit device, comprising a step of transferring patterns onto a resist film formed on a main surface of a semiconductor wafer by an exposure process using a photomask, the photomask having on a main surface of a mask substrate a halftone pattern formed of a resist film and a light shielding portion formed of a metal, wherein the photomask further includes a phase adjusting film between the halftone pattern and the mask substrate, said phase adjusting film not being exposed directly to the exposure light.

7. The method of manufacturing a semiconductor integrated circuit device according to claim 6, wherein said phase adjusting film is provided only between said halftone pattern and said mask substrate.

8. A method of manufacturing a semiconductor integrated circuit device, comprising a step of transferring patterns onto a resist film formed on a main surface of a semiconductor wafer by an exposure process using a photomask, the photomask having on a main surface of a mask substrate a halftone pattern formed of a resist film and a light shielding portion formed of a metal, wherein said resist film, of which the halftone pattern of the photomask is formed, is made of an organic resist material.

* * * * *